(12) United States Patent
Milot

(10) Patent No.: US 11,277,147 B2
(45) Date of Patent: Mar. 15, 2022

(54) APPROXIMATION OF SAMPLES OF A DIGITAL SIGNAL REDUCING A NUMBER OF SIGNIFICANT BITS ACCORDING TO VALUES OF THE SAMPLES

(71) Applicant: ACOUSTICAL BEAUTY, Vaas (FR)

(72) Inventor: Gilles Milot, Paris (FR)

(73) Assignee: ACOUSTICAL BEAUTY, Vaas (FR)

( * ) Notice: Subject to any disclaimer, the term of this patent is extended or adjusted under 35 U.S.C. 154(b) by 36 days.

(21) Appl. No.: 16/756,295

(22) PCT Filed: Oct. 15, 2018

(86) PCT No.: PCT/EP2018/077992
§ 371 (c)(1),
(2) Date: Apr. 15, 2020

(87) PCT Pub. No.: WO2019/076783
PCT Pub. Date: Apr. 25, 2019

(65) Prior Publication Data
US 2020/0304144 A1    Sep. 24, 2020

(30) Foreign Application Priority Data

Oct. 16, 2017 (EP) .................................... 17306401
Jan. 8, 2018 (EP) .................................... 18305011
May 2, 2018 (EP) .................................... 18305545

(51) Int. Cl.
*H03M 7/30* (2006.01)
*G06F 17/15* (2006.01)
(Continued)

(52) U.S. Cl.
CPC ...... *H03M 7/3073* (2013.01); *G06F 7/49942* (2013.01); *G06F 17/15* (2013.01);
(Continued)

(58) Field of Classification Search
CPC ............. H03M 7/3073; H03M 7/6047; H03M 7/3059; H03M 1/70
See application file for complete search history.

(56) References Cited

U.S. PATENT DOCUMENTS 3,993,993 A * 11/1976 Griffin .................. H03M 1/665
341/117
4,412,208 A * 10/1983 Akazawa ................ H03M 1/68
341/118
(Continued)

FOREIGN PATENT DOCUMENTS

WO      200158022 A1    8/2001

OTHER PUBLICATIONS

International Search Report and Written Opinion for PCT/EP2018/077992, dated Jan. 15, 2019.

*Primary Examiner* — Lam T Mai
(74) *Attorney, Agent, or Firm* — Meagher Emanuel Laks Goldberg & Liao, LLP

(57) ABSTRACT

The invention relates to the representation of digital signals. In order to improve the perception by a user of the quality of a digital signal, a first sample of first digital signal is approximated to a second sample of a second digital signal having a second number of significant bits lower than the first number of significant bits of the first sample. The second number of significant bits also depends upon the value of the first sample.

20 Claims, 18 Drawing Sheets

(51) Int. Cl.
*H03M 1/70* (2006.01)
*G06F 7/499* (2006.01)
*G10L 19/24* (2013.01)

(52) U.S. Cl.
CPC ........... *H03M 1/70* (2013.01); *H03M 7/3059* (2013.01); *H03M 7/6047* (2013.01); *G10L 19/24* (2013.01)

(56) References Cited

U.S. PATENT DOCUMENTS

| | | | | |
|---|---|---|---|---|
| 4,963,870 A | * | 10/1990 | Obinata | H03M 1/1042 341/118 |
| 5,243,348 A | * | 9/1993 | Jackson | H03M 7/165 341/160 |
| 5,463,473 A | * | 10/1995 | Yamada | H04N 1/4056 347/132 |
| 5,528,240 A | * | 6/1996 | Wilson | H03H 17/0614 341/143 |
| 5,574,454 A | * | 11/1996 | Wilson | H03H 17/0614 341/143 |
| 5,587,710 A | * | 12/1996 | Choo | H03M 7/4006 341/107 |
| 5,969,656 A | * | 10/1999 | Itoku | H03M 1/68 341/144 |
| 5,977,896 A | | 11/1999 | Kohdaka et al. | |
| 6,445,323 B1 | * | 9/2002 | Cairns | G09G 3/3688 341/144 |
| RE38,236 E | * | 8/2003 | Kubota | H04H 60/23 380/45 |
| 6,646,581 B1 | * | 11/2003 | Huang | H03M 7/3011 341/143 |
| 6,825,785 B1 | * | 11/2004 | Huang | H03L 7/093 341/141 |
| 7,102,557 B1 | * | 9/2006 | Frith | H03M 1/804 327/337 |
| 2003/0030578 A1 | * | 2/2003 | Schwartz | H04N 5/37455 341/155 |
| 2008/0030577 A1 | | 2/2008 | Cleary | |
| 2010/0100210 A1 | * | 4/2010 | Mecchia | G06F 7/49942 700/94 |
| 2016/0204790 A1 | * | 7/2016 | Kang | H02P 23/0077 318/490 |
| 2017/0103691 A1 | * | 4/2017 | Hoffman | G09G 3/2003 |
| 2017/0142427 A1 | * | 5/2017 | Graziosi | G06T 9/20 |

\* cited by examiner

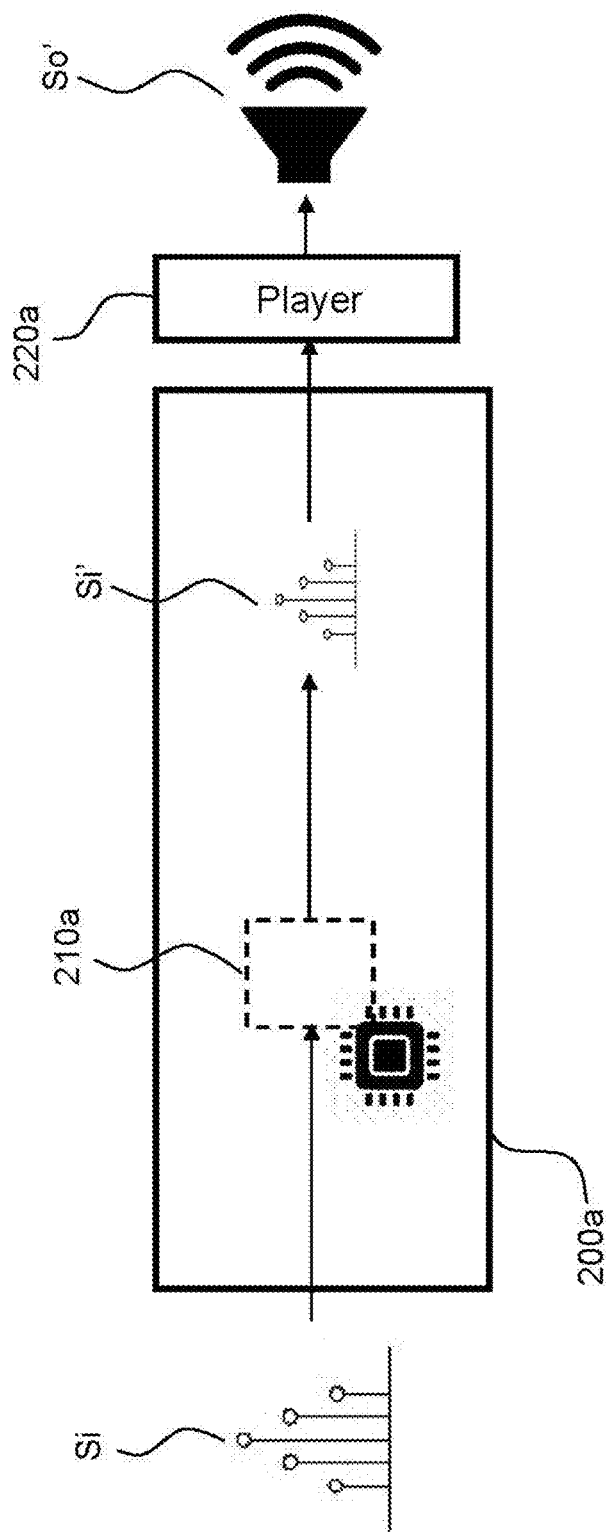

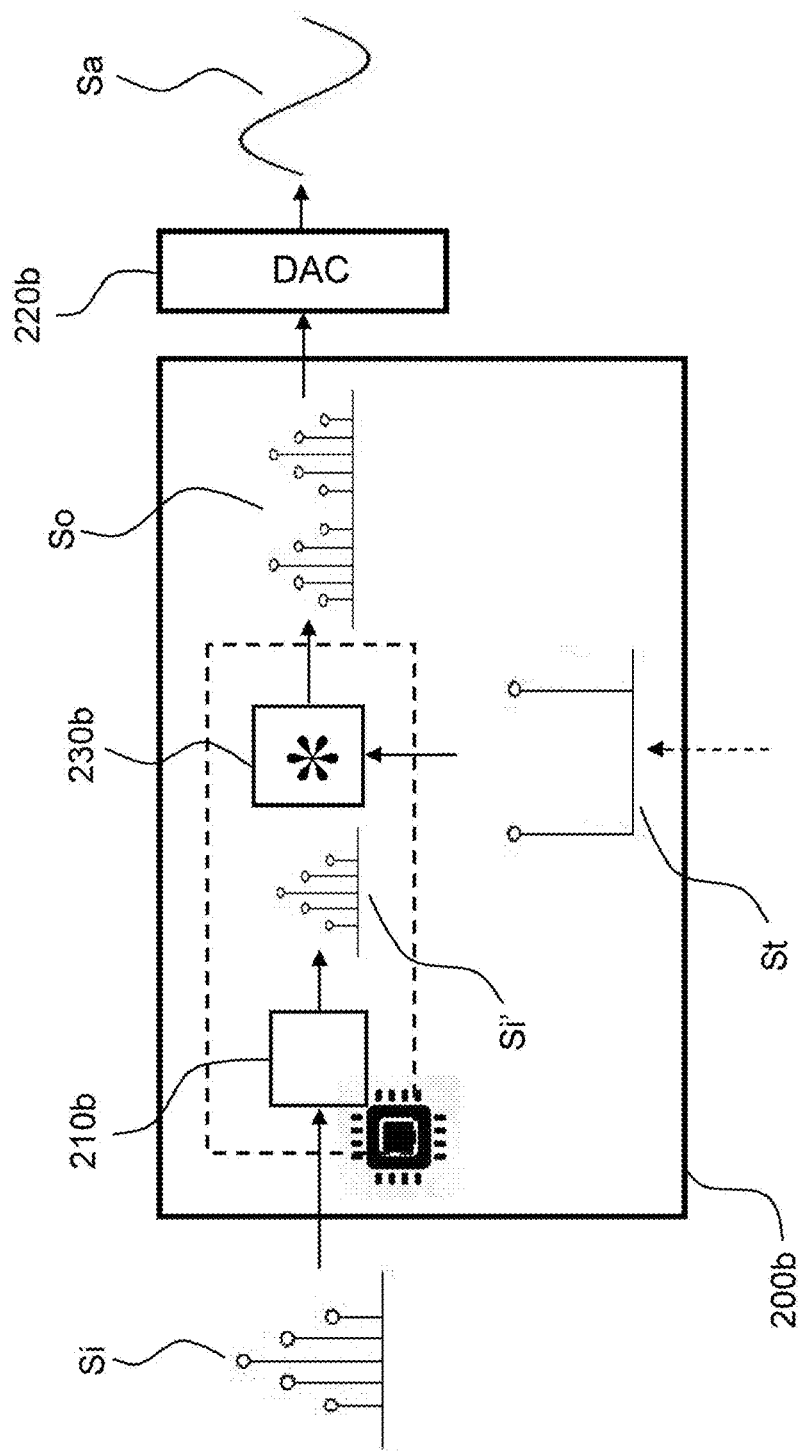

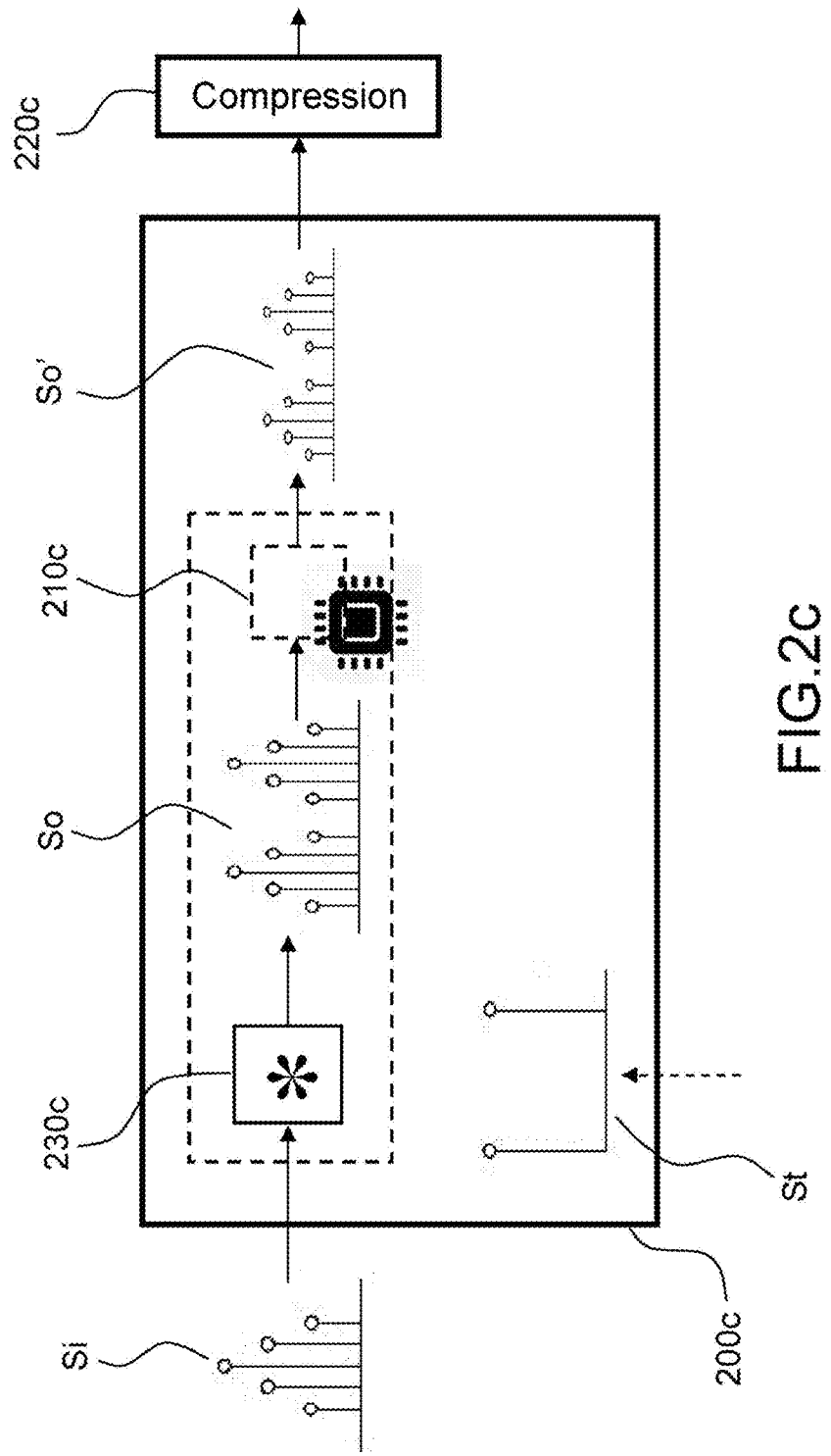

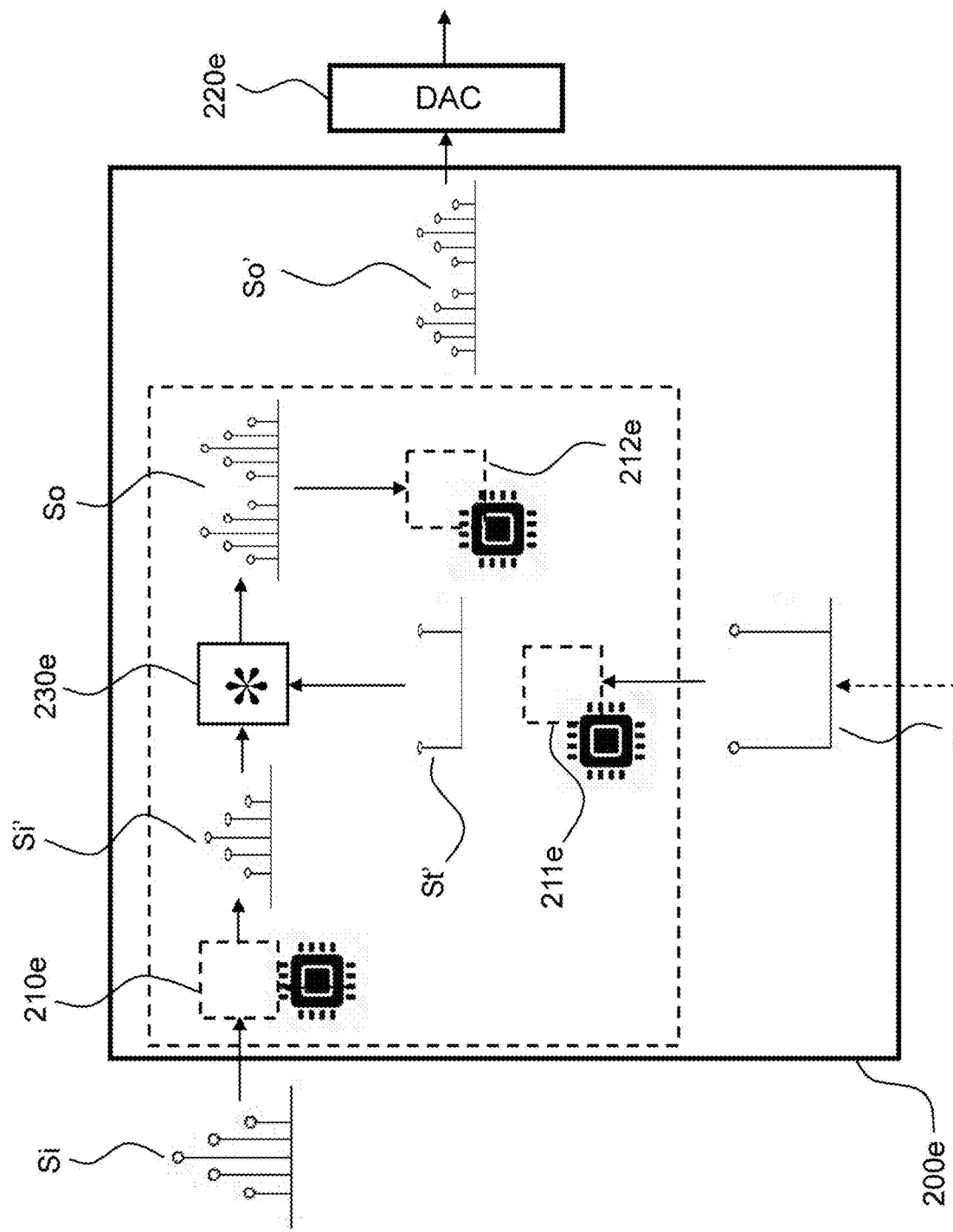

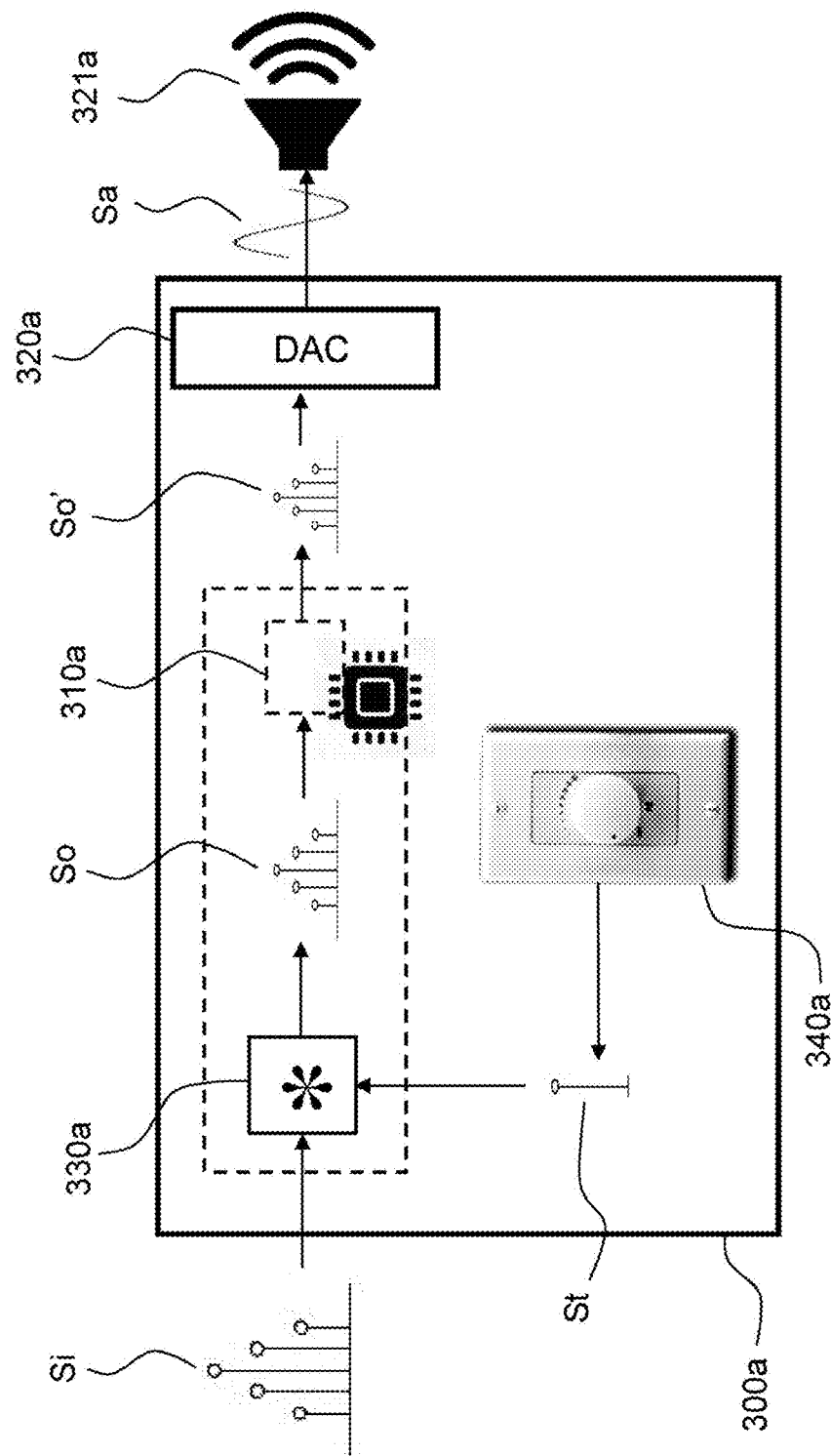

APPROXIMATION OF SAMPLES OF A DIGITAL SIGNAL REDUCING A NUMBER OF SIGNIFICANT BITS ACCORDING TO VALUES OF THE SAMPLES

FIELD OF THE INVENTION

The present invention relates to the field of digital signal processing. More specifically, it relates to approximations of samples of a digital signal.

BACKGROUND PRIOR ART

Nowadays signals are commonly represented, used and modified in a digital form. It is for example the case of visual or image signals, which are usually represented in the form of digital matrixes representing the amplitude of luminosity of pixels for one or more color layers, and for audio signals, which are usually represented, for one or more audio channels, by a succession of temporal samples of amplitude of an audio track on each audio channel.

A digital signal may be considered as being formed of samples which are stored on a number of bits, called bit depth of the signal. For example, an audio signal nowadays usually has a bit depth of 16 or 24 bits, while an image signal usually has a bit depth comprised between 8 and 16 bits. When a filter, transform, transfer function, or convolution is applied to an input digital signal, the resulting output digital signal usually has a bit depth higher than the bit depth of the input digital signal, in order to preserve as much information as possible from the input digital signal, and the transform. For example, the result of an attenuation of a 16 bit input digital signal can be stored on 24, or 32 bits, in order to have as much precision as possible in the output digital signal.

The number of bits which are commonly used by computing capacities for calculating operations is generally much higher than the number of bits which are used to store digital signals. For example, most processors perform operations on 32 or 64 bits, while most audio signal have a bit depth of 16, and most image signals a bit depth of 8. This property is used by digital signal processing systems, to obtain a precision as high as possible. An attenuation of a signal is usually expressed in dB. A commonplace operation of audio processing consists of applying a gain, expressed in dB, to audio signals. The number of bits allowed by processing capabilities is widely used to obtain very precise values of amplitude change of an audio signal. In a similar manner, when applying a FIR (Finite Impulse Response) filter, a maximum number of bits is used, in order to obtain an impulse response of the FIR filter, which is as close as possible to a theoretical/ideal impulse response.

However, such an output signal needs to be processed in order to be provided to a user. For example, an audio output digital signal can be converted to an analog signal by a Digital-to-Analog Converter (DAC) to be listened to using loudspeakers. Similarly, an image output digital signal can be viewed for example by activating pixels with level of luminosity defined by the values of samples of the output digital signal. Other forms of processing of a digital signal are possible. For example, a digital signal may be compressed, in order to reduce the amount of data used to represent the signal. The signal may also be played using a player.

A common assumption regarding signal processing consists in using the high number of bits allowed by modern processors to process digital signals with the highest number of bits available, because it is admitted that a higher number of bits is generally considered as providing an increased accuracy for processing signals.

However, it has been proven by the inventors of the current disclosure that the processing of digital signal using the highest available number of bit often counterintuitively leads to a deterioration of the subjective perception of quality of the signal by users. Such deterioration may be caused by an inability of the processing unit to process the least significant parts of a signal properly (for example an limitation of the DAC that is actually not able to process a signal at its nominal bit depth with maximum precision, or a limitation of the input of an audio player). The digital signal may be truncated to the expected bit depth of the processing unit when supplying the digital signal to the processing unit, but this does not prevent the deterioration.

Prior art systems do not provide any solution to this issue, and many prior art systems provide a reduced perceived quality of digital signals, despite processing digital signals using a high bit depth.

There is therefore the need for a device and method that increase the quality perceived by a user upon the reproduction of a digital signal.

SUMMARY OF THE INVENTION

To this effect, the invention discloses a digital circuitry configured to calculate, from at least a value of a first sample of a first digital signal, a value of a second sample of a second digital signal, based on the value of the first sample, said value of the second sample having a second number of significant bits lower than a first number of significant bits of the value of the first sample, said second number of significant bits depending at least on the value of the first sample.

Advantageously, the second number of significant bits is defined according to the value the first sample, so that the second number of significant bits varies in a direction opposite to a direction of variation of the absolute value of the first sample.

Advantageously, the second number of significant bits is equal to the minimum of a first predefined number minus a rounding of a binary logarithm of the absolute value of the first sample, and a second predefined number.

Advantageously, the second number of significant bits is obtained using: a third predefined number lower than the bit depth of the first digital signal; a fourth predefined number higher than 1 and lower than the bit depth of the first digital signal minus the third predefined number; a fifth predefined number higher than or equal to 1, and lower than or equal to the bit depth of the first digital signal minus the third predefined number minus the fourth predefined number plus 1; by: identifying the highest integer number between 0 and the fourth predefined number, for which the first integer number is lower than: two raised to the power of the bit depth of the first digital signal minus one multiplied by two raised to the power of 1 minus the fifth predefined number minus said highest number; setting the second number of significant bits as the third predefined number plus said highest integer number.

Advantageously, the second number of significant bits is defined according to a predicted difference between the value of the first sample and an approximation of the first sample using a third number of significant bits, so that the second number of significant bits varies in the same direction than the direction of variation of the absolute value of said predicted difference.

Advantageously, the second number of significant bits is defined as a growing function of said predicted difference divided by the value of the first sample.

Advantageously, the second number of significant bits depends upon values of coefficients obtained by a frequency transform of a time window of samples of the first digital signal comprising the first sample.

Advantageously, the second number of significant bits is defined according to a value representative of a derivative of the first digital signal at the first sample.

Advantageously, the value representative of the derivative of the first digital signal at the first sample is an absolute difference between the value of the first sample and the value of the sample immediately preceding the first sample in the first digital signal.

Advantageously, the value of the second sample is selected as a suitable value, belonging to an ordered set of suitable values, which is the closest to the value of the first sample in the ordered set of suitable values, and wherein the number of significant bits of each suitable value in the ordered set of suitable values is lower than the number of significant bits of any value in an open interval between said suitable value in the ordered set and an neighbor suitable value in said set.

Advantageously, the value of the second sample is calculated based on an intermediary value, said intermediary value having a second number of significant bits lower than an intermediary number of significant bits of the intermediary value, and depending at least of said intermediary value; the intermediary value is calculated based on the value of the first sample, the intermediary number of significant bits being lower than the number of significant bits of the first sample.

Advantageously, the second number of significant bits is selected among two or more candidate numbers of significant bits, each of said two or more candidate numbers of significant bits being lower than a first number of significant bits of the value of the first sample, and depending at least on the value of the first sample.

Advantageously, the second number of significant bits is lower than or equal to a number of significant bits allowing the second digital signal, or a signal derived therefrom to match an expected bit depth of a processing unit that receives as input said second digital signal, or a signal derived therefrom.

Advantageously, the second number of significant bits is higher than or equal to a minimum number of significant bits of the value of the second sample that does not introduce a noticeable alteration in the second digital signal, or a signal derived therefrom.

Advantageously, the noticeable alteration is a noticeable quantization noise.

The invention also discloses a digital circuitry configured to perform a convolution of an input digital signal, or a derivative thereof, and a second digital signal to obtain an output digital signal, a value of a second sample of the second digital signal being calculated from at least a value of a first sample of a first digital signal by a digital circuitry according to the disclosure.

The invention also discloses a second digital signal wherein a value of a second sample of the second digital signal is calculated based on a value of a first sample of a first digital signal, said value of the second sample having a second number of significant bits lower than a first number of significant bits of the value of the first sample, said second number of significant bits depending at least on the value of the first sample.

The invention also discloses a method to calculate, from at least a value of a first sample of a first digital signal, a value of a second sample of a second digital signal based on the value of the first sample, said value of the second sample having a second number of significant bits lower than a first number of significant bits of the value of the first sample, said second number of significant bits depending at least on the value of the first sample.

The invention also discloses a method of convolution of an input digital signal and a second digital signal to obtain an output digital signal, a value of a second sample of the second digital signal being calculated, from at least a value of a first sample of a first digital signal by a method according to the disclosure.

The invention also discloses a computer program product comprising computer code instructions configured to execute the method of the disclosure.

The invention also discloses a digital circuitry configured to calculate, from at least a value of a first sample of a first digital signal, a value of a second sample of a second digital signal, as based on the value of the first sample, said second value of the second sample having a second number of significant bits lower than a first number of significant bits of the value of the first sample, and lower than or equal to a number of significant bits allowing the second digital signal, or a signal derived therefrom to match an expected bit depth of a processing unit that receives as input said second digital signal, or a signal derived therefrom.

Advantageously, the second number of significant bits is higher than or equal to a minimum number of significant bits of the value of the second sample that does not introduce a noticeable alteration in the second digital signal, or a signal derived therefrom.

Advantageously, the noticeable alteration is a noticeable quantization noise.

Advantageously, the number of significant bits is defined so that the sum of the reductions of the number of significant bits of the first digital signal, and signals derived therefrom, is equal to or below a maximum sum of the reductions of the number of significant bits that does not introduce a noticeable alteration in the second digital signal, or a signal derived therefrom.

Advantageously, the first sample is the unique sample of the first digital signal, and the value of the first sample is representative of a change of amplitude of the input digital signal.

Advantageously, the first sample is the unique sample of the first digital signal, and the value of the first sample is representative of a change of amplitude of the input digital signal.

Advantageously, the first digital signal is an impulse response of a FIR filter.

Advantageously, the first digital signal is an upsampled digital signal.

Advantageously, the second number of significant bits is dependent upon a phase of the upsampled digital signal the first sample belongs to.

Advantageously, the first digital signal is an audio digital signal.

Advantageously, the processing unit is an audio encoder.

Advantageously, the second number of significant bits is dependent upon an index of the first sample within the first digital signal.

The invention also discloses a system comprising: a first device comprising a first digital circuitry according to the disclosure to calculate, from values of samples of a first input digital signal, values of samples of a second input digital signal to be sent to an audio encoder to obtain a lossy compressed audio stream or file; a second device comprising: an audio decoder to obtain, from said lossy compressed audio stream or file, a first decoded digital audio stream; a second digital circuitry according to the disclosure to calculate, from values of samples of the first decompressed digital audio stream, values of samples of a second digital audio stream to be sent to a DAC.

Advantageously, the second number of significant bits depends at least on the value of the first sample.

Advantageously, the second number of significant bits is defined according to the value the first sample, so that the second number of significant bits varies in a direction opposite to a direction of variation of the absolute value of the first sample.

The invention also discloses a digital circuitry configured to perform a convolution of an input digital signal, or a derivative thereof, and a second digital signal to obtain an output digital signal, a value of a second sample of the second digital signal being calculated, from at least a value of a first sample of a first digital signal by a digital circuitry according to the disclosure.

Advantageously, the second number of significant bits is equal to or above a maximum number of significant bits that does not necessarily introduce a noticeable alteration in the input digital signal, or a signal derived therefrom, said maximum number of significant bits being equal to the expected bit depth of a processing unit plus a maximum sum of reductions of the number of significant bits to perform to the input digital signal, or a signal derived therefrom without introducing a noticeable alteration minus the bit depth of the input digital signal.

The invention also discloses a device comprising: a first digital circuitry according to the disclosure to perform a convolution of an input digital signal with a transform digital signal comprising a single sample representative of a change of amplitude of the input digital signal, to obtain a first output digital signal; a second digital circuitry according to the disclosure to calculate, from at least a value of a first sample of the first output digital signal, a value of a second sample of a second output digital signal, based on the value of the first sample, said value of the second sample having a second number of significant bits dependent upon the number of significant bits of the single sample representative of the change of amplitude.

The invention also discloses a device comprising: a digital circuitry configured to create, from an input digital signal at an input sampling rate, an upsampled input digital signal at an output sampling rate which is a multiple of the input sampling rate, the sample belong to the Phase 0 of said upsampled input digital signal having the values of samples of the input digital signal, and the other samples a null value; a digital circuitry configured to perform a convolution of said upsampled input digital signal with a digital transform signal representative of an upsampling filter, to obtain a first output digital signal; a digital circuitry according to the disclosure to obtain a second output digital signal from said first output digital signal.

Advantageously, the input digital signal is an audio digital signal obtained by decoding a lossy compressed audio digital signal.

Advantageously, the second number of significant bits depends at least on the value of the first sample.

The invention also discloses a second digital signal wherein a value of a second sample of the second digital signal is calculated based on a value of a first sample of a first digital signal, said value of the second sample having a second number of significant bits lower than a first number of significant bits of the value of the first sample, and lower than or equal to a number of significant bits allowing the second digital signal, or a signal derived therefrom to match an expected bit depth of a processing unit that receives as input said second digital signal, or a signal derived therefrom.

The invention also discloses a method to calculate, from at least a value of a first sample of a first digital signal, a value of a second sample of a second digital signal based on the value of the first sample, said value of the second sample having a second number of significant bits lower than a first number of significant bits of the value of the first sample, and lower than or equal to a number of significant bits allowing the second digital signal, or a signal derived therefrom to match an expected bit depth of a processing unit that receives as input said second digital signal, or a signal derived therefrom.

The invention also discloses a method of convolution of an input digital signal and a second digital signal to obtain an output digital signal, a value of a second sample of the second digital signal being calculated, from at least a value of a first sample of a first digital signal by a method according to the disclosure.

The invention also discloses a computer program product comprising computer code instructions configured to execute the method of the disclosure.

The invention also discloses a digital circuitry configured to perform a convolution of an input digital signal, or a derivative thereof, and a second digital signal to obtain an output digital signal, a value of a second sample of the second digital signal being calculated based on a value of a first sample of a first digital signal, said value of the second sample having a second number of significant bits lower than a first number of significant bits of the value of the first sample, said second number of significant bits depending at least on the value of the first sample.

The invention also discloses a digital circuitry configured to perform a convolution of an input digital signal, or a derivative thereof, and a second digital signal to obtain an output digital signal, a value of a second sample of the second digital signal being calculated based on a value of a first sample of a first digital signal, said value of the second sample having a second number of significant bits lower than a first number of significant bits of the value of the first sample, and lower than or equal to a number of significant bits allowing the output digital signal, or a signal derived therefrom, to match an expected bit depth of a processing unit that receives as input said output digital signal, or a signal derived therefrom.

The disclosure optimizes the representation of a digital signal.

The disclosure increases the perception by a user of a digital signal.

The disclosure is applicable to any kind of digital signal, notably audio, image or video digital signals.

The disclosure may be used to enhance the restitution of compressed audio streams or files.

The optimization of the bit representation of samples of a digital signal according to the disclosure can be tailored to represent the digital signal as accurately as possible.

BRIEF DESCRIPTION OF THE DRAWINGS

The invention will be better understood and its various features and advantages will emerge from the following description of a number of exemplary embodiments provided for illustration purposes only and its appended figures in which:

FIGS. 2a, 2b, 2c, 2d, 2e and 2f display examples of a device in a number of embodiments of the invention;

FIGS. 3a, 3b and 3c display examples of a device to set the volume of a digital signal in a number of embodiments of the invention;

DETAILED DESCRIPTION OF THE INVENTION

Figure 1A:
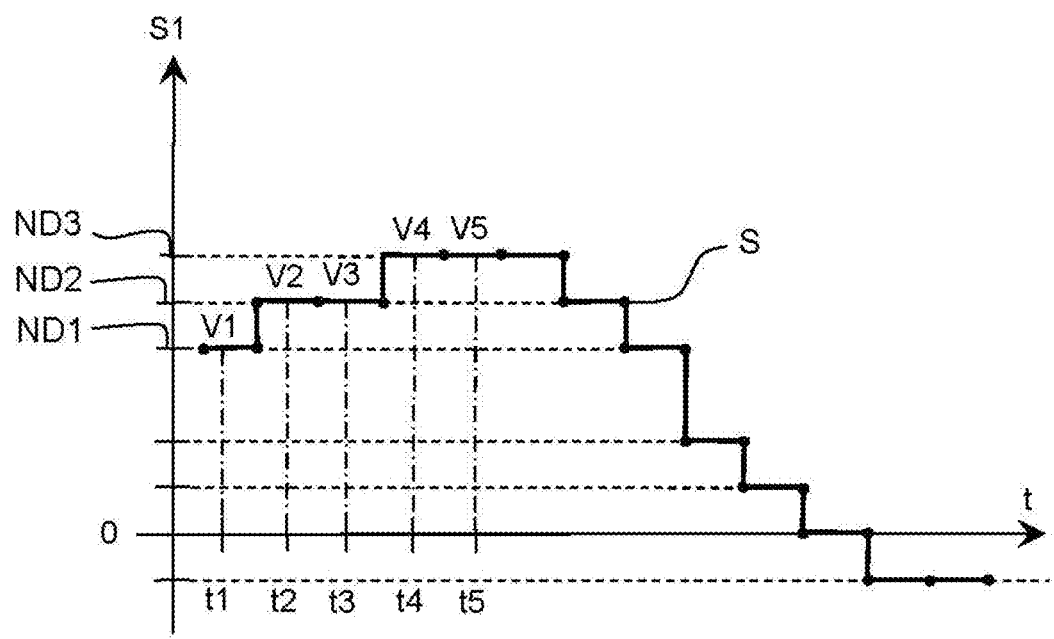
FIGS. 1a and 1b display respectively two digital signals.
Figure 1B:
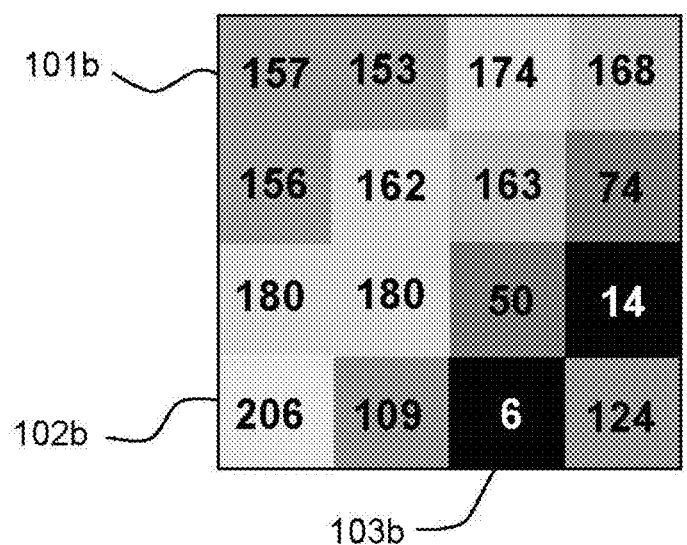

FIGS. 1a and 1b display respectively two digital signals.

FIG. 1a represents schematically a first digital signal S.

The signal S is defined by a plurality of successive temporal values called samples, each sample having a value also potentially mentioned as an amplitude. The signal itself, as a whole, has an amplitude which can refer in particular to the difference between a maximum value and a minimum value (possibly positive and/or negative) exhibited by this signal, half this difference, or else an average or maximum of the absolute values of the values exhibited by this signal.

The first signal S1 exhibits a succession of samples defining the amplitude of the signal at successive times t1, t2, t3, t4, t5 . . . The successive times may be sampled at different frequencies. For example, for illustration and simplification purpose, an audio signal can be sampled at 22050 Hz (22050 samples per second), 24000 Hz, 44100 Hz, 48000 Hz, 88200 Hz, or 96000 Hz.

The first signal S1 is represented in digital form, so that each sample at times t1, t2, t3, t4, t5 has a value or amplitude V1, V2, V3, V4, V5, . . . each being equal to a discrete level, for example ND1, ND2 or ND3. The number of discrete levels may depend on the representation of each sample.

Different representations of the signal S1 are possible. For example, the samples of the signal S1 may be represented using a signed 16 bits integer, that is to say using integer values ranging from $-32\ 768$ ($-1 \times 2^{15}$) to $32\ 767$ ($2^{15}-1$). The values of samples may also be interpreted as representing an amplitude in a normalized scale from $-1$ to $1$ ($1-2^{-15}$ exactly, since the highest value that can be obtained is equal to $$\frac{2^{15}-1}{2^{15}}\Big)$$

by dividing the integer value by the maximum allowable absolute value of the chosen integer representation ($2^{15}$ in this case). Similarly, the samples of the signal S1 may be represented using signed 24 bits integers, that is to say using integer values ranging from $-8\ 388\ 608$ ($-1 \times 2^{23}$) to $8\ 388\ 607$ ($2^{23}-1$), respectively corresponding to an amplitude in a scale from $-1$ to $1$ ($1-2^{-23}$ exactly, since the highest value that can be obtained is equal to $$\frac{2^{23}-1}{2^{23}}\Big)..$$

It can be generally seen that the more bits are used to represent the signal, the more precision can be obtained in the amplitudes of said signal. The 16 bits signed integer and 24 bits signed integer are respectively used to represent audio signals in 16 bits and 24 bits PCM (Pulse Code Modulation).

The samples of the signal S1 may also be represented using unsigned integers. For example, a representation using an unsigned 16 bits integer uses unsigned integer values from 0 to 65 535 ($2^{16}-1$, corresponding to hexadecimal values from 0X0000 to 0xFFFF, wherein 0x0000 corresponds to zero), and a representation using 24 bits integer uses unsigned integer values from 0 to 16 777 215 ($2^{24}-1$, corresponding to hexadecimal values from 0x000000 to 0XFFFFFF, wherein 0x000000 corresponds to zero). In such an unsigned integer representation of the signal, it is assumed that the signal's mean level is at half scale.

The total number of bits used to represent the samples of the signal is called "bit depth". For example, the bit depth of a 16 bits PCM audio signal is 16, and the bit depth of a 24 bits PCM audio signal is 24. Meanwhile, the number of significant bits designates the minimum number of bits needed to express a value. The number of significant bits is tied to each value of a sample, and the number of significant bits of a value of sample is equal to or lower than the bit depth of the sample.

The number of significant bits is independent on the way in which a sample is expressed, and applies as well to integer values, normalized values, or integer conversion of floating point values. The number of significant bits generally designates the number of bits needed to represent a value until the least significant bit is reached. By means of example, for 8-bits unsigned samples:

the value 64 (in binary 0100 0000; in hexadecimal 0x40) has a number of significant bits equal to two (2). Indeed, the least significant bit is the first "1" which is in $2^{nd}$ position;

the value 65 (in binary 0100 0001; in hexadecimal 0x41) has a number of significant bits equal to eight (8). Indeed, the least significant bit is the last "1" that is in the $8^{th}$ position.

It has to be noted that even very close values may have a number of significant bits dramatically different. The invention takes advantage of this property to approximate, when possible, values that have a high number of significant bits to close values that require a lower number of significant bits. For example, the value "64" is a close approximation of the value "65" that requires a much lower number of significant bits (1 versus 8).

It thus shall be noted that, in the one's complement notation, a positive value and its negative opposite value have the same number of significant bits.

The same principle applies to 8-bits signed values, and it can be using two's complement interpretation, wherein:
- the value −128 (in binary 1000 0000; in hexadecimal 0x80) has a number of significant bits equal to 1. Indeed, the last "1" is in the 1st position;
- the value 64 (in binary 0100 0000; in hexadecimal 0x40) has a number of significant bits equal to 2;
- the value −64 (in binary 1100 0000; in hexadecimal 0xBF) has a number of significant bits equal to 2;
- the value −1 (in binary 1111 1111; in hexadecimal 0xFF) has a number of significant bits equal to 8;
- the value −32 (in binary 1110 0000; in hexadecimal 0xE0) has a number of significant bits equal to 3;
- the value −126 (in binary 1000 0010; in hexadecimal 0x82) has a number of significant bits equal to 7. Indeed, the last "1" is in the $7^{th}$ position;
- the value −127 (in binary 1000 0001; in hexadecimal 0x81) has a number of significant bits equal to 8. Indeed, the last "1" is in the $8^{th}$ position;
- the value −128 (in binary 1000 0000; in hexadecimal 0x80) has a number of significant bits equal to 1. Indeed, the last "1" is in the $1^{st}$ position.

Although the two's complement interpretation is by far the most widely used representations for negative numbers, other representations may be used. For example, 8-bits signed values can be represented using one's complement interpretation, wherein the last significant bits of negative integer number is the last "0":
- the value 64 (in binary 0100 0000; in hexadecimal 0x70) has a number of significant bits equal to 2. Indeed, the least significant bit is the last "1" that is in the $2^{nd}$ position;
- the value −64 (in binary 1011 1111; in hexadecimal 0xBF) has a number of significant bits equal to two (2). Indeed, for negative number using one's, the least significant bit is the last "0" which is, in this case, in the $2^{nd}$ position;
- the value −1 (in binary 1111 1110; in hexadecimal 0xFE) has a number of significant bits equal to eight (8). Indeed, the last "0" is in the $8^{th}$ position;
- the value −127 (in binary 1000 0000; in hexadecimal 0x80) has a number of significant bits equal to eight (8). Indeed, the last "0" is also in the $8^{th}$ position;
- the value −126 (in binary 1000 0001; in hexadecimal 0x81) has a number of significant bits equal to seven (7). Indeed, the last "0" is in the $7^{th}$ position.

It shall be noted that, whatever the type of unsigned representation used, when the signal has values between 0 and 1, a value on the form $$\frac{k}{2^n},$$

k being an odd number, has a number of significant bits equal to n. For example:
- the value ½ has a number of significant bits equal to 1: using 8-bit unsigned integer representation, ½ is equal to $$\frac{128}{256},$$

that is to say 1000 0000 in binary; using 16-bit unsigned integer representation, ½ is equal to $$\frac{2^{15}}{2^{16}},$$

that is to say 1000 0000 0000 0000 in binary;
- the value $$\frac{3}{2^3} = \frac{3}{8}$$

has a number of significant bits equal to 3: using 8-bit unsigned integer representation, $$\frac{3}{2^3}$$

is equal to $$\frac{96}{256},$$

that is to say 0110 0000 in binary; using 16-bit unsigned integer representation, $$\frac{3}{2^3}$$

is equal to $$\frac{2^{14}}{2^{16}} + \frac{2^{13}}{2^{16}},$$

that is to say 0110 0000 0000 0000 in binary.

Meanwhile, whatever the type of signed representation used, when the signal has values between −1 and 1, a value on the form $$\frac{k}{2^n},$$

k being a positive or negative odd number, has a number of significant bits equal to n+1. For example using signed numbers with two's complement notation:
- the value ½ has a number of significant bits equal to 2: using 8-bit signed integer with two's complement representation, ½ is equal to $$+\frac{64}{128},$$

that is to say 0100 0000 in binary; using 16-bit signed integer with two's complement representation, ½ is equal to $$+\frac{2^{14}}{2^{15}},$$

that is to say 0100 0000 0000 0000 in binary;
the value $-\frac{1}{2}$ has a number of significant bits equal to 2:
using 8-bit signed integer with two's complement representation, $-\frac{1}{2}$ is equal to $$-\frac{64}{128},$$

that is to say 1100 0000 in binary;
using 16-bit signed integer with two's complement representation, $\frac{1}{2}$ is equal to $$-\frac{2^{14}}{2^{15}},$$

that is to say 1100 0000 0000 0000 in binary;
the value $$+\frac{3}{2^3} = +\frac{3}{8}$$

has a number of significant bits equal to 4:
using 8-bit signed integer with two's complement representation, $$+\frac{48}{128},$$

is equal to $$+\frac{3}{2^3}$$

that is to say 0011 0000 in binary;
using 16-bit signed integer with two's complement representation, $$+\frac{3}{2^3}$$

is equal to $$+\frac{2^{14}}{2^{16}} + \frac{2^{13}}{2^{16}},$$

that is to say 0011 0000 0000 0000 in binary;
the value $$-\frac{3}{2^3} = -\frac{3}{8}$$

has a number of significant bits equal to 4:
using 8-bit signed integer with two's complement representation, $$-\frac{3}{2^3}$$

is equal to $$-\frac{48}{128},$$

that is to say 1011 0000 in binary;
using 16-bit signed integer with two's complement representation, $$-\frac{3}{2^3}$$

is equal to $$-\frac{2^{14}}{2^{16}} - \frac{2^{13}}{2^{16}},$$

that is to say 1011 0000 0000 0000 in binary.

These examples are provided by means of example only, and the signal S1 may also be represented using unsigned or signed integer of any bit depth, provided that the bit depth used is sufficient to represent the signal with the necessary precision. The signal S1 may also be represented using discrete values which are not integers, for example floating point values.

The signal may also be represented using a floating point representation compliant with the IEEE 754 standard where a normalization step is applied to the exponent (E) and the mantissa (M) and the mantissa's representation comprises an additional bit that is always equal to 1 and thus remains implicit.

Although the floating point representation theoretically allows the definition of very large numbers, it is possible to define a number of significant bits associated to a floating point number, when it is defined in an interval [−1; 1] (typically for representing a normalized value of an audio signal), as:

$$1+(-E)+1+k(M) \qquad \text{(Equation 1)}$$

wherein:
the first "1" is the sign bit;
−E is the opposite of the exponent;
the second "1" corresponds to the implicit "1" of the mantissa in the IEEE754 representation;
k(M) the number of significant bits of the mantissa, calculated as if it is an unsigned number.

When the floating point number represent number in a large scale, for example in a [$-2^R$; $2^R$] scale, with R integer ≥0, the number of significant bits of an integer number can be defined as:

$$1+(-E)+R+1+k(M) \qquad \text{(Equation 2)}$$

wherein:
the first "1" is the sign bit;
−E is the opposite of the exponent;

the second "1" corresponds to the implicit "1" of the mantissa in the IEEE754 representation;

k(M) the number of significant bits of the mantissa, calculated as if it is an unsigned number;

R is an integer number ≥0, that defines a $[-2^R; 2^R]$ scale that bounds the possible value of the floating point number.

The number of significant bits may be calculated using any suitable method depending on the representation of the signal.

The first signal S1 is here representative of a sound signal. The first values V1, V2, V3, V4, V5, . . . can then be values of acoustic overpressure or under-pressure, or values of an electrical voltage representing this sound signal, or else digital values, to which no particular unit is attached, which are representative of this sound signal.

As a variant, the first signal could also be representative of a luminous signal, of a radio-electrical signal or the like, or be representative of the evolution in the course of time of the position of an object or of any other quantity.

The FIG. 1b displays an example of a digital signal representative of an image. In such a signal example, the values of the samples correspond to the value of a luminosity intensity of a pixel for a color layer. The pixels are represented by their positions from a corner of the image, for example the top-left corner.

In the example of FIG. 1b, the image is formed of a single color layer with a bit depth of 8 bits. Each value thus represents an intensity of luminosity of a unique grayscale layer of the image, in a scale ranging from 0 (no luminosity—black) to 255 ($2^8$, maximum luminosity—white). In the example of FIG. 1b, the pixel 101b has a value of 157 that corresponds to a medium grey, the pixel 102b has a value of 206 that corresponds to a light grey, and the pixel 103b has a value equal to 6 that corresponds to a very dark grey.

This example is provided by way of example only. Many other representations of pixels of an image exist. For example, the values of the pixels may be stored using a different bit depth, for example 12 or 16 bits. Similarly, the image may comprise more than one color layer. For example, the image can comprise three (3) color layers corresponding to RGB (Red Green Blue) components of a color, 3 color layers corresponding to YCbCr (Luma, Chroma Blue, Chroma Red) components of an image or four (4) color layers corresponding to CMYK (Cyan Magenta Yellow Key) colors of an image. In these cases, each pixel can comprise up to 3 or 4 values corresponding to the components of the image.

The FIGS. 2a, 2b, 2c, 2d, 2e and 2f display examples of a device in a number of embodiments of the invention.

The FIG. 2a displays a first example of a device in an embodiment of the invention.

The device 200a receives a first digital signal Si, and comprises a digital circuitry 210a configured to calculate, from at least a value of a first sample of the first digital signal Si, a value of a second sample of a second digital signal Si', as an approximation of the value of the first sample, said approximation having a second number $k_2$ of significant bits lower than or equal to a first number $k_1$ of significant bits of the value of the first sample of the first digital signal Si.

In this description, a digital circuitry may be a processor operating in accordance with software instructions, a hardware configuration of the processor, or a combination thereof. The digital circuitry may also be a specific-purpose digital circuitry such as a DSP (Digital Signal Processor) or a FPGA (Field Programmable Gate Array). It should be understood that any or all of the functions discussed herein may be implemented in a pure hardware implementation and/or by a processor operating in accordance with software instructions, and a configuration of a machine learning engine or neural network. A digital circuitry may also be a multi-core processor executing operations in parallel, a series of processors, or a combination thereof. It should also be understood that any or all software instructions may be stored in a non-transitory computer-readable medium. The term "configuration of a digital circuitry" refers to any means (for example hardware configuration, software instructions, machine learning, training or neural network, or any other adaptation means or combination thereof) of configuring a digital circuitry to execute operations. The digital circuitry may also be referred to as "processing logic". The digital circuitries of the invention may be embedded within any computing device which is able to process digital signals, such as a personal computer, a laptop, a tablet, a Smartphone, a PDA (for personal digital assistant), a music player, a mobile device, any communication device, etc. . . . .

In a number of embodiments of the invention, the digital circuitry 210a is configured to calculate the second signal Si' as an approximation of the first signal Si, wherein each sample of the first signal Si has a corresponding sample in the second signal Si', the value of each corresponding sample of the second signal having a number of significant bits $k_2$ equal to or lower than the number of significant bits $k_1$ of the value of the sample of the first signal Si.

The second digital signal Si' is, afterwards, sent to a processing unit 220a. In the example of FIG. 2a, the first and second digital signals are audio signals, and the processing unit 220a is an audio player.

In the example of FIG. 2a, the audio player is an external audio player. For example, the second digital signal Si' may be streamed to a further device comprising the audio player 220a to be played.

In an aspect of the invention, the second number of significant bits is lower than the expected bit depth of the processing unit 220a. For example, if the audio player 220a expects 16-bit audio as input, if the bit depths of both the first and the second digital signals are 16 bits, and if a number of significant bits of a value of a sample of the first digital signal is equal to 15, the value of the corresponding sample of the second digital signal may be an approximation of the value of the sample of the first digital signal using a number of significant bits which is lower than both the number of significant bits of the sample of the first digital signal, and the bit depth expected as input by the audio player 220a. For example, this value may be approximated using a number of significant bits equal to 10, 12 or 14. It shall be noted that the approximation according to the present invention preserves the general meaning of the digital signal.

The inventors of the present disclosure have noticed through experiments that this approximation of the first digital signal reducing the number of significant bits surprisingly increases the perceived quality of the sound, when it is played. For example, a music track would sound clearer, and audio speech would be more intelligible, using the reduction of the number of significant bits. This result is counterintuitive, since it is a common practice for the persons skilled in the art of digital signal processing to use a precision as high as possible for digital signals.

The increase of audio quality perception when playing a digital audio signal formed of samples having a lower number of significant bits according to the disclosure can be explained by a number of factors. For example, in the case of an audio player, the reduction of the number of significant bits may avoid information loss at the player's level.

This also applies to other kinds of digital signals such as image signals, wherein pixels wherein an excessive number of significant bits of image pixels, that will not be handled properly, will reduce the apparent image quality.

The inventors of the present disclosure also noted that, a further reduction of the number of significant bits generally leads to further quality in the audio perception. However, an excessive reduction of the number of significant bits may generate a noticeable alteration of the second digital signal. For example, an excessive reduction of the number of significant bits of samples of a 16 bit audio signal is likely to introduce a quantization noise in the second digital signal.

In order to overcome this issue, the second number $k_2$ of significant bits has to be set equal to or higher a minimum number of significant bits $k_{min}$ in order to not introduce a noticeable alteration of the second digital signal, for example a minimum number of significant bits $k_{min}$ that does not introduce perceivable quantization noise in the second digital signal.

If the second digital signal is a 16 bits audio signal, the minimum number of significant bits $k_{min}$ can be for example set equal to 10 and is preferably in a range between 8 and 12.

The values above have been identified by the inventors, by setting the minimum number of significant bits $k_{min}$ to various values, and performing listening tests to identify if a user perceives quantization noise.

However, the invention is not restricted to 16 bits audio signals, and a minimum number of significant bits $k_{min}$ can be identified for other types of signals (e.g. 24 bits audio signals, 8 bits RGB image signals, etc. . . . ) or applications. For example, for a given type of signal/application, a skilled man can test different values of the minimum number of significant bits $k_{min}$, and listen/watch/perceive the output digital, to determine if there is a quantization noise and thus determine the minimum number of significant bits $k_{min}$ below which a quantization noise is generated.

This allows obtaining an optimal perceived quality, by reaching a maximal benefit of the reduction of the number of significant bits, while avoiding an alteration of the digital signal due to an excessive reduction of the number of significant bits.

It shall be noted that this applies to sample of the first digital signal whose first number of significant bits $k_1$ is greater than the minimum number of significant bits $k_{min}$.

The other samples of the first digital signal already have a low number of significant bits, and may be left unchanged in the second digital signal.

According to various embodiments of the invention, the minimum number of significant bits $k_{min}$ may be defined in different manners. For example, listening tests may be performed to determine, for a given player, the minimum number of significant bits $k_{min}$ that does not introduce a noticeable distortion. The minimum number of significant bits $k_{min}$ may thus depends upon the player, but also upon the listening conditions (for example, the quality of the loudspeakers used), or the size and/or level of the target audience (for example, audiophiles may notice more subtle alterations of the sound than the average users).

The minimum number of significant bits $k_{min}$ may also depend on parameters of the first digital signal, such as its dynamic range, and may be adjusted for various time windows of the first digital signal. It may be defined using listening tests, as well as automatic tests of audio quality. A skilled man shall be able determine without any excessive difficulty, in a given condition, a minimum number of significant bits $k_{min}$ that does not introduce a noticeable distortion.

In an aspect of the invention, the second number of significant bits depends at least on the value of the first sample, detailed examples of such dependency being provided below.

This allows tailoring the second number of significant bits to the values of the sample, and providing an optimal number of significant bits to each sample of the second digital signal.

A number of different rules to define the number of significant bits according to the value of the first sample will be explained below.

As will be explained in more details hereinafter, the first digital signal may have a number of different sources. For example, it may be a native audio signal, a compressed audio signal or a master audio signal. The first and second digital signals may also be other kinds of digital signals than audio signals. For example, the first and second digital signals may be image signals.

The disclosure is applicable to any kind of suitable digital signal. More specifically, it is advantageously also applicable to digital signals that have various bit depths, and representations.

Meanwhile, although in the example of FIG. 2a the processing unit 220a is an audio player, the invention is applicable to other kinds of processing units, wherein the reduction of the number of significant bits can also increase the perceived quality of a digital signal.

For example, the processing unit 220a may be a DAC (Digital to Analog Converter) used to convert the second digital signal into an analog signal. Modern DACs generally converts digital signals on 24 or even 32 bits in order to have a precision as high as possible. However, despite such theoretical high number of bits, the digital to analog conversion of a signal using more than 24 bits is not realistic, and it definitively reduces the audio quality perceived by the user. Indeed, using 24 bits conversion allows converting signals down to an amplitude as low as −144 dB, while the residual noise of physical components of DACs is estimated around −120 dB, corresponding to approximately 20 bits.

Even digital signals that have a bit depth equal to the bit depth expected by DACs, for example digital signals with a bit depth of 24 may cause alteration of the output of the DAC, due to improper conversion of the information contained in the LSBs of the digital signal.

Therefore, lowering the number of significant bits of samples of the second digital signal below a bit depth expected by a DAC, for example below 24 bits, advantageously allows an increase of the perception by a user of the audio quality of the analog signal at the output of the conversion.

The processing unit 220a may also be in some use cases a compression module arranged to perform a compression of the second digital signal, for example in a compressed format such as the MP3 or the AAC format.

Such a processing unit also expects as input a predefined bit depth. For example, compression formats may compress audio signals with a bit depth of 16 or 24 bits. A reduction of the number of significant bits of the second digital signal also increases the perceived quality when a user listens to the compressed files.

This effect is not intuitive, since it is expected that a higher amount of information allows for a more accurate restitution of the signal. However, in the example of compression, the compression may be less destructive when applied to a signal whose samples have a lower number of significant bits, provided that compression algorithms need to cancel audio information to compress the audio signal to reach a lower bitrate.

The disclosure is however not restricted to these examples, and it may be applied to other processing units that expect as input a digital signal with a defined bit depth.

The inventors of the disclosure also noted that, similarly to the example of the audio player, a further reduction of the number of significant bits generally leads to further quality in the audio perception for other kinds of processing units such as a compression unit or a DAC, but, it has also to be noticed that an excessive reduction of the number of significant bits may generate a noticeable alteration of the second digital signal. For example, such excessive reduction of the number of significant bits may introduce quantization noise in the second digital signal.

In order to overcome this issue, the second number $k_2$ of significant bits may be equal to or higher than a minimum number of significant bits $k_{min}$ that does not introduce a noticeable alteration of the second digital signal, for example a minimum number of significant bits $k_{min}$ that does not introduce perceivable quantization noise in the second digital signal, as explained above.

The FIG. 2b displays a second example of a device illustrating an embodiment of the invention.

The device 200b receives as input a first digital signal Si that may be for example an audio digital signal, an image digital signal, etc. . . . . Any type of signal discussed for the first digital signal Si of FIG. 2a may be used.

The device 2b comprises a digital circuitry 210b configured to calculate, from at least a value of a first sample of the first digital signal Si, a value of a second sample of a second digital signal Si', as an approximation of the value of the first sample, said approximation having a second number of significant bits $k_2$ lower than or equal to a first number of significant bits $k_1$ of the value of the first sample.

The device 2b further comprises a digital circuitry 230b to perform a convolution of the second digital signal Si' with a transform signal St. The transform signal St can be for example an impulse response of a transform. The transform may for example be a FIR filter. Any filter that can be applied to digital signals may be used here. For example, the filter may be an upsampling filter, a lowpass filter a denoising filter; a noise cancelation filter, etc. . . . . The transform signal St can be predefined, or vary over time. For example, a lowpass filter is usually predefined, while a noise cancelation filter can be updated during its usage in order to adapt to the evolution of surrounding noise. The transform signal St may also comprise a single sample, representative of a change of amplitude of the digital signal.

At the output of the convolution, an output digital signal So is obtained, which is supplied to a DAC 220b, to be converted into an analog signal Sa. The DAC 220b is provided by means of non-limitative example only of a processing unit, for simplification purposes but other processing units may be used, such as a compression unit, or a player.

In a number of embodiments of the invention, the second number of significant bits $k_2$ depends at least on the value of the first sample.

In a number of embodiments of the invention, the second number of significant bits $k_2$ is lower than or equal to a number of significant bits allowing the output digital So signal to match an expected bit depth of the DAC 220b that said output digital signal So is to be sent to.

Indeed, the number of significant bits of samples of the second digital signal Si' have a direct impact on the number of significant bits of the output digital signal: the number of significant bits of the output digital signal depends upon the number of significant bits of the samples of the second digital signal Si', the number of significant bits of the samples of the transform signal St, and the number of samples of the transform signal St. More specifically, when noting $s'_i[i]$, $s_t[i]$ and $s_o[i]$ the value of the $i^{th}$ sample of the respective digital signals, and N the number of samples of the transform signal St, the values of the samples of the output signal are equal to:

$$s_o[n] = \sum_{i=0}^{N} s_t[i] * s_i[n-i] \qquad \text{(Equation 3)}$$

The number of significant bits of the value of the term $s_t[i] * s_i[n-i]$ is bounded by the sum of the number of significant bits of the value $s_t[i]$, and the number of significant bits of the value $s_i[n-i]$. By means of example, if:
- the value $s_t[i]$ is a 8-bits unsigned integer equal to 0100 0000 in binary (or 0x40 in hexadecimal, thus having 2 significant bits;
- the value $s_i[n-i]$ is consequently a 8-bits unsigned integer equal to 0010 0000 in binary (or 0x20 in hexadecimal), thus having 3 significant bits;
- the value $s_t[i] * s_i[n-i]$ is consequently a 16-bits unsigned integer equal to 0000 1000 0000 0000 (or 0x1000 in hexadecimal), and thus has 5 significant bits.

It is known that the number of significant bits of a sum of values is equal to the higher number of significant bits amongst the terms of the sum. For example, when summing two numbers a and b, if:
- a is a 8-bits unsigned number equal to 0001 0000 in binary (or 0x10 in hexadecimal), thus having a number of significant bits equal to 4;
- b is a 8-bits unsigned number equal to 0010 0000 in binary (or 0x20 in hexadecimal), thus having a number of significant bits equal to 3;
- the sum a +b is a 8-bits unsigned number equal to 0011 0000 in binary (or 0x30 in hexadecimal, and thus has a number of significant bits equal to 4, that is to say the highest number of significant bits among numbers a and b.

The same principle can be extended to other representations of numbers, and any sum of numbers represented in a digital form.

Therefore, it follows that the number of significant bits of the value follows the rule below:

$$s_o[n] = \sum_{i=0}^{N} s_t[i] * s_i[n-i] \qquad \text{(Equation 4)}$$

and is equal to the highest number of bits among the values $s_t[i]$ for i=0, 1, . . . , N, plus the highest number of bits among the values $s_i[n-i]$ for i=0, 1, . . . , N.

However, a further condition for this to be true is that the sum of the terms can be written on the bit depth of the output signal, i.e. does not exceed the full scale of the samples it is written to. This condition is fulfilled if absolute value of the sum of the terms of the coefficients $s_t[i]$ is equal to or below the maximum absolute value allowed by the bit depth of the transform signal. For example, this condition is met if the transform signal is formed of signed integers, has a bit depth of 16, and $\Sigma_{i=0}^{N} s_t [i] < 2^{15}$. This condition is usually met by the design of impulse responses. If it is not the case, additional bits may be required. For example, if the transform signal is formed of signed integers:

if $2^{15} \leq \Sigma_{i=0}^{N} s_t [i] < 2^{16}$, an extra significant bit is required;
if $2^{16} \leq \Sigma_{i=0}^{N} s_t [i] < 2^{17}$, two extra significant bits are required;
etc. . . . .

It is thus possible to define the number of significant bits of the second digital signal, in order to control the number of significant bits of the output digital signal So. By means of example, if the transform signal St has a bit depth of 8, and therefore the highest possible number of bits of the samples of St is equal to 8, the digital circuitry 210b can be configured to obtain the samples of the second digital signal Si' by approximating the values of the samples of the first digital signal Si with a highest possible number of significant bits equal to 6. Therefore, the number of significant bits of the value of each sample of the output signal So will be equal to or below 14 (8+6), even if the DAC 220b expects digital signals having a bit depth equal to 16. On the contrary, samples of the second digital signal obtained by approximating the values of the first digital signal with a highest possible number of significant bits equal to 8 would lead the values of the output signal So having a bit depth equal to 16 (8+8), which is the bit depth expected as input by the DAC 220b.

Thus, in a number of embodiments of the invention, the digital circuitry 210b is configured to approximate the samples of the first digital signal using a number of significant bits that allows the samples of the output digital signal So to be lower than the bit depth that is expected by the DAC 220b.

The enclosed disclosure thus advantageously allows controlling the second number of significant bits $k_2$ to be lower than or equal to a number of significant bits allowing the output digital signal So to match the input bit depth of the DAC 220b. Such reduction of the number of significant bits of the second digital signal, and therefore the output digital signal leads to an increase of the perceived quality of the output digital signal. As explained with reference to the FIG. 2a, such benefits are not restricted to a DAC, but are also applicable to processing units other than a DAC, such as audio compression unit, a player, etc. . . . .

The output digital signal So is derived from the second digital signal and the transform digital signal. In the remaining of the description, a signal derived from another signal should be understood as a signal obtained, directly or indirectly, by said other digital signal, for example by convolution with further signals. The principles explained above remain true whatever the number of signals and convolutions are involved, and the disclosure allows controlling the number of significant bits of a digital signal, in order to control indirectly the number of significant bits of a signal derived from said digital signal.

As already noted with reference to FIG. 2a, in general, the quality of the output digital signal perceived by the user generally increases when the number of significant bits of samples of the second digital signal Si', and therefore the number of significant bits of the output digital signal decreases. However, if the number of significant bits of the samples has a value which is too low, noticeable alterations of the output digital signal, such as perceivable quantization noise, may appear.

In order to avoid such disturbance, the second number $k_2$ of significant bits is higher than or equal to a minimum number of significant bits $k_{min}$ of the value of the second sample that does not introduce a noticeable alteration of the output digital signal.

The determination of the minimum number of significant bits $k_{min}$ may be performed by any suitable means, for example by listening tests testing the possible values of the minimum number of significant bits $k_{min}$, listening/watching/perceiving the output signal to determine if a quantization noise is present, in order to obtain the limit under which a noticeable quantization noise is introduced. This can be performed for each type of signal/application. For 16 bits audio digital signal, the inventors identified that a minimum number of significant bits $k_{min}$ between 8 and 12 bits was advantageous, for example a minimum number of significant bits equal to 10. The determination of the minimum number of significant bits $k_{min}$ may be a number of significant bits that does not introduce a noticeable alteration of the input digital signal Si, provided that this alteration, for example this parasitic noise, will be transmitted to the output signal.

The FIG. 2c displays a third example of a device in an embodiment of the disclosure.

The device 200c receives an input digital signal Si, and comprises a digital circuitry 230c to perform a convolution of the input digital signal Si and a transform signal St to obtain a first output digital signal So.

The device 200c also comprises a digital circuitry 210c configured to calculate, from at least a value of a first sample of the first output digital signal, a value of a second sample of a second output digital signal as an approximation of the value of the first sample, said approximation having a second number of significant bits $k_2$ lower than or equal to a first number of significant bits $k_1$ of the value of the first sample.

In an embodiment of the invention, the second output digital signal So' is thus an approximation of the first output digital signal So, wherein each sample of the second output digital signal has a number of significant bits lower than or equal to the corresponding sample of the first output digital signal So.

The second output digital signal So' is sent to a processing unit 220c. In the example of the FIG. 2c, the input digital signal Si, first output digital signal So and second output digital signal So' are audio signals, and the processing unit 220c is a compression unit, for example a MP3 compression engine. The transform signal St may be an impulse response of a FIR filter that corresponds to a number of audio processing filters (for example a denoising filter, noise cancelation filter, equalization filter, etc. . . . ).

In an aspect of the invention, the second number of significant bits $k_2$ is lower than or equal to the expected bit depth of the processing unit 220c.

In an aspect of the invention, the second number of significant bits $k_2$ depends at least on the value of the first sample.

Figure 2D:
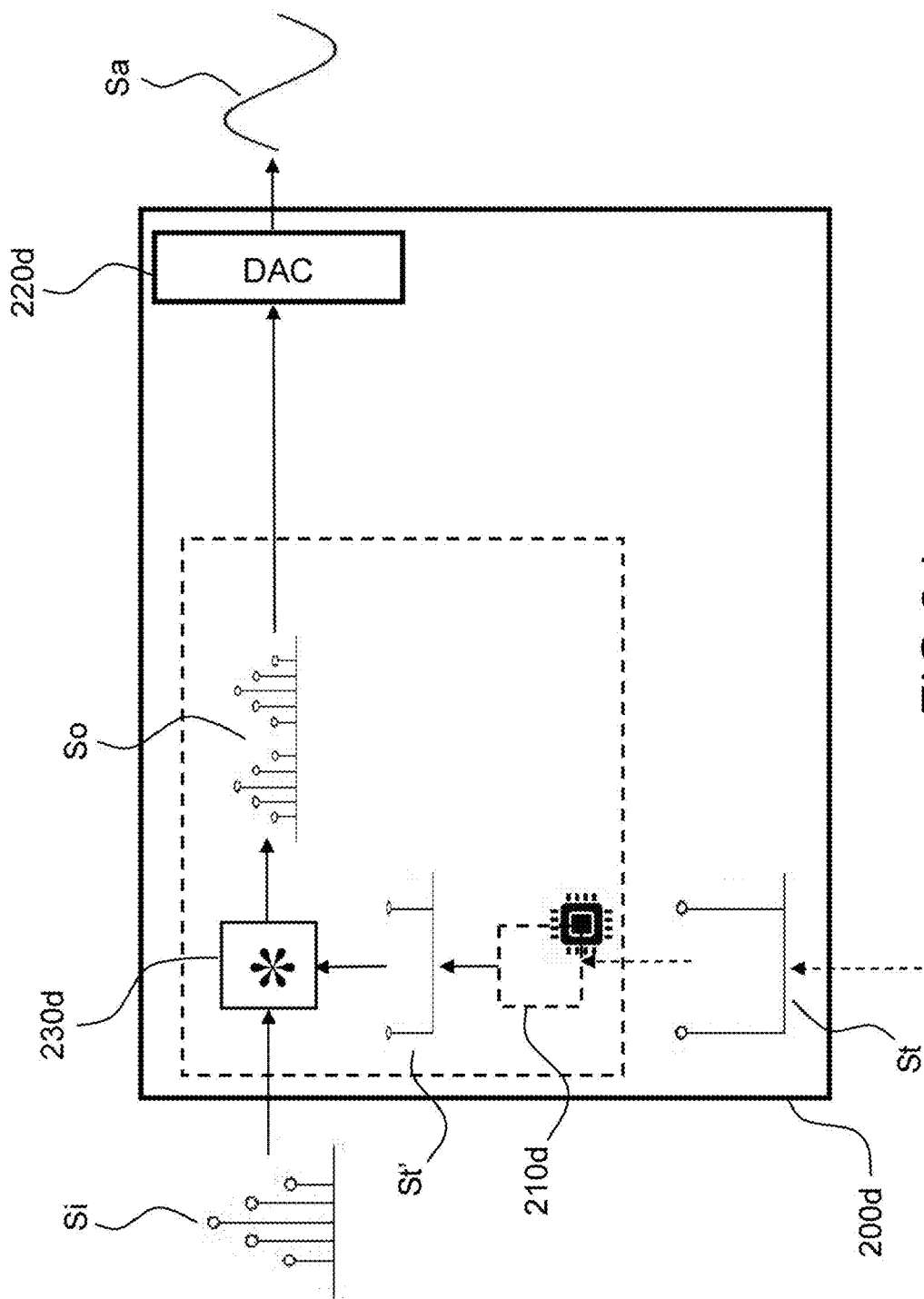

The FIG. 2d displays a fourth example of a device in an embodiment of the invention.

The device 200d receives as input an input digital signal Si, and a first digital transform signal St. The first digital transform signal is representative of an impulse response of a FIR filter that varies over time. Using a FIR filter that varies over time is useful in any application that requires a filter that is adaptable to changes in the environment. For example, an ANC (Active Noise Control) filter must be adapted in real time in order to cancel the ambient noise.

Indeed, an ANC system calculates in real time an impulse response H representing the ambient noise, and applies to an audio signal to be listened to a filter (1-H), represented by a transform signal St that is updated in real time. The real time adaptation of the impulse response can be performed using a source different than the input signal. For example, an ANC headphone adapts in real time the impulse response of an ANC filter based on the ambient noise as captured by a microphone, to remove ambient noise from the input signal Si, which can be for example an audio track that is being played by the device 2d, or the input of a second microphone that captures the voice of the user in addition to the ambient noise.

The device 210d comprises a digital circuitry 210d configured to calculate, from at least a value of a first sample of the first transform digital signal St, a value of a second sample of a second transform digital signal St' as an approximation of the value of the first sample, said approximation having a second number of significant bits $k_2$ lower than a first number of significant bits $k_1$ of the value of the first sample.

The device 210d further comprises a digital circuitry 230d to perform a convolution of the input digital signal Si with the second transform digital signal St, in order to obtain an output digital signal So which is sent to a processing unit 220d, which is, in the example of FIG. 2d, a DAC 220d configured to convert the output digital signal So into an output analog signal Sa.

The device 200d thus allows to apply to the input digital signal Si a FIR filter that is modified in real time, and whose samples have a limited number of significant bits. This allows an improvement of the perception by users of the quality of the output digital signal So, and the output analog signal Sa.

In an aspect of the disclosure, the second number of significant bits $k_2$ is lower than or equal to a number of significant bits, allowing the number of significant bits of samples of the output digital signal So to match the expected bit depth of the processing unit 220d.

In an aspect of the disclosure, the second number of significant bits $k_2$ depends at least on the value of the first sample.

In an aspect of the disclosure, the second number $k_2$ of significant bits is higher than or equal to a minimum number of significant bits $k_{min}$ of the value of the second sample that does not introduce a noticeable alteration in the second output digital signal.

In this example, the alteration may be an alteration of the functionality of a FIR filter, whose the transform signal St is an impulse response. For example, if the transform signal St is an impulse response of a low pass filter, an excessive reduction of the number of significant bits may lead to the transform signal not performing accurately the low pass filtering, the cutoff frequency of the filter be displaced or the stop-band attenuation being too low, etc. . . . . Issues related to the impulse response of the filter, such as aliasing in the case of up-sampling or down-sampling filters, may also appear in case of an excessive reduction of the number of significant bits.

The inventors have noted that, for filters to be applied to 16 bits audio signals, a minimum number of significant bits $k_{min}$ between 6 and 10, for example 6 bits, was advantageous. For other applications, types of signals, a suitable number of significant bits $k_{min}$ can be identified as already explained, for example by testing successively the values of the minimum number of significant bits $k_{min}$ lower than the bit depth of an impulse response, listening/watching/perceiving the output signal, determining if the functionality of the filter have been altered (that is to say, whether the intended effect is correctly perceived), and thus identifying the limit number of significant bits under which the functionality of the filter is altered. The minimum number of significant bits $k_{min}$ can be determined for a type of signal and/or a type of filter.

The FIG. 2e displays a fifth example of a device in an embodiment of the invention.

The device 200e receives as input a first input digital signal Si, and a first digital transform signal St. The first digital transform signal St is representative of an impulse response of a FIR filter that varies over time. Using a FIR filter that varies over time may be useful in any application that requires a filter that is adaptable to changes in the environment. For example, an ANC (Active Noise Control) filter must be adapted in real time in order to cancel the ambient noise.

The device 2 comprises a digital circuitry 210e to obtain a second input digital signal Si' from the first input digital signal Si, which is similar to the digital circuitry 210b of FIG. 2b, a digital circuitry 211e to obtain a second transform digital signal St', which is similar to the digital circuitry 210d of FIG. 2d, a digital circuitry 230e to perform a convolution of the second input digital signal Si' and the second transform digital signal St' in order to obtain a first input digital signal So, and a digital circuitry 212e to obtain a second output digital signal So' from the first input digital signal So, which is similar to the digital circuitry 210c. The second output digital signal So' is sent to processing unit 220e, which is, in the example of FIG. 2e a DAC. As already explained with reference to FIG. 2c, the transform signal St may be obtained in real time based an input different from the input signal Si. For example, for ANC systems, the input signal Si can be captured by a first microphone that captures the voice of the user, and ambient noise, and the transform signal St can be obtained in real time using a second microphone, that captures only ambient noise.

The device 2e therefore advantageously allows the samples of the second input digital signal Si', the second transform digital signal St' and the second output digital signal So' to have number of significant bits equal to or lower than the number of significant bits of corresponding samples of the first input digital signal Si, the first transform digital signal St, and the first output digital signal So respectively.

The digital circuitries 210e, 211e and 212e can be configured to provide, in combinations, an improved perception of the quality of the second output digital signal by the users.

Similarly to the example previously described, each of the reduction of significant bits performed by the digital circuitries 210e, 211e, 212e may be performed down to a minimum number of significant bits that does not cause a noticeable alteration of the digital signal. In a number of embodiments of the invention, the alterations possibly caused by the reductions of the number of significant bits of the different signals are fairly independent. A skilled man can thus determine a minimum number of significant bits for each digital circuitry 210e, 211 e, 212e independently. Conversely, in certain cases, the alterations of the digital signal caused by an excessive reduction of the number of significant bits are interdependent: an overall alteration depends on the minimum number of significant bits for the digital circuitries 210e, 211e, 212e. In such cases, a skilled man may identify a set of minimum number of significant bits for all the digital circuitries in the same time.

It has already been explained, with reference to FIGS. 2a to 2d, how to determine a minimum number of significant bits for each of the digital circuitries independently.

As noted above, it is possible for the device 200e to define independently or interdependently:
- a first number of significant bits $k_0$ to be used by the first digital circuitry 210e;
- a second number of significant bits $k_1$ to be used by the second digital circuitry 211e;
- a third number of significant bits $k_2$ to be used by the third digital circuitry 212e.

It shall be noted that, according to various embodiments of the invention, the first, second and third number of significant bits can be either allocated to all samples of the input, transform and output digital signals (for example if these signals are respectively truncated to $k_0$ $k_1$ and $k_2$ bits). In some embodiments of the invention, different number of bits can be allocated to various samples depending on a number of factors. In such cases, $k_0$, $k_1$ and $k_2$ represent respectively the minimum number of bits provided by the allocation. For example, if the allocation level defined below is used by digital circuitries 210e, 211e and 212e, it may allocate respectively at least $k_0$ $k_1$ or $k_2$ to samples that have a large value, and more bits to samples with lower value. The allocations used by the three digital circuitries 210e, 211e and 212e may be different (for example truncation, level allocation, and suitable values allocation) with different numbers of significant bits $k_0$, $k_1$ and $k_2$.

By means of example, if the digital signals Si, Si', St and St' all have a bit depth of 16, the digital signals So and So' a bit depth of 32, and the DAC 220e expects as input a bit depth of 24, prior art systems would allocate 16 bits to each sample of the input and transform digital signals, and 32 bits to the output digital signal, in order to perform calculations with the highest precision. The output digital signal, is truncated to 24 bits in order to be sent to the DAC. However, when doing so, the 8 least significant bits of the output digital signal (or even more than 8 if the DAC actually takes into account a number of significant bits lower than its nominal input bit depth) are abruptly removed. Due to the convolution with the transform signal, these least significant bits comprise a lot of information from the input digital signal, and this is roughly equivalent to removing the 8 least significant bits from the input digital signal. This is why such solution provides important degradation to the perception of the output digital signal by a user. This issue is even more problematic in practice, because many transform signals are in a much higher number of bits, for example 32 bits, and therefore force prior art systems to remove even more information from the input digital signals. This issue is also worsened when a plurality of successive convolutions are applied, each convolution increasing the number of significant bits of the output digital signal by the number of significant bits of a transform signal, thereby leading to an even more abrupt truncation. The inventors have thus noticed that the perceived quality of audio signals which is processed using prior art system is further reduced when more complex calculations and/or calculations that involve transforms with a higher precision are used.

On the contrary, the invention allows a tailored reduction of the number of significant bits, that avoids an abrupt reduction, and therefore greatly improves the perception of the digital signal. For example, in a device such as the device 200e, the digital circuitries may be configured so that:
- the digital circuitries 210e and 211e may be configured respectively in order that each sample of the second input digital signal Si', and each sample of the transform digital signal has a number of significant bits equal to or below 12 bits ($k_0$=k=12): therefore, each sample of the first output signal will have a number of significant bits equal to or below 24 bits; the digital circuitry 212e may then be configured in order that each sample of the second output digital signal has a number of significant bits equal to or below 22 bits ($k_2$=22);
- the digital circuitries 210e and 211e may be configured respectively in order that each sample of the second input digital signal Si' has a number of significant bits equal to or below 14 bits ($k_0$=14), and each sample of the transform digital signal has a number of significant bits equal to or below 10 bits ($k_1$=10): therefore, each sample of the first output signal will have a number of significant bits equal to or below 24 bits; the digital circuitry 212e may then be configured in order that each sample of the second output digital signal has a number of significant bits equal to or below 22 bits ($k_2$=22).

In these two examples, each sample of the second output digital signal has a number of significant bits equal to or below 22 bits, below the expected bit depth of the processing unit 220e, which is 24 bits. However, the reduction of the number of significant bits is performed in two different ways: in the first of those two cases, the reduction is applied equally on the input digital signal and the transform digital signal. In the second case, the number of significant bits of the input digital signal is not reduced a lot, while the number of significant bits of the samples transform digital signal is more reduced, while preserving the functionality of the transform represented by the transform signal (the inventors have noted that a number of significant bits equal to or above 6 was generally sufficient to preserve the functionalities of transform signals to be applied to 16 bits audio signals). Therefore, the latter case allows the same total reduction of the number of significant bits of the second output signal, while preserving more information from the input digital signal, and therefore providing an improved perceived quality.

The inventors have noted that the alteration brought to the impulse response by the second minimum number of significant bits $k_1$ is fairly independent of the alteration brought to the digital signal by the first minimum number of significant bits $k_0$, and the third minimum number of significant bits $k_2$. In addition, the first number of significant bits $k_1$ can be defined separately, in order not to introduce a noticeable alteration of the input digital signal Si. The inventors thus noted that the numbers of significant bits $k_0$ and $k_2$ should not be set below a first and third minimum number of significant bits $k_{0_{min}}$ and $k_{2_{min}}$ respectively in order not to introduce a noticeable alteration of the signal, and the number of significant bits $k_1$ should not be set below a second minimum number of significant bits $k_{1_{min}}$ that does not perform a noticeable alteration of the functionality of the transform.

The first minimum number of significant bits $k_{0_{min}}$ dependent on the input signal, and, in more cases, can be defined according to the type of the input signal. For example, a minimum number of significant bits $k_{0_{min}}$=10 is well suited for 16 bits audio signals.

The second minimum number of significant bits $k_{1_{min}}$ is dependent on the transform signal, and, in more cases, can be defined according to the type of the transform signal and/or the type of input digital signal to which the transform shall be applied. For example, a minimum number of significant bits $k_{1_{min}}$=6 is well suited for transforms to be applied on 16 bits audio signals. Other values of $k_{1_{min}}$ may be used, depending on the type of transform signal, and/or input digital signal. For example, $k_{1_{min}}=8$ provides good results for transforms signals representative of filters to apply to audio digital signals, and $k_{1_{min}}$ can have values as low as 1 if the transform signal for some values of coefficients of amplitude change.

The following rules can be applied in order to determine the third minimum number of significant bits $k_{2_{min}}$ to use for the digital circuitry 212e.

In some cases, $k_{2_{min}}$ can be defined by:

$$k_{2\,min} = k_{0_{min}} + k_1 \quad \text{(Equation 5)}$$

No additional alteration will be brought to the signal, because the least significant bits above $k_{2_{min}}$ that will be removed, correspond to bits that may have already been removed by the first digital circuitry 210e using the first minimum number of significant bits $k_{0_{min}}$.

In some cases, $k_{min}^2$ can be defined so that:

$$k_{0_{min}} \leq k_{2\,min} < k_{0_{min}} + k_1, \quad \text{(Equation 6)}$$

A perceivable alteration may not be brought, depending on a number of factors. Some of them are the number of samples of the transform signal St and their total energy: the higher the number of samples and energy of the transform signal, the more the information from samples of the input digital signal will be split between samples of the output digital signal So, and thus the lower can be the third minimum number of significant bits $k_{2_{min}}$ (with however $k_{0_{min}} \leq k_{2_{min}}$) without generating additional distortion.

However, it is impossible $k_{2_{min}} < k_{0_{min}}$. Indeed, this would consist in setting the number of significant bits to values lower than the first minimum number of significant bits $k_{0_{min}}$, while the number of significant bits of the first output digital signal is higher than the number of significant bits of the input digital signal, due to the convolution.

The third minimum number of significant bits $k_{2_{min}}$ can thus be chosen in an interval $k_{0_{min}} \leq k_{2_{min}} \leq k_{0_{min}} + k_1$, in order for the samples of second output digital signal So' to have a number of significant bits as low as possible, while not introducing additional perceivable degradation. The same principle can be generalized whatever the number of digital circuitries in the device. A third minimum number of significant bits $k_{2_{min}} = k_{0_{min}} + k_1$ advantageously ensure that no perceivable alteration will be added to the digital signal. This minimum number thus depends on the minimum number of significant bits $k_{0_{min}}$ that depends in general on the type of signals that is being processed, and the actual second number of significant bits $k_1$ used by the digital circuitry 211e. It preferable to set the second number of significant bits $k_1$ to the second minimum number of significant bits $k_{1_{min}}$ that does not introduce a noticeable alteration of the functionality of the transform, in order to let the third minimum number of significant bits $k_{2_{min}}$ be as low as possible, and in any case equal to or below the expected bit depth of the DAC 220e.

This principle can be applied if more than one transform are applied to the digital signal. For example, if three convolutions are performed, using respectively a number of significant bits equal to $k_1$, $k_1''$, $k_1'''$, the third number of significant bits can be defined, in order not to introduce a noticeable degradation of the signal, as:

$$k_{2\,min} = k_{0_{min}} + k_1 + k_1' + k_1'' \quad \text{(Equation 7)}$$

One aspect that is important in a number of cases is the total reduction of the number of significant bits provided to "message" digital signals (i.e input/output digital signals, or more generally digital signals that are representative of a message, by opposition to the transform signals. For example, image, audio or video signals are message signals. In some case, the alteration brought to the message is roughly dependent upon the sum of the reductions of the number of significant bits applied to message signals.

The example above highlights that a good solution to preserve a highest possible quality of signal, especially in cases where a large number of convolutions would be applied, consists in setting the minimum number of significant bits allocated to transform signals to a number as low as possible that preserves the functionality of the transformation (for example $k_1 = k_{1_{min}} = 6$ for audio signals). This avoids an excessive reduction of the number of significant bits of the audio, or more generally message signals, while reducing the number of significant bits of the output digital signal and preserving the functionality of the transform.

More generally, the minimum number of significant bits can be defined so that a total reduction of the number of significant bits of the message signal does not exceed a maximum value $\Delta k_{max}$. Indeed, each digital circuitry 210e, 212e reduces the highest number of significant bits of digital signals. By means of example:

- if the bit depth of the first digital input signal $n_{in}$ is equal to 16, samples of the first digital input signal have a number of significant bits equal or below 16;
- the reduction of the number of significant bits performed by the first digital circuitry 210e is thus at most equal to $\delta_0 = n_{in} - k_0$ (with $k_0 \leq n_{in}$) For example, if $n_{in}$ is equal to 16 (samples of the first input digital signal have a bit depth of 16 or less), and $k_0$ to 12 (the digital circuitry 210e allocates 12 or more bits to each sample of the second input digital signal), the number of significant bits is reduced of 4 (16−12) or less bits between the first and second input digital signals;
- the reduction of the number of significant bits performed by the digital circuitry 212e is at most equal to the difference between the highest possible value of the number of significant bits of the first output digital signal, which is equal to $k_0 + k_1$, and $k_2$. Thus the reduction of the number of significant bits performed by the digital circuitry 212e is equal to $\delta_2 = k_0 + k_1 - k_2$. In practice, if $k_0 + k_1 < k_2$, the number of significant bits of a sample of the first output digital signal is already lower than $k_2$, so that the number of significant bits of the corresponding sample of the second output digital signal will be the same $(k_0 + k_1)$, and $\delta_2 = 0$.

It is thus possible to calculate the sum of the reduction of the number of significant bits of message signals as:

$$\Delta k = \delta_0 + \delta_2 \quad \text{(Equation 8)}$$

In a number of embodiments of the invention, this sum of the reductions of the number of significant bits shall not be higher than a maximum sum of the reductions that does not introduce a noticeable alteration of the digital signal $\Delta k_{max}$. A condition not to introduce noticeable alteration (for example noticeable quantization noise) to the digital signal, is thus:

$$\Delta k \leq \Delta k_{max} \quad \text{(Equation 9)}$$

As the value $k_{min}$ of previous examples, the value $\Delta k_{max}$ depends on the signal. The value $\Delta k_{max}$ can be defined according to signal type, as the difference ot the bit depth of the signal and a value $k_{min}$ defined using the same principles as above. For example, a value $\Delta k_{max}$ between 4 and 8, for example $\Delta k_{max}=6$ is generally well suited for audio signals, especially 16 bits audio signals. More generally, in a number of the invention:

$$\Delta k_{max}=n_{in}-k_{0_{min}} \quad \text{(Equation 10)}$$

It follows from the equations above that:

$$\delta_0+\delta_2 \leq \Delta k_{max} \quad \text{(Equation 11)}$$

$$(n_{in}-k_0)+(k_0+k_1-k_2) \leq \Delta k_{max} \quad \text{(Equation 12)}$$

$$(n_{in}+k_1-k_2) \leq \Delta k_{max} \quad \text{(Equation 13)}$$

In addition, it shall be noted that we shall have:

$$k_2 \leq n_{out} \quad \text{(Equation 14)}$$

Wherein $n_{out}$ is the expected bit depth of the DAC, or more generally the processing unit the second output digital signal is sent to. Indeed, the samples of the second output digital signal shall have a number of significant bits equal to or below the bit depth expected by the DAC 220e, in order to avoid a truncation of the samples at the input of the DAC.

We thus have $k_1$ equal to or below a maximum number of significant bits $k_{1_{max}}$ that does not necessarily introduce an noticeable alteration of the message digital signals, with $$k_1 \leq k_{1_{max}} = \Delta k_{max}+n_{out}-n_{in} \quad \text{(Equation 15)}$$

We shall also have:

$$k_1 \geq k_{1_{min}} \quad \text{(Equation 16)}$$

In order to avoid an alteration of the functionality of the transform.

To summarize, the values $k_0$, $k_1$ and $k_2$ can be set with respect to the following rules:

$$\delta_0+\delta_2 \leq \Delta k_{max} \quad \text{(Equation 11)}$$

$$k_{1_{min}} \leq k_1 \leq \Delta k_{max}+n_{out}-n_{in} \quad \text{(Equation 15 and (Equation 16)}$$

The rules above can be generalized to devices that comprise a number of digital circuitries to perform allocation on a reduced number of significant bits. The digital circuitries can be separated between digital circuitries that reduce the number of significant bits of samples of message signal, with indexes noted i, and digital circuitries that reduce the number of significant bits of samples of transform digital signals, with indexes noted j. We thus have:

$$\Sigma_i \delta_i \leq \Delta k_{max} \quad \text{(Equation 17)}$$

(Equation 17 means that the sum of the reductions of the number of significant bits for all the digital circuitries that reduce the number (indexes i) of significant bits must be equal to or below $\Delta k_{max}$.

$$k_{j_{min}} \leq k_j \quad \text{(Equation 18)}$$

(Equation 18 means that the number of significant bits allocated by each digital circuitry (for each j) is equal to or above the minimum number of significant bit $k_{j_{min}}$ that preserves the functionality of the transform.

$$\Sigma_j k_j \leq \Delta k_{max}+n_{out}-n_{in} \quad \text{(Equation 19)}$$

(Equation 19 means that the sum of the number of significant bits $k_j$ allocated to the transforms signals (for different indexes j) shall be lower than or equal to $\Delta k_{max}+n_{out}-n_{in}$. Otherwise it is impossible, as demonstrated above, to have $\Sigma_i \delta_i \leq \Delta k_{max}$.

The principles set forth above can be used in the device 200e, for example to define the first, second and third number of significant bits $k_0$, $k_1$ and $k_2$, so that the convolution is calculated with the highest possible precision, without introducing a noticeable alteration of the digital signal.

In order to do so, it is possible to:
- set $k_2=n_{out}$;
- set $k_1=\Delta k_{max}+n_{out}-n_{in}$, i.e set $k_1$ to the highest possible value that does not force the digital circuitries 210e and 212e to remove more than $\Delta k_{max}$ significant bits, and thus introduce a noticeable alteration of the digital signal;
- set $k_0$ with $k_{0_{min}} \leq k_0 \leq n_{in}$, provided that:
  - if $k_0=k_{0_{min}}=n_{in}-\Delta k_{max}$, the digital circuitry 210e will remove up to $\Delta k_{max}$ significant bits (we thus have $\delta_0=\Delta k_{max}$); the number of significant bits of the samples of the first output digital signal will be up to $n_{in}-\Delta k_{max}+k_1=n_{out}$. In practice, all the reduction of the number of significant bits of the message signals is performed by the digital circuitry 210e;
  - if $k_0=n_{in}$, the digital circuitry 210e does not remove any significant bits, and the number of significant bits of the samples of the first output digital signal will be up to $n_{in}+k_1=n_{out}+\Delta k_{max}$. Thus $\delta_2=n_{out}+\Delta k_{max}-k_2$ with $k_2=n_{out}$, $\delta_2=\Delta k_{max}$, and, in practice, all the reduction of the number of significant bits of the message signals is performed by the digital circuitry 212e;
  - intermediary repartitions of the reduction of the number of significant bits can be set with $k_{0_{min}}<k_0<n_{in}$.

The reductions of the number of significant bits can thus be tailored according to the needs of the users. It shall be noted that, in the present case, in order to perform the transform/convolution with the highest precision, it is better to have $k_0=n_{in}$, and thus first perform the transform/convolution with the highest possible number of significant bits/ highest precision, then removing extra significant bits form the output digital signal.

For example, if the input signal Si is an audio signal, and if the input digital signal Si has a bit depth of 16 and the transform digital signal St has a bit depth of 32, the output digital signal a bit depth of 48 and the DAC 220e expects as input a 24 bit audio digital signal ($n_{out}=24$), the first, second and third numbers of significant bits may be defined in the following way, with $\Delta k_{max}=6$:
- the third number of significant bits $k_2$ is set to 24 for the digital circuitry 212e, so that the number of significant bits of the output digital signal is set exactly to the number of bits expected by the DAC 220e;
- the second number of significant bits $k_1$ is set to 14: $k_1=\Delta k_{max}+n_{out}-n_{in}=6+24-16=14$;
- the first number of significant bits $k_0$ can be set between between 10 ($n_{in}-\Delta k_{max}$) and 16 ($n_{in}$) in order to adjust the repartition of the removal of the most significant bits between the digital circuitries 210e and 212e, as explained above. $k_0=n_{in}$ allows to perform the calculations with the highest possible precision.

Conversely, prior art systems would perform calculations with a number of significant bits of the input digital signal equal to 16, a number of significant bits of digital signals equal to 32, and thus a number of significant bits of the output digital signals equal to 48. Thus, such prior art systems would perform an abrupt truncation of the output digital signal down to 24 bits, that would remove a high amount of information from the input digital signal, and generate an important reduction of the perceived quality. This situation is very usual, and, as shown above, the invention allows overcoming the limitations of prior art systems.

As noted above, this example consists in reducing the number of significant bits of the audio signal to the minimum value that does not introduce a perceivable quantization noise, in order to reduce the number of significant bits of the output digital signal, while performing the transformation with a transform signal having more precision. On the contrary, as noted above, it is possible to reduce the number of significant bits of the transform digital signal down to the minimum number of significant bits that does not introduce a noticeable alteration of the functionality of the transform (for example, 6), then performing a reduction of the number of significant bits of the audio signals in order to obtain a number of significant bits of the samples of the second output digital signal equal to or below the bit depth expected by the DAC 220e, with a limited reduction of the number of significant bits of the audio digital signals. The same principles can be applied with a higher number of transformations, and reductions the number of significant bits of audio or other digital signals.

These examples demonstrate that performing a reduction of the number of significant bits on a plurality of digital signals that are combined allows tailoring the reduction of the number of significant bits of each digital signal in order to obtain the best perceived quality of the output digital signal.

However, the invention is not restricted to this example, and a large number of different combinations are possible within the scope of the invention. For example, a device similar to the device 200e may comprise the digital circuitries 210e and 212e, but not the digital circuitry 211e, and the digital circuitry 230e may be configured to perform a convolution of the second input digital signal Si' with the first transform digital signal St; a device similar to the device 200e may not comprise the digital circuitry 212e, and the first output digital signal So may be sent to the processing unit 220e, etc. . . . . Any suitable combination of digital circuitries that allow optimizing the number of bits of digital signal, in order to optimize the perception by users of the quality of an output digital signal, may be used according to various embodiments of the invention.

Figure 2F:
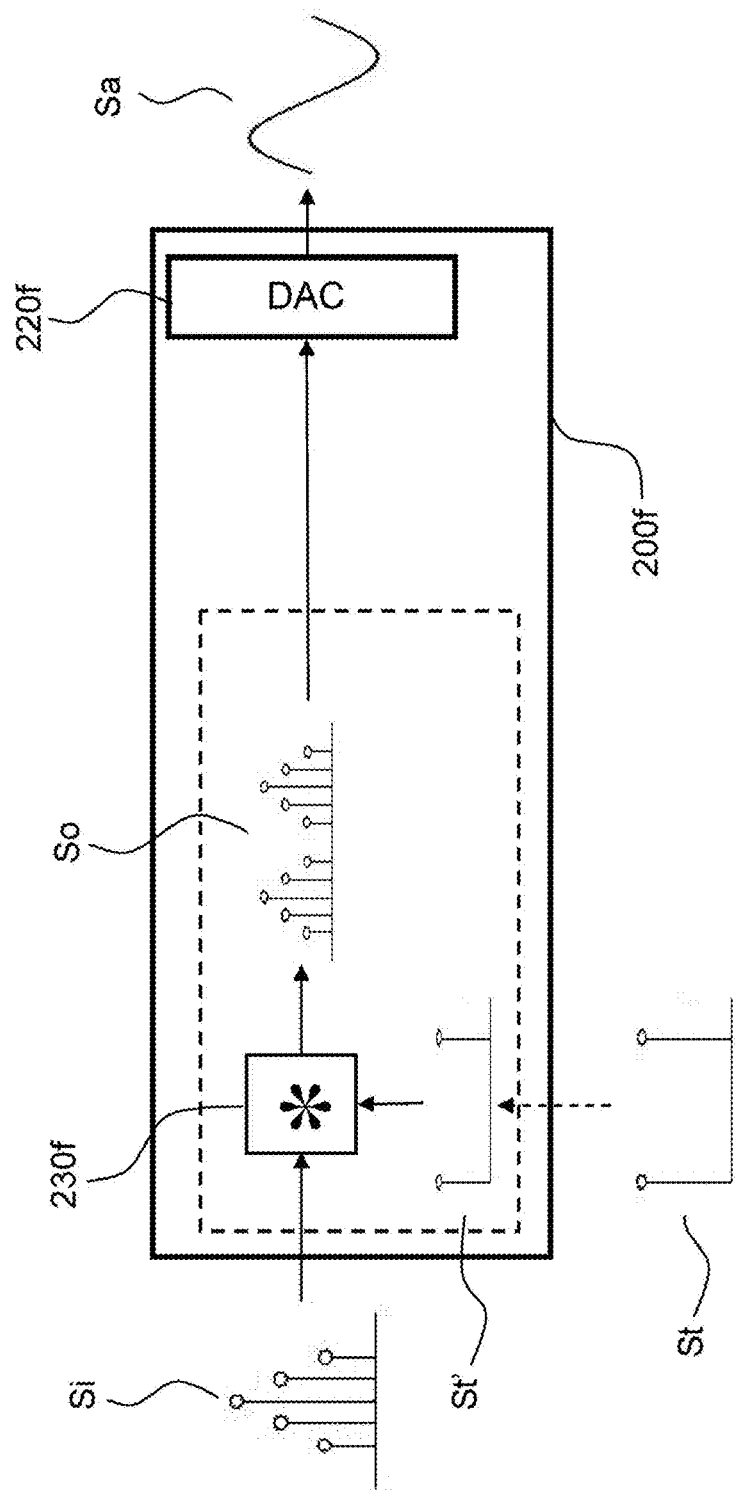

The FIG. 2f displays a sixth example of a device in an embodiment of the invention.

The device 200f receives as input an input digital signal Si, and comprises a digital circuitry 230f to perform a convolution of the input digital signal Si with a second digital signal St' representative of a transform, in order to obtain an output digital signal So, which is supplied to a processing unit 220f, which is a DAC in this example, in order to obtain an analog output signal Sa.

The second digital signal St' is remarkable in that a value of a second sample of the second digital signal being an approximation of a value of a first sample of a first transform digital signal St, said approximation having a second number of significant bits $k_2$ lower than or equal to a first number of significant bits $k_1$ of the value of the first sample. That is to say, the second digital signal is a pre-calculated approximation of a first digital signal representative of the transform. The number of significant bits of the second digital signal St' can thus be defined in order to optimize the perception by users of the quality of the output digital and analog signals. This embodiment is in particular suitable when a pre-defined transform or sample is to be applied to an input signal.

In an aspect of the disclosure, the second number of significant bits $k_2$ is lower than or equal to a number of significant bits allowing the output digital signal to match an expected bit depth of a processing unit 220f said output digital signal. It shall be noted that the invention is not restricted to this example, and, in other embodiments of the invention, the output digital signal is not supplied directly to a processing unit, but further transformed. In an aspect of the disclosure, the second number of significant bits $k_2$ is lower than or equal to a number of significant bits allowing a signal derived from the output digital signal to match an expected bit depth of a processing unit 220f.

In an aspect of the disclosure, the second number of significant bits $k_2$ depends at least on the value of the first sample.

In an aspect of the disclosure, the second number $k_2$ of significant bits is higher than or equal to a minimum number of significant bits $k_{min}$ of the value of the second sample that does not introduce a noticeable alteration in the output digital signal, or a signal derived therefrom.

The FIGS. 2a to 2f demonstrate that the disclosure may be implemented in a number of different manners, and that the number of significant bits of samples of digital signals can be reduced in a number of different ways. As already noted, this allows improving the quality perceived by users when the digital signals are processed by a number of different processing units. The digital signals may be of different types, for example image, audio or video digital signals.

The elements shown in FIGS. 2a to 2f may also be embedded within larger devices that comprise additional elements, such as additional digital circuitries, or filters.

For example, any of the input, output or transform digital signals described here may be received from/supplied to other digital circuitries, filters of processing units, such as for example a FIR filter, an IIR (Infinite Impulse Response) filter, a DSP (Digital Signal Processing) unit, etc. . . . .

In addition, when a plurality of different digital circuitries are displayed in a figure, they may represent either a plurality of physically distinct digital circuitries (for example, a plurality of processors), or a plurality of configuration of one or more digital circuitries (for example, a single processor executing a plurality of different sets of code instructions in order to perform a plurality of functions).

The next sections will first provide examples of rules to reduce the number of significant bits of a digital signal, and then provide concrete examples of application of the disclosure.

Examples of Approximations of Values of Samples

This section will provide non-limitative examples of methods of approximation of values of samples, and definition of number of significant bits that may be used in the invention. Such methods may be executed for example by any of the digital circuitries 210a, 210b, 210c, 210d, 210e, 211e or 212e, or may have been used to obtain the transform digital signal St' of FIG. 2f.

These methods may be used on one or more samples of a digital signal, and for all or a part of a digital signal. As noted above, one of the key points of the invention is to control the number of significant bits $k_2$ of an approximated sample. In the remaining of the description, the terms "allocation" or "allocation of a number of bits", or "allocation of a number of significant bits" will designate the determination of the number of significant bits $k_2$ that will be used for approximating a given sample.

The notations that has been previously defined will be adhered to in the remaining of the description: the second digital sample of the second digital signal will be an approximation of the first digital sample of the first digital signal using a second number of significant bits $k_2$, lower than or equal to the first number of significant bits of the value of the first sample.

It shall be noted that, if a first sample has a first number of significant bits $k_1$, and if the allocation determines that a second sample should be an approximation of the first sample using a number of significant bits $k_2$, which is higher than $k_1$, in practice, the exact value of the first sample having $k_1$ significant bits may be preserved. This is not an issue, since this means that the value of the first sample already has an optimal number of significant bits and can be preserved without losing information.

1. Truncation

An approximation of a first digital signal may be obtained by performing a truncation. This operation consists in removing the least significant bits of each sample of the first digital signal. For example, if the first digital signal has a bit depth of 24 bits, and a second digital signal is a truncation of the first digital signal using a bit depth of 16 bits, the value of each sample of the second digital signal will comprise the 16 most significant bits of the value of the corresponding sample of the first digital signal.

For example, if a sample A is an integer value using two's complement representation and having a bit depth $K > 1$, the value of A is equal to:

$$A = -b(0)2^{K-1} + b(1)2^{K-2} + \ldots + b(K-1)2^0 = \qquad \text{(Equation 20)}$$
$$-b(0)2^{K-1} + \sum_{i=1}^{K-1} b(i)2^{K-(i+1)}$$

Wherein $b(i)$ is the $i^{th}$ most significant bit of the value A.

The value B can be obtained by performing a truncation of A to Q bits, with $1 <= Q < K$. B will be equal to:

$$B = -b(0)2^{K-1} + b(1)2^{K-2} + \ldots + b(Q-1)2^{K-Q} = \qquad \text{(Equation 21)}$$
$$-b(0)2^{K-1} + \sum_{i=1}^{Q-1} b(i)2^{K-(i+1)}$$

Stated otherwise, the truncation on Q bits consists in setting the (K-Q) least significant bits of A to a value which is not significant. In the far most frequent cases (for example unsigned numbers and signed numbers using the two's complement interpretation), the value which is not significant will be a 0. However, in certain cases (for example negative number in the one's complement interpretation), the least significant bits may be set to "1".

Therefore, once the number of significant bits $k_2$ is defined for the second digital signal, the truncation operation is straightforward and is applied on each sample of the digital signal. The values of samples of the first digital signal whose number of significant bits $k_1$ is already equal to or below $k_2$ are preserved.

2. Truncation with Bias

The truncation defined above provides the disadvantage of performing a floor (round down) operation on each sample (for unsigned or two's complement signed representations). It thus introduces a continuous component within the digital signal.

It is possible to overcome this issue, and to obtain a round operation to the nearest integer, by advantageously adding a continuous component equal to half the truncation step to the first digital signal. In the example provided above, of a truncation of the number A on Q bits, it is possible to provide a truncation with bias that does not introduce a continuous component within the digital signal, by first defining an intermediary number A' equal to:

$$A' = A + 2^{K-Q-1} \qquad \text{(Equation 22)}$$

Then performing a truncation of A' using on Q bits, as defined above.

3. Truncation with Dither and/or Bias

However, the truncation with Bias may present the disadvantage that the quantization noise is correlated with the first digital signal. This can be avoided by adding a random noise to the signal A before the truncation. This random noise is called "Dither". Different type of dithering can be used, but it is generally assumed that the theoretically optimal Dither is a Dither having a triangular probability density function (TPDF) and an amplitude of $+/-E$, wherein E is the quantization step introduced by the truncation.

Then, taking again as example the truncation of the number A which has K bits on Q bits, the Truncation with Dither and Bias of the number A consists in first defining a number A":

$$A'' = A' + D = A + 2^{K-Q-1} + D \qquad \text{(Equation 23)}$$

Wherein D is a random signal (that may have ideally a triangular probability density function, and an amplitude span of $+/-E$).

Then performing a truncation of A" on Q bits.

It is also possible to perform a truncation with Dither, but without Bias.

4. Allocations of a Number of Significant Bits Depending at Least on the Value of the First Sample Although the value of a single sample can be truncated, the methods of truncation are usually applied in the same way to each sample of a digital signal. However, it may, in certain cases, be difficult to provide a good compromise between a reduction of the number of significant bits, and a good preservation of the information from a digital signal.

This is for example the case for samples that have a low value, or for parts of a digital signal that have low values. For example, if a 16 bits signal is approximated on 10 bits, information from very low values/low intensity samples, whose information is concentrated on the 6 least significant samples, may be completely lost. In order to overcome this issue, in an aspect of the disclosure, the allocation of the number of significant bits of the second sample may depend at least on the value of the first sample. Thus, the number of significant bits can be tailored to more optimal values that both improve as much as possible the perception by users of the second digital signal, or a signal derived therefrom, and preserve information from the first sample depending at least on its value.

4.1 Level Allocation

In an aspect of the disclosure, the second number of significant bits $k_2$ is defined according to the value the first sample, so that the second number of significant bits varies in a direction opposite to a direction of variation of the absolute value of the first sample. Thus, the lower the value of the first sample, the higher the number of significant bits $k_2$ of the second sample. Conversely, the higher the absolute value of the first sample, the lower the number of significant bits $k_2$ of the second sample.

This allows preserving information from the first digital sample when it has a low value, and reducing the number of significant bits of the second sample as much as possible when the first sample has a high value. Stated otherwise, the number of significant bits $k_2$ is an inverse function of the absolute value of the first sample.

In a number of embodiments of the disclosure, the second number of significant bits $k_2$ is equal to the minimum of a first predefined number $Q_1$ minus a binary logarithm of the absolute value of the first sample, and a second predefined number $Q_2$.

In order to obtain an integer number of bits $k_2$, a rounding operation (for example round to the closer integer, round or floor) may be performed, either on the output of the binary logarithm, or the number $k_2$.

For example, if the first and the second digital signal have a bit depth of 16, $Q_1=26$, and $Q_2=16$, the second number of significant bits $k_2$ will be comprised between 10 and 16, depending upon the absolute value of the first sample rounded up to the next power of 2 noted as v:

if $v_1 = 2^{15}$,
$$k_2 = \min(Q_1 - \log_2(2^{15+1}), Q_2) = \min(26 - 16, 16) = \min(10, 16) = 10;$$
...
if $v_1 = 2^{10}$,
$$k_2 = \min(Q_1 - \log_2(2^{10+1}), Q_2) = \min(26 - 11, 16) = \min(15, 16) = 15;$$
if $v_1 = 2^9$,
$$k_2 = \min(Q_1 - \log_2(2^{9+1}), Q_2) = \min(26 - 10, 16) = \min(16, 16) = 16;$$
if $v_1 = 2^8$,
$$k_2 = \min(Q_1 - \log_2(2^{8+1}), Q_2) = \min(26 - 9, 16) = \min(17, 16) = 16.$$

In the example above, the "+1" within the log is used for signed integers, to take into account the sign bit. The examples above can thus be generalized to values that are not power of twos, and for negative values:
  if v is a signed integer, $k_2=\min(Q_1-\operatorname{ceil}(\log 2(|v|))+1, Q_2)$;
  if v is an unsigned integer, $k_2=\min(Q_1-\operatorname{ceil}(\log_2(v)), Q_2)$;
wherein ceil is the ceiling function that performs a round-up of the result of the logarithm.

Therefore, the second number of significant bits $k_2$ allows preserving an amount of information from the first sample, which is roughly proportional to the amount of information comprised within the first sample, while ensuring that a minimum number of bits is kept whatever the value of the first sample.

This embodiment is very well suited for audio digital signals. Indeed, the amount of information detected by a human ear from an audio signal has a logarithmic shape, and this allocation allows adding a bit of information every slice of 6 dB of attenuation. The user thus perceives the amount of information contained by the audio signal as fairly constant over time and over the whole range of possible sample amplitudes.

It shall also be noted that, when the approximation of samples uses this allocation, the SNR (Signal to Noise Ratio) induced by the approximation is fairly constant over time, which improves the user experience. The harmonic distortion is also fairly constant for the signal.

This allocation also advantageously allows preserving a constant perceived precision on a wide amplitude of the signal.

For at least the reasons above, the human brain will perceive a signal which is approximated using the level allocation as a high quality and the user will perceive a very pleasant signal.

The level allocation can also be defined in the following way:
  the bit depth of the first digital signal is equal to K;
  a third predefined number Q represents the lowest possible value for the second number of significant bits, with Q<K;
  a fourth predefined number D is defined with $1 \leq D \leq K - Q$;
  a fifth predefined number S is defined with $1 \leq S \leq K - Q - D + 1$.

The third predefined number Q, fourth predefined number D, and fifth predefined number S are thus parameters defining a level allocation. Such a level allocation will be referred to as Lev D_L_S on Q bits, or Lev D_L_S on Q bits in K bits. For example, a level allocation with Q=10, D=4 and S=1 will be referred to as an allocation Lev 4_L_1 on 10 bits. In the remaining of the description, some of these parameters can be replaced by a "x" to define a family of level allocation. For example, a level allocation x_L_1, is an allocation with S=1, and different values of D.

The number of significant bits $k_2$ of a second sample is then obtained, from the value x(i) of the first sample, by:
  using a constant $M=2^{K-1}$;
  calculating the absolute value $a(i)=|x(i)|$ of the first sample;
  identifying the highest integer value j (j=0, 1, 2, ..., D) for which:

$$a(i) < M 2^{(j+s-1)} \qquad \text{(Equation 24)}$$

calculating the second number of significant bits $k_2=Q+j$.
The value of the second sample is then obtained for example by performing a truncation of the value of the first sample on $k_2$ bits, with or without bias and/or dither.

4.2 Dyn Delta Allocation

In a number of embodiments of the invention, the second number of significant bits is defined according to a predicted absolute value of the difference between the value of the first digital sample and an approximation of the first digital sample using a third number of significant bits $k_3$, so that the second number of significant bits varies in the same direction than a direction of variation of said absolute value of the difference. This type of allocation will be called "Dyn delta allocation".

For example, a value of a first sample on 16 bits can be first approximated using a third number of significant bits $k_3=10$. In most of the cases (except if the value of the first sample has no information in its least significant bits, this preliminary approximation is different from the value of the first sample. The second number of significant bits, that will be actually used to approximate the first sample is defined according to the absolute value of the difference between the preliminary approximation and the value of the first sample: the higher the absolute value of the difference is (i.e. the more information is lost when a sample is approximated), the higher the number of significant bits $k_2$ will be (i.e. the more information will be preserved).

This allows at the same time a further reduction of the number of significant bits of samples whose value is less impacted by the approximation, and a better preservation of information of samples whose value is more significantly impacted by the approximation, thereby leading to an improved perception of the quality of an output digital signal by users.

Another way of expressing such allocation is that the second number of significant bits $k_2$ is a growing function of the absolute value defined by the least significant bits of the first sample. Indeed, in the example below, the absolute value difference between the value of the first sample, and the approximation using the third number of significant bits $k_3=10$ is equal to absolute value defined by the 16-10=6 least significant bits of the first sample. These bits are lost during the approximation. Thus, in the Dyn delta allocation, the higher this value is, the higher the second number $k_2$ of significant bits is.

4.2.1 Relative Dyn Delta Allocation

In a number of embodiments of the disclosure, the second number of significant bits $k_2$ is defined as a growing function of said predicted absolute value of the difference divided by the absolute value of the first sample.

This allows providing more precision in the approximation, if the relative loss of information of the approximation is high and reducing the number of significant bits of a sample as much as possible if the relative loss of information of the approximation is low.

For example, this allocation, that will be called "Allocation Relative Dyn Delta", can be performed as defined below.

The bit depth of the first digital signal is K. A predefined number Q<K represents the minimum number of significant bits of a sample of the second digital signal. For example, Q=8, and a second predefined number D is chosen, so that 1<=D<=K-Q. For example D=4.

In order to approximate the value x(i) of a first sample, a preliminary approximation q(i) of the value of said first sample on Q bits is calculated, for example by performing a truncation, or a truncation with bias of the value x(i) of the first sample. Then a relative difference v(i) between the first sample and the preliminary approximation is calculated:

v(i)=|(x(i)−q(i))/x(i)| if x(i) is not null v(i)=0 si x(i) is null

The relative difference v(i) is thus the absolute value of the difference between the value of the first sample and its approximation on Q bits, and therefore represents the relative loss of information generated by a truncation using Q bits. The relative difference v(i) is always comprised between 0 and 1.

In this allocation, the number of significant bits $k_2$ is a growing function of the relative difference v(i), that is to say a growing function of the absolute value of the predicted difference (x(i) −q(i)) divided by the value of the first sample. This allows allocating more bits to samples that are more subject to loss of information during the approximation.

In a number of embodiment of the invention, the number of significant bits $k_2$ of the approximation of a first sample is comprised between Q and Q+D, and is defined according to the relative difference v(i) defined above, using the following rule:

if $v(i) < \frac{1}{2^{K-D}}$, $k_2 = Q$;

if $\frac{1}{2^{K-Q}} \leq v(i) < \frac{1}{2^{K-Q-1}}$, $k_2 = Q + 1$;

if $\frac{1}{2^{K-Q-1}} \leq v(i) < \frac{1}{2^{K-Q-2}}$, $k_2 = Q + 2$;

...

if $\frac{1}{2^{K-Q-(D-2)}} \leq v(i) < \frac{1}{2^{K-Q-(D-1)}}$, $k_2 = Q + (D - 1)$;

if $\frac{1}{2^{K-Q-(D-1)}} \leq v(i)$, $k_2 = Q + D$;

For example, with K=16 and D=4, it comes that:

if $v(i) < \frac{1}{256}$, $k_2 = 8$;

if $\frac{1}{256} \leq v(i) < \frac{1}{128}$, $k_2 = 9$;

if $\frac{1}{128} \leq v(i) < \frac{1}{64}$, $k_2 = 10$;

if $\frac{1}{64} \leq v(i) < \frac{1}{32}$, $k_2 = 11$;

if $\frac{1}{32} \leq v(i)$, $k_2 = 12$.

In the remaining of this description, a Relative Dyn delta allocation calculated using the rules above will be designated DynDeltaRel Q_L_D on K bits. For example, the rule above with K=16 and D=4 is an allocation DynDeltaRel 8_L_4 on 16 bits. Here again, some parameters can be replaced by a "x" to define families of allocations.

Therefore, more bits are allocated to samples which are more subject to a relative loss of information during the approximation. The Relative Dyn delta allocation therefore provides a good compromise with a reduction of the number of significant bits, and a preservation of information from the samples of the first digital signal.

These rules of determination of the second number of significant bits $k_2$ are provided by means of non-limitative example only, and a Relative Dyn delta allocation may be defined using any suitable growing function of a predicted difference between the value of the first sample, and a preliminary approximation of said value, divided by said value.

As already noted, once the second number of significant bits $k_2$ is determined, the actual approximation of the first sample can be performed in a number of different ways, for example a truncation, or a truncation with Dither and/or bias of the first sample using $k_2$ bits.

4.2.2 Absolute Dyn Delta Allocation

This allocation is similar to the allocation relative Dyn delta, except that, instead of using a relative difference v(i) to determine the second number of significant bits $k_2$, an absolute difference between the value of the first sample and its approximation is used:

$$w(i) = \frac{|x(i) - q(i)|}{2^{K-Q}} \qquad \text{(Equation 25)}$$

Thus, the value w(i) is comprised between 0 and 1, but depends only on the predicted difference between the value x(i) of the first sample, and the approximation q(i) of the first sample using Q bits.

In a number of embodiment of the disclosure, the number of significant bits $k_2$ of the approximation of a first sample is comprised between Q and Q+D, and is defined according to the absolute difference v(i) defined above using the following rule:

if $w(i) < \frac{1}{2^{K-D}}, k_2 = Q;$ if $\frac{1}{2^{K-Q}} \leq w(i) < \frac{1}{2^{K-Q-1}}, k_2 = Q + 1;$ if $\frac{1}{2^{K-Q-1}} \leq w(i) < \frac{1}{2^{K-Q-2}}, k_2 = Q + 2;$

...

if $\frac{1}{2^{K-Q-(D-2)}} \leq w(i) < \frac{1}{2^{K-Q-(D-1)}}, k_2 = Q + (D-1);$ if $\frac{1}{2^{K-Q-(D-1)}} \leq w(i), k_2 = Q + D;$ Such an approximation will be referred hereinafter as an allocation DynDeltaAbs Q_L_D on K bits. For example, if Q=8, D=4 and K=16 bits, the allocation is a DynDeltaAbs 8_L_4.

This example is provided by means of example only of an allocation that depends upon a predicted difference between the value of the first sample, and a preliminary approximation thereof. In a number of embodiments of the invention, other rules of determination of the second number of significant bits $k_2$ as a growing function of a difference of the value of the first sample and a preliminary approximation, for example as a growing function of w(i).

4.3 Frequency Allocation

In a number of embodiments of the disclosure, the second number of significant bits $k_2$ depends upon values of coefficients obtained by a frequency domain transform (such as the Fourier Transform) of a time window of samples of the first digital signals comprising the first sample.

This type of allocation of the number of significant bits will be referred to as a "Frequency allocation". It allows a determination of the number of significant bits $k_2$ for all samples within a time window, depending upon the values of frequency coefficients. For example, if the first digital signal is an audio signal, the number of significant bits $k_2$ may be higher if the time window comprises most of its energy in a frequency band that the ear is very sensitive to (for example between 300 Hz and 5 kHz). Therefore, the number of significant bits of the samples of the second digital signal is generally decreased, but more bits of information will be preserved for time windows that the ear is very sensitive to.

The time windows may be of different sizes, for example 256, 512 or 1024 samples, and the frequency domain transforms that are used to obtain frequency coefficients of different types (for example, a Fourier Transform, DCT (Discrete Cosine Transform), MDCT (Modified Discrete Cosine Transform), etc. . . . . . The time windows may be either overlapping or not overlapping.

4.4 Slope Allocation

In a number of embodiments of the invention, the second number of significant bits $k_2$ is defined according to a value representative of a derivative of the first digital signal at the first sample.

For example, the second number of significant bits $k_2$ may be a decreasing function of the value representative of the derivative of the first digital signal at the first sample: the higher the derivative's absolute value is, the lower the second number of significant bits $k_2$ can be. The derivative may be a first, second, third derivative, etc. . . . or a combination thereof. The second number of significant bits $k_2$ may be a decreasing function of the absolute value of the derivative should be taken into account, in order to ensure that a higher number of bits is used for low variation, whatever their sign.

Thus, the number of significant bits $k_2$ will be higher for samples wherein a low variation of the first digital signal is observed, and lower for samples wherein a high variation of the first digital signal is observed. Thus, the number of significant bits can be reduced while preserving information from samples of low variation. This allocation is for example well suited for audio digital signals, for which low variations may be critical.

For example, high values of a digital signal associated with low variations can be representative of a signal of high amplitude and low frequency or associated to a signal of low amplitude and high frequency. The slope allocation allows an important reduction of the number of significant bits, which however preserves the information from the signal of low amplitude and high frequency. If the digital signal is an audio digital signal, this allows preserving meaningful details from the audio signal.

This kind of allocation of the second number of significant bit will be referred to as a "slope allocation".

A practical way of obtaining this allocation is explained below.

The values of the $n^{th}$ sample of the first digital signal is noted x(n).

Then the absolute difference |d(n)| between two successive samples is calculated:

$$|d(n)|=|x(n)-x(n-1)|.$$ (Equation 26)

Then the second number of significant bits is calculated as a function of |d(n)|.

Different rules of determination of the second number of significant bits $k_2$ according to |d(n)| may be used in a number of embodiments of the invention. For example, a level allocation can be performed on the absolute difference |d(n)|: the higher the absolute difference is, the lower the second number of significant bits $k_2$ to approximate the first sample.

A dyn delta allocation may also be used, in order to avoid an important distortion of the derivative of the first digital signal.

Conversely, it is possible to allocate a higher number of significant bits $k_2$, for samples for which the absolute difference |d(n)| is high. An allocation that allocates more bits when a value representative of a derivative of the first digital signal is high will be referred to as a "SlopeHigh" allocation, while an allocation that allocates more bits when a value representative of a derivative of the first digital signal is low will be referred to as a "SlopeLow" allocation.

An allocation SlopeHigh would preserve more information from high frequency components of a signal, while an allocation SlopeLow would preserve more information from low frequency components of a signal. SlopeHigh or SlopeLow allocations may thus be advantageously used depending on target applications, and/or on the components of a signal that shall be preserved in priority. For example, in a two ways active loudspeaker wherein the filter to split the ways is a digital filter, a SlopeLow allocation may be used in the "low-pass" branch, while a SlopeHigh allocation may be used in the "high-pass" branch.

Although the example above provides an example of allocation using a first-order derivative of the digital signal (represented by the absolute value of the difference between two successive samples). For example, the absolute value of a second order derivative may be used:

$$|d'(n)|=|x(n+1)-2*x(n)+x(n-1)| \quad \text{(Equation 27)}$$

It is also possible to allocate the second number of significant bits based on the relative derivative, by replacing $|d(n)|$ by a division of the difference by the value of the first sample:

$$d''(n) = \left| \frac{x(n) - x(n-1)}{x(n|} \right| \quad \text{(Equation 28)}$$

or by a combination of the difference and the value of the first sample itself:

$$d'''(n)=(|x(n)|+|d(n)|) \quad \text{(Equation 29)}$$

These allocations are provided by means of example only, and the second number of significant bits $k_2$ using any suitable value representative of a derivative of the first digital signal.

4.5 Suitable Values Allocation

Each of the allocations described above provides a powerful tool for performing an approximation of values of samples of a first digital signal, according to different objectives. However, they do not allow a complete tailoring of the allocation of the number of significant bits.

In order to overcome this issue when appropriate, the value of the second sample is selected as a suitable value which is the closest to the value of the first sample in an ordered set of suitable values, and wherein the number of significant bits of each suitable value in the ordered set of suitable values is lower than the number of significant bits of any value in an open interval between said suitable value in the ordered set and an neighbor suitable value in said set. The ordered set of values may be completely tailored, for example depending to a desired precision. It can be tailored for different intervals. For example, in an interval wherein a plurality of values that require a low number of bits are already present, a value that requires a high or average number of bits can be removed.

That is to say, each value of a first sample is approximated by selecting a neighbor value in a set of suitable values that has a lower number of significant bits.

By means of example, if the first digital signal is formed of 8-bits unsigned integer values, the values in the interval [4; 8], are, in a binary notation:

4: 0000 0100 (6 significant bits);
5: 0000 0101 (8 significant bits);
6: 0000 0110 (7 significant bits);
7: 0000 0111 (8 significant bits);
8: 0000 1000 (5 significant bits).

In a first embodiment of the invention, the values 4 and 8 only belong to the set of suitable values: each value in the interval]4; 8[is thus approximated to the closest value, 4 or 8. In another embodiment of the invention, the value 6 also belongs to the set of suitable values. Therefore, this allows approximating the values of the samples of the first digital signal as nearby values that have a lowest number of significant bits, while allowing a complete freedom in the selection of the suitable values.

In order for such set of suitable values, to always allow a reduction of the number of significant bits, the number of significant bits of each suitable value in the ordered set of suitable values has to be lower than the number of significant bits of any value in an open interval between said suitable value in the ordered set and an neighbor suitable value in said set. Thus, when a value which, not being a suitable value, is approximated as a neighbor value in the ordered set, the number of significant bits of the approximated value will always be reduced.

The ordered set can be obtained for example by first calculating a set of the values that are allowable using one of the previously defined allocation (i.e. any of the allocations previously defined allows a limited set of values), then adding values to or removing values from the set.

4.6 Combined Allocation

A plurality of allocation means of the second number of significant bits have already been presented. Each of the allocations presented, or other allocations that may be envisioned by a skilled man, has its own advantages. However, it may be desirable to combine the advantages of each allocation.

In order to do so, the allocations may be combined. According to various embodiments of the inventions, the allocations can be combined in different ways.

For example, an intermediary value can be obtained by approximating the value of a first sample of the first digital signal using a first allocation on an intermediary number of significant bits $k_1$, then this intermediary value can be approximated using a second allocation. For example, the first sample may be first truncated, then the truncated value may be approximated using a level allocation.

Thus, a plurality of allocations and their advantages are combined. It is also possible to combine, as a series, more than two allocations.

Another option for combining the allocations is to obtain two or more candidate number of significant bits using two or more different allocations, then selecting the most appropriate number of significant bits. For example, the higher number of significant bits among the candidates may be selected, in order to ensure that no significant degradation or loss of information is generated.

For example, in order to determine a second number of significant bits $k_2$ of a sample of a second digital signal depending upon the value of a sample of the first digital signal $x(i)$, two candidates number of significant bits can be obtained, respectively using a level allocation, and a SlopeHigh allocation, then the higher of the two values may be selected. This ensures that the approximation of the samples of the first digital signal preserves information from the first digital signal according to the minimum required number of significant bits criteria defined by the two allocations.

Conversely, it is possible to select the lower candidate number of significant bits, so that the highest possible number of significant bits, that however matches the criteria of at least one allocation, is selected.

According to various embodiments of the invention, more than two candidate numbers of bits may be obtained using more than two allocations. A person skilled in the art may thus, without effort, combine the best suited allocations in order to ensure that the approximation of the first digital signal does not introduce a noticeable alteration of the signals.

An allocation may also be determined on a time window, depending on a plurality of candidate allocations on each sample. For example, a second number of significant bits $k_2$ may be calculated for each sample in the time windows using any of the allocations described above, and a single second number of significant bits $k_2$ selected to be applied for the approximation of all samples within the time window. For example, the minimum or maximum candidate may be used, or the mean of the candidates. This allows both taking into account the characteristics of a time window and provide a consistent approximation within a time window.

EXAMPLES OF APPLICATION

The following sections will present a number of applications of the disclosure. These are provided by means of example only, and the disclosure can be applied to a number of other fields such as digital signal, image, audio or video processing or the like.

Figure 3B:
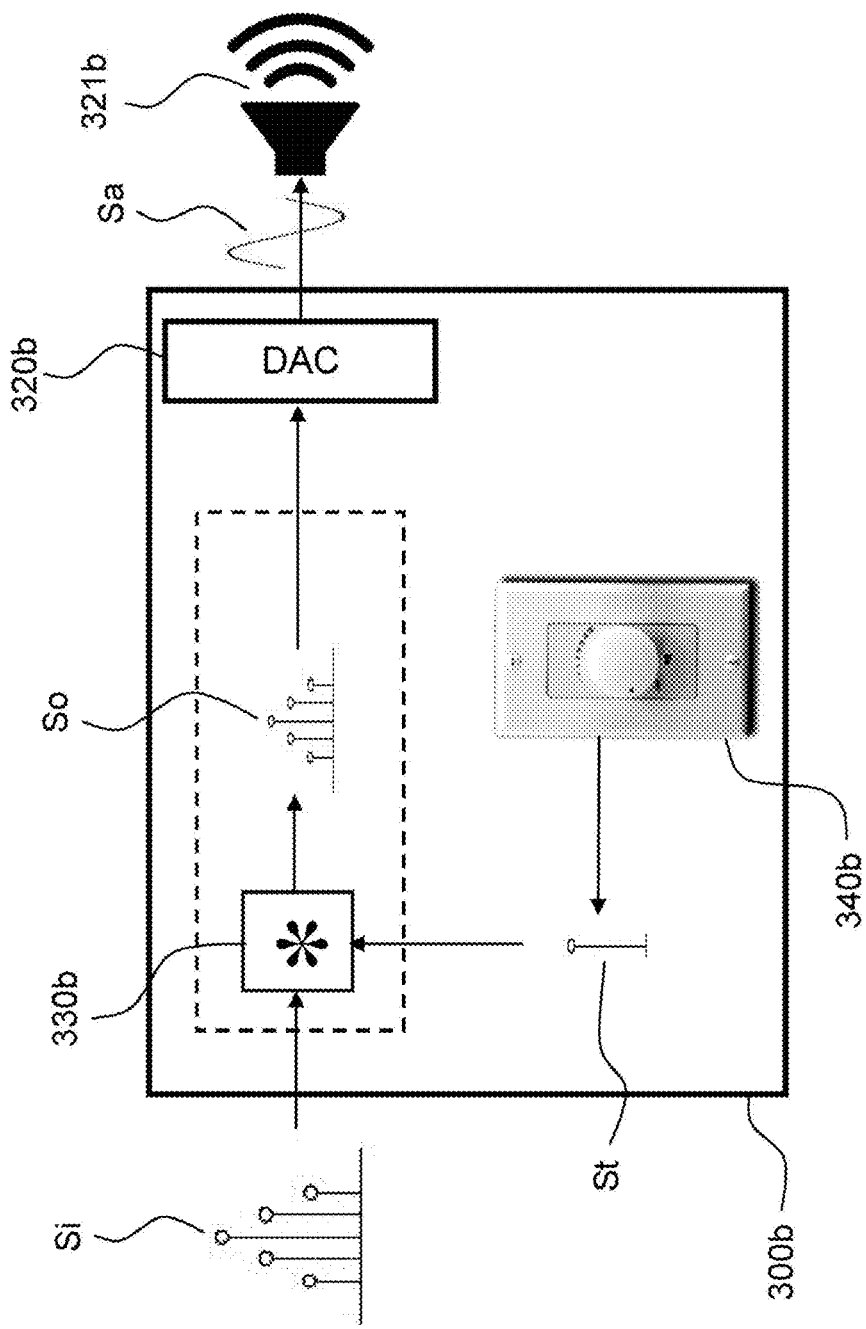
Figure 3C:
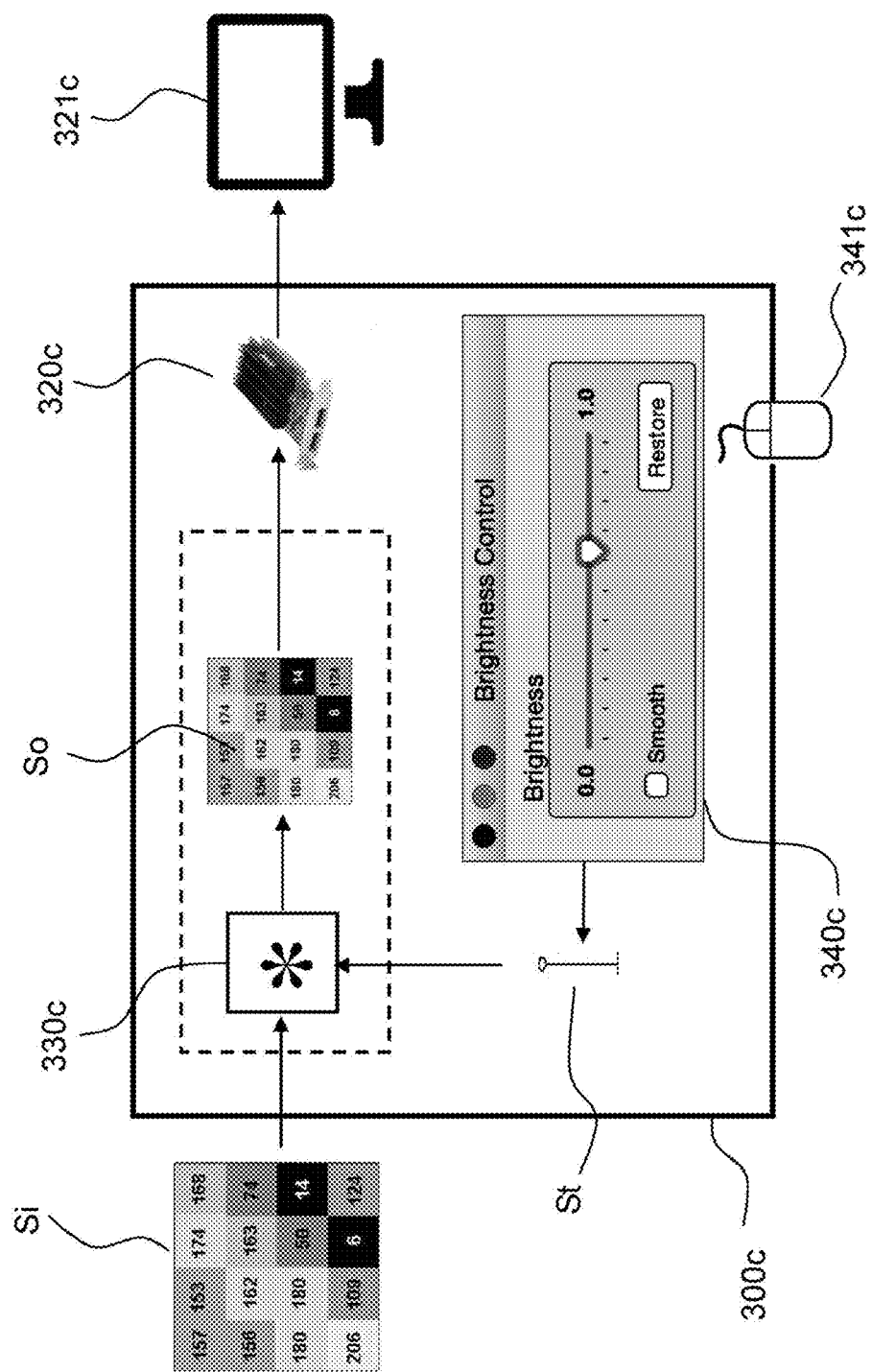

FIGS. 3a, 3b and 3c display examples of a device to set the volume of a digital signal in a number of embodiments of the invention.

FIG. 3a displays a first example of a device to set the volume of a digital audio signal in a number of embodiments of the invention.

The device 300a is configured to change the volume of an input digital audio signal Si, and send the resulting signal to loudspeakers 321a in order to play it. The device 300a may be any device that is able to change the volume of a digital audio signal, and send it to loudspeakers. For example, the device 300a may be a smartphone, a tablet, a MP3 player, a computer, etc. . . . . . An end-user or many people may be present in the neighborhood or remotely.

To this effect, the device 300a comprises an input unit 340a to let the user set the volume. Although the input unit 340a is represented by a rotative button in the FIG. 340a, it may take any suitable form, such as a pair of buttons to increase/decrease the volume, a bar on a tactile screen wherein the user can select the desired volume, or an input port to receive a volume level from an external device such as a remote control.

A transform signal St is defined according to the volume set. The transform signal St comprises a single sample, that is representative of the change of volume to apply.

The change of volume may be either an attenuation or an increase of the volume of the input digital audio signal.

The device 300a further comprise a digital circuitry 330a to perform a convolution of the input digital audio signal Si and the transform signal St, in order to obtain a first output signal So, which corresponds to the input signal Si to which the volume change set by the user is applied.

The first output digital audio signal So usually has a bit depth higher than the bit depth of the input digital signal Si. For example, if the input digital signal Si has a bit depth of 16, and the transform signal St a bit depth of 8 (therefore allowing up to $2^8=256$ levels of volume, the output digital signal will have a bit depth of 24.

The device 300a further comprises a DAC 320a used to convert an output signal into an analog signal Sa to be sent to the loudspeakers 321a. In order to improve the perception of the quality of the audio signal by the user, the device 300a also comprises a digital circuitry 310a, which is similar to the digital circuitry 210c of FIG. 2c: the digital circuitry 210c approximates the first output signal So into a second output signal So' which is supplied to the DAC 320a. More specifically, the digital circuitry 310a is configured to calculate the value of a second sample of the second digital signal So' as an approximation of a first sample of the first digital signal using a second bit depth $k_2$ which is lower than the first bit depth $k_1$ of the value of the first sample.

All the non-mutually exclusive embodiments discussed above may of course be applied to the digital circuitry 320a.

In an aspect of the invention, the second number of significant bits $k_2$ is lower than or equal to the expected bit depth of the DAC 320a. For example, if the first sample has a number of significant bits equal to 24, and the DAC 320a expects 24 bits as input, the digital circuitry 310a can be configured to approximate the first sample using less than 24 bits.

In an aspect of the disclosure, the second number of significant bits $k_2$ depends at least on the value of the first sample. For example, any of the allocation discussed above can be applied by the digital circuitry 310a.

The device 300a thus improves the perception by the user of the quality of the output audio signal.

In a number of embodiments of the disclosure, the approximation performed by the digital circuitry 320a is dependent upon the coefficient of amplitude change that is applied. For example, as will be explained in more details with reference to the FIG. 2b, due to the attenuation of the signal by a convolution with the signal St, the number of significant bits of the samples of the first output digital signal So is higher than the number of significant bits of the corresponding samples of the input digital signal Si, but the coefficients of amplitude change can be selected in order to control the extra number of significant bits required at the output of the amplitude change.

For example, as will be explained in more details with reference to the FIG. 3b, the values of amplitude change may be obtained by a level allocation 4_L_1 in 8 bits. In an embodiment of the invention, the digital circuitry 310a is configured to approximate the samples of the first output digital signal So according to the number of significant bits of the sample of the transform signal St:
  if the number of significant bits of the sample of the transform signal St is 1, the digital circuitry 310a approximates the samples of the first output digital signal So using a allocation level 1_L_1 on 15 bits in 16 bits: the number of significant bits of the samples of the output digital signal may be reduced by up to 1 bit in the first slice of 6 dB of the output digital signal;
  if the number of significant bits of the sample of the transform signal St is 2, the digital circuitry 310a approximates the samples of the first output digital signal So using a allocation level 2_L_1 on 14 bits in 16 bits: the number of significant bits of the samples of the output digital signal may be reduced by up to 2 bits in the first two slices of 6 dB of the output digital signal;
  if the number of significant bits of the sample of the transform signal St is 6, the digital circuitry 310a approximates the samples of the first output digital signal So using a allocation level 6_L_1 on 10 bits in 16 bits: the number of significant bits of the samples of the output digital signal may be reduced by up to 6 bits in the first six slices of 6 dB of the output digital signal;
In this example, the number of significant bits of the samples of the output digital signal is not reduced below 10 bits, in order to avoid an alteration of the output digital signal.

The device 300a is provided by means of example only, and some elements may be placed differently. For example, although the DAC 320a is represented within the device 300a, it may be an external DAC in connection with the device 300a, and the output digital signal So' may be sent to the DAC through the connection. On the contrary, the loudspeakers 321a, which are represented outside the device 300a in FIG. 3a, may be internal or integrated loudspeakers. They may also be associated via a contactless network (e.g Bluetooth™, Zigbee™, Wi-Fi™ or the like); Loudspeakers can also be headsets, earphones, or the like.

In a number of embodiments of the invention, the second output digital signal is not sent to a DAC and loudspeakers to be listened to, but sent to a further device, or processed, for example compressed.

The volume control of FIG. 1 can also be applied to digital audio signals that are not PCM signals. For example, it can be applied to DSD (Direct Stream Digital) signals: the DSD signals can be demodulated, then the volume control applied, then the output signal re-modulated into an output DSD signal.

The FIG. 3b displays a first example of a device to set the volume of a digital audio signal in a number of embodiments of the invention.

The device 300b is similar in many ways to the device 300a. Indeed, the device 300b also receives an input digital signal Si, comprises an input unit 340b to set a volume change, a transform signal St comprising a single sample representing the volume change is determined accordingly, the device 300b comprises a digital circuitry 330b to perform a convolution of the input digital signal Si with the transform signal St in order to obtain an output digital signal So, which is supplied to a DAC 320b in order to be converted into an analog signal Sa played by loudspeakers 321b. All the embodiments discussed with reference to the device 300a are respectively applicable to the device 300b.

However, the device 300b is remarkable in that, instead of performing an approximation of the output digital signal, the transform signal St is approximated, in order that the number of significant bits of the single sample is reduced. Therefore, when the input digital signal Si and the transform signal St are convolved, the number of significant bits of the output digital signal So is reduced compared to the direct application of St.

In a number of embodiments of the disclosure, the input unit provides values of change of amplitude that require a relatively low number of significant bits to be expressed. For example, an amplitude change around −9 dB can be obtained by an amplitude change of −9.28 dB, that corresponds to a multiplication of the input digital audio signal by $11/2^5$. Thus, each sample of the output digital signal will have 5 significant bits in addition of the number of significant bits of the corresponding sample of the input digital signal. This is a relatively low number of extra bits: by means of example, a more exact approximation of the amplitude change −9 dB would be an attenuation of −8.98 dB corresponding to a multiplication by $91/2^8$ that requires 8 extra bits. Therefore, the invention allows a selection of coefficients of amplitude change that require a lower number of extra bits, thereby improving the user perception of the quality of the output signal.

The set of suitable coefficients of amplitude change may be dependent upon the required precision of amplitude change. The European application n° 17306401.5 filed by the same applicant, and incorporated herein by reference, provides an extended number of examples of selection of the suitable coefficients of amplitude change. By means of example, suitable values of amplitude change can be defined as explained below.

A set of suitable values such as the set displayed in table 1 next page can be defined by setting the suitable values as defined below:

two raised to the power of the number of bits of precision values, respectively equal to a first integer value from 1 to two (2) raised to the power of the number of bits of precision divided by two (2) raised to the power of the maximum number of bits. In this example, this corresponds to the 16 ($2^4$) values on the bottom of the table, which correspond to suitable values from $$\frac{1}{2^8} \text{ to } \frac{16}{2^8}$$

(that is to say a first integer value from 1 to $2^4$, divided by $2^8$, 8 being the maximum number of bits here);

for each range in a plurality of ranges defined by a second integer value comprised between a binary logarithm of said maximum suitable value and the maximum number of bits minus one:

two raised to the power of the number of bits of precision minus one values, respectively equal to:
a first integer value from one plus two raised to the power of the number of bits of precision minus one to two raised to the power of the number of bits of precision divided by
two raised to the power of the second integer value.

In this example, a maximum suitable value is set to 4. Therefore, it can be obtained using a second integer value equal to log 2(4)+1=2+1=3. Thus, for each second integer value n from 2 to 7 (8−1), 8 ($2^{4-1}$) suitable values are defined, respectively equal to a first integer value comprised between $2^{4-1}+1=9$ to $2^4$ 16, said first integer value being divided by $2^n$, that is to say values from $$\frac{9}{2^n} \text{ to } \frac{16}{2^n},$$

for $n_0$?, . . . , 7. Thus each second integer value n defines a range of value, and the set of suitable values thereby obtained can be expressed in the table below:

TABLE 1

Set of suitable values up to 4 with 3 bits of precision, and a maximum number of bits of 8

| Range | First int value | Second int value | Fraction 1 | Fraction 2 | decimal | Decibels |
|---|---|---|---|---|---|---|
| 6/12 dB | 16 | 2 | $16/2^2$ | $1/2^{-2}$ | 4.0000 | 12.04 |
|  | 15 | 2 | $15/2^2$ | $15/2^2$ | 3.7500 | 11.48 |
|  | 14 | 2 | $14/2^2$ | $7/2^1$ | 3.5000 | 10.88 |
|  | 13 | 2 | $13/2^2$ | $13/2^2$ | 3.2500 | 10.24 |
|  | 12 | 2 | $12/2^2$ | $3/2^0$ | 3.0000 | 9.54 |
|  | 11 | 2 | $11/2^2$ | $11/2^2$ | 2.7500 | 8.79 |
|  | 10 | 2 | $10/2^2$ | $5/2^1$ | 2.5000 | 7.96 |
|  | 9 | 2 | $9/2^2$ | $9/2^2$ | 2.2500 | 7.04 |
| 0/6 dB | 16 | 3 | $16/2^3$ | $1/2^{-1}$ | 2.0000 | 6.02 |
|  | 15 | 3 | $15/2^3$ | $15/2^3$ | 1.8750 | 5.46 |
|  | 14 | 3 | $14/2^3$ | $7/2^2$ | 1.7500 | 4.86 |
|  | 13 | 3 | $13/2^3$ | $13/2^3$ | 1.6250 | 4.22 |

TABLE 1-continued

Set of suitable values up to 4 with 3 bits of precision, and a maximum number of bits of 8

| Range | First int value | Second int value | Suitable values Fraction 1 | Fraction 2 | decimal | Decibels |
|---|---|---|---|---|---|---|
|  | 12 | 3 | $12/2^3$ | $3/2^1$ | 1.5000 | 3.52 |
|  | 11 | 3 | $11/2^3$ | $11/2^3$ | 1.3750 | 2.77 |
|  | 10 | 3 | $10/2^3$ | $5/2^2$ | 1.2500 | 1.94 |
|  | 9 | 3 | $9/2^3$ | $9/2^3$ | 1.1250 | 1.02 |
| −6/0 dB | 16 | 4 | $16/2^4$ | $1/2^0$ | 1.0000 | 0.00 |
|  | 15 | 4 | $15/2^4$ | $15/2^4$ | 0.9375 | −0.56 |
|  | 14 | 4 | $14/2^4$ | $7/2^3$ | 0.8750 | −1.16 |
|  | 13 | 4 | $13/2^4$ | $13/2^4$ | 0.8125 | −1.80 |
|  | 12 | 4 | $12/2^4$ | $3/2^2$ | 0.7500 | −2.50 |
|  | 11 | 4 | $11/2^4$ | $11/2^4$ | 0.6875 | −3.25 |
|  | 10 | 4 | $10/2^4$ | $5/2^3$ | 0.6250 | −4.08 |
|  | 9 | 4 | $9/2^4$ | $9/2^4$ | 0.5625 | −5.00 |
| −12/−6 dB | 16 | 5 | $16/2^5$ | $1/2^1$ | 0.5000 | −6.02 |
|  | 15 | 5 | $15/2^5$ | $15/2^5$ | 0.4688 | −6.58 |
|  | 14 | 5 | $14/2^5$ | $7/2^4$ | 0.4375 | −7.18 |
|  | 13 | 5 | $13/2^5$ | $13/2^5$ | 0.4063 | −7.82 |
|  | 12 | 5 | $12/2^5$ | $3/2^3$ | 0.3750 | −8.52 |
|  | 11 | 5 | $11/2^5$ | $11/2^5$ | 0.3438 | −9.28 |
|  | 10 | 5 | $10/2^5$ | $5/2^4$ | 0.3125 | −10.10 |
|  | 9 | 5 | $9/2^5$ | $9/2^5$ | 0.2813 | −11.02 |
| −18/−12 dB | 16 | 6 | $16/2^6$ | $1/2^2$ | 0.2500 | −12.04 |
|  | 15 | 6 | $15/2^6$ | $15/2^6$ | 0.2344 | −12.60 |
|  | 14 | 6 | $14/2^6$ | $7/2^5$ | 0.2188 | −13.20 |
|  | 13 | 6 | $13/2^6$ | $13/2^6$ | 0.2031 | −13.84 |
|  | 12 | 6 | $12/2^6$ | $3/2^4$ | 0.1875 | −14.54 |
|  | 11 | 6 | $11/2^6$ | $11/2^6$ | 0.1719 | −15.30 |
|  | 10 | 6 | $10/2^6$ | $5/2^5$ | 0.1563 | −16.12 |
|  | 9 | 6 | $9/2^6$ | $9/2^6$ | 0.1406 | −17.04 |
| −24/−18 dB | 16 | 7 | $16/2^7$ | $1/2^3$ | 0.1250 | −18.06 |
|  | 15 | 7 | $15/2^7$ | $15/2^7$ | 0.1172 | −18.62 |
|  | 14 | 7 | $14/2^7$ | $7/2^6$ | 0.1094 | −19.22 |
|  | 13 | 7 | $13/2^7$ | $13/2^7$ | 0.1016 | −19.87 |
|  | 12 | 7 | $12/2^7$ | $3/2^5$ | 0.0938 | −20.56 |
|  | 11 | 7 | $11/2^7$ | $11/2^7$ | 0.0859 | −21.32 |
|  | 10 | 7 | $10/2^7$ | $5/2^6$ | 0.0781 | −22.14 |
|  | 9 | 7 | $9/2^7$ | $9/2^7$ | 0.0703 | −23.06 |
| −30/−24 dB | 16 | 8 | $16/2^8$ | $1/2^4$ | 0.0625 | −24.08 |
|  | 15 | 8 | $15/2^8$ | $15/2^8$ | 0.0586 | −24.64 |
|  | 14 | 8 | $14/2^8$ | $7/2^7$ | 0.0547 | −25.24 |
|  | 13 | 8 | $13/2^8$ | $13/2^8$ | 0.0508 | −25.89 |
|  | 12 | 8 | $12/2^8$ | $3/2^6$ | 0.0469 | −26.58 |
|  | 11 | 8 | $11/2^8$ | $11/2^8$ | 0.0430 | −27.34 |
|  | 10 | 8 | $10/2^8$ | $5/2^7$ | 0.0391 | −28.16 |
|  | 9 | 8 | $9/2^8$ | $9/2^8$ | 0.0352 | −29.08 |
| −36/−30 dB | 8 | 8 | $8/2^8$ | $1/2^5$ | 0.0313 | −30.10 |
|  | 7 | 8 | $7/2^8$ | $7/2^8$ | 0.0273 | −31.26 |
|  | 6 | 8 | $6/2^8$ | $3/2^7$ | 0.0234 | −32.60 |
|  | 5 | 8 | $5/2^8$ | $5/2^8$ | 0.0195 | −34.19 |
| −42/−36 dB | 4 | 8 | $4/2^8$ | $1/2^6$ | 0.0156 | −36.12 |
|  | 3 | 8 | $3/2^8$ | $3/2^8$ | 0.0117 | −38.62 |
| −48/−42 dB | 2 | 8 | $2/2^8$ | $1/2^7$ | 0.0078 | −42.14 |
| −54/−48 dB | 1 | 8 | $1/2^8$ | $1/2^8$ | 0.0039 | −48.16 |

As displayed in the table above, the set of suitable values defines a full range of suitable values. Each line represents a suitable value, and the columns have the meaning below:

Range: defines range of suitable values. A range is defined for each second integer value, and corresponds to a range of change of amplitude of 6 dB, when the values are expressed in decibels;

First integer value: the first integer value k that defines the suitable value;

Second integer value: the second integer value (n) that defines the suitable value;

Suitable values: the 4 columns express each suitable value in 4 different ways:

Fraction 1: represents the suitable value, as a division of the first integer (k) by two raised to the power of the second integer (n);

Fraction 2: represents a simplification of fraction 1, when possible as a fraction of an odd integer number by two raised to the power of an integer number as low as possible. Interestingly, this representation provides a direct indication of the number of additional bits required by the suitable coefficient. When the exponent is a negative one, the suitable coefficient even require less significant bits than the approximated coefficient. However, this corresponds to an amplification of the first signal, and the first digital signal should, in this case, be low enough not to be saturated. Otherwise, the bit depth of the second digital signal should be expanded;

Decimal value: represents each suitable coefficient as a decimal value;

Decibel: represents each suitable coefficient in decibels.

More generally, a set of suitable values of amplitude change can be obtained by the allocations defined in the previous section. For example, a level allocation can be used. The level allocation advantageously provides a constant precision per slice of 6 dB of attenuation. For example, the table 1 above is obtained by a level allocation 4_L_1 on 8 bits, wherein:

in a first slice of attenuation [0 dB; −6 dB[, the attenuation coefficients require at most 4 significant bits (see the values of coefficients in table 1 above, slice 0/6 dB;

in a second slice of attenuation [−6 dB; −12 dB[, the attenuation coefficients require at most 5 significant bits (see the values of coefficients in table 1 above, slice −6/−12 dB;

. . .

in a fifth slice of attenuation [−24 dB; −30 dB[, the attenuation coefficients require at most 8 significant bits (see the values of coefficients in table 1 above, slice −24/−30 dB.

In each of these slices, 8 coefficients of attenuation provide a fine granularity of attenuation. In the sixth slice [−30 dB; −36 dB [, seventh slice [−36 dB; −42 dB [, eight slice [−42 dB; −48 dB [, and ninth slice [−48 dB; −54 dB[, fewer coefficients are found, because setting more coefficients in those slice would require using more than 8 significant bits.

These values thus allow an attenuation of the volume of the input digital signal with a step of 0.75 dB until an attenuation of −30 dB is reached, while using 8 significant bits at most. The coefficients of attenuation can thus be coded on 8 bits, and, upon a convolution with a 16 bits digital audio signal, the output digital signal So will have 24 bits, which is the input bit depth of many DACs.

The possible values of the attenuation may also be defined according to Suitable values allocation. For example, in the table 1, in each slice the value in the form $15/2^k$, and the value in the form $13/2^k$, which are among the values that require the highest number of significant bits in each slice, can be removed. Thus, the average step between two possible coefficients of attenuation of the input digital signal becomes 1.34 dB, and, in each slice, the suitable values require in average a fewer number of significant bits.

In another example, a level allocation 5_L_1 on 3 bits can be used, and 4 suitable values kept in each slice of 6 dB, or a level allocation 3_L_1 on 5 bits can be used, and 16 values kept in each slice of 6 bits. It is also possible to obtain values representative of a greater volume attenuation by using values with a number of significant bits higher than 8, but keep, in each slice of 6 dB of attenuation coefficients, the values that require the lowest number of significant bits.

The FIG. 3c displays an example of a device to set the brightness of a digital image signal in a number of embodiments of the invention.

The device 300c is similar in many ways to the device 300b. Indeed, the device 300c also receives an input digital signal Si (which is in this example an image signal, for example represented by a matrix of RGB, Grayscale or CMYK pixels), comprises an input unit 340c to set a brightness level (in this example, a bar to set a brightness level displayed on the screen; the user sets the brightness by clicking on the right place of the bar using a mouse 341c), a transform signal St comprising a single sample representing the brightness change is determined accordingly, the device 300c comprises a digital circuitry 330c to perform a convolution of the input digital signal Si with the transform signal St in order to obtain an output digital signal So (in this example, an image signal whose brightness has been changed), which is supplied to a video card 320c, in order to be displayed by a screen 321c.

Similarly to the device 300b, the device 300c is advantageously remarkable in that, the transform signal St is approximated, in order that the number of significant bits of the single sample is reduced. Therefore, when the input digital signal Si and the transform signal St are convolved, the number of significant bits of the output digital signal So is reduced compared to the direct application of St. Any of the embodiments discussed above for reducing the number of significant bits of the single sample of St can be used. A level allocation, or the use of suitable values are for example well suited here.

This is advantageously very beneficial for image quality. In particular, this limits the number of significant bits of the output signal So, while preserving information from the input signal Si. Therefore, this avoid losing information is all information from the signal So is not properly managed by the video card 320c. For example, this allows avoiding erasing information, especially from low luminosity pixel (dark areas of the image), which are very sensitive to loss of information.

The device 3c thus allows a better rendering of images whose luminosity is modified. This applies as well as an adjustment of the brightness of the whole screen, that the adjustment of the brightness of a single image, for example within an image editing application. This also improves image quality for other kinds of image processing, for example when the image is subsequently stored or compressed, instead of being directly displayed on a screen.

Although the example of FIG. 3c shows a personal computer, the invention can be implemented within any device that is able to modify the brightness of an image. For example, this can be applied to the modification/adaptation of the brightness of a smartphone, connected glasses, TV, any screen (associated and or embedded in automotive devices, planes, remote control, computer or the like) or a tablet.

The same principle may also be applied to other kinds of image processing. For example, upon a modification of the contrast of an image, a different coefficient of change of amplitude is applied to each pixel of the image, depending on its initial intensity. The invention thus allows an improvement the rendering of an image upon a change of the contrast, by using for each coefficient of change of intensity, an approximated value that requires a lowered number of significant bits.

The FIG. 3c provides an example of device similar of application of the invention to image signals. More specifically, the device 300b performs operations very similar to the operations of the device 300b, for digital image signals. This example demonstrates that, although most of the examples presented in this application relate to audio signals, the embodiments described can also be applied with similar advantages to other kind of digital signals such as image digital signals.

Figure 4:
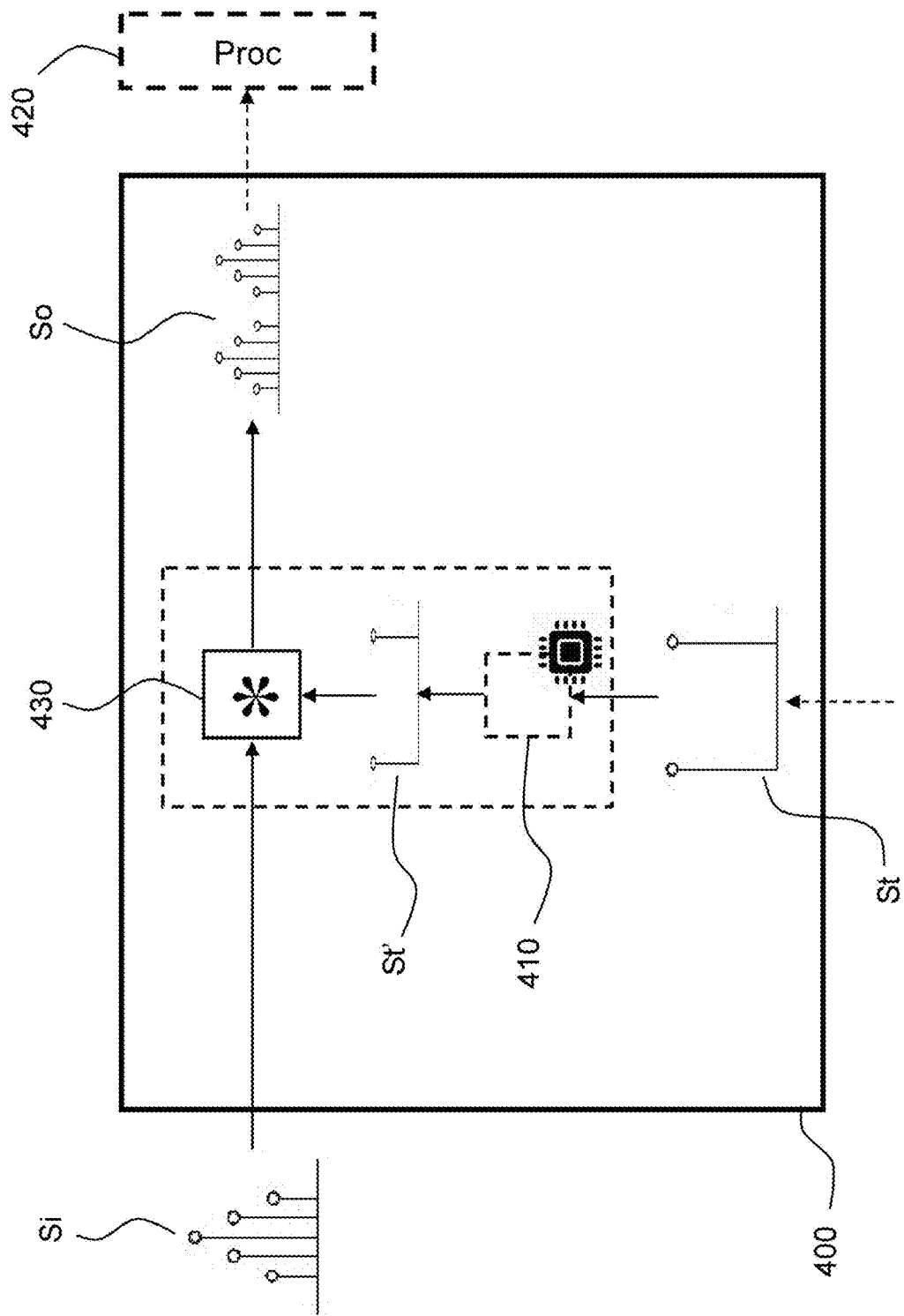
FIG. 4 displays an example of a device to perform filtering according to the invention.

FIG. 4 displays an example of a device to perform filtering according to the invention.

The device 400 receives an input digital signal Si, and comprises a digital circuitry 430 to perform a convolution with a second digital signal St' that represents the impulse response of a filter to apply to the input digital signal Si, in order to obtain an output digital signal. The output digital signal may thus be sent to a further device, or a processing unit 420 (which may be for example any of the processing units discussed previously: a DAC, a compression unit, etc. . . . or more generally any unit suitable to process a digital signal) within or outside the device 400.

The device 400 is remarkable in that the second transform signal St' is an approximation of a first transform signal St.

In a number of embodiments of the invention, the second transform signal St' is pre-calculated: for example, in an embodiment of the invention, the input digital signal and the output digital signal are audio signal, and the second transform digital signal is an impulse response a RIAA filter. The second transform digital signal St' has been calculated once from a first digital signal St representative of the impulse response of the RIAA filter.

The digital transform signal St may be representative of the impulse response of different FIR filter, such as a low pass, high pass band pass, RIAA, equalization of phase filter.

In a number of embodiments of the invention, the second transform digital signal St' varies over time. And the device 400 comprises a digital circuitry 410 to calculate the values of samples of the second transform digital signal St', that approximate values of samples of a first transform digital signal St that varies over time: it is updated in real time, and the digital circuitry 410 calculates the second transform digital signal St' as an approximation of the first transform digital signal St in real time accordingly. This may be useful for a number of different applications: for example filters that vary with an environment of the user, such as ANC filter that are updated depending on the ambient noise, or spatialization filters that are updated depending on the orientation of the head of a user.

More generally, at least a second sample of the second digital transform digital signal St' is an approximation of at least a first sample of the first digital transform signal St, using a second number of significant bits $k_2$ lower than a first number of significant bits $k_1$ of said first sample.

Any of the previously discussed embodiments of the invention is applicable to the device 400.

In an aspect of the invention, the second number of significant bits $k_2$ is lower than a number of significant bits allowing the number of significant bits of samples of the output digital signal So to match the expected bit depth of the processing unit 420.

In an aspect of the invention, the second number of significant bits $k_2$ depends at least on the value of the first sample.

The device 400 thus allows to reduce the number of significant bits of samples of the output digital signal So, and therefore improve the perception of the quality of the output digital signal So, without losing information from the input digital signal Si.

In an aspect of the invention, the second number $k_2$ of significant bits is higher than or equal to a minimum number of significant bits $k_{min}$ of the value of the second sample that does not introduce a noticeable alteration in the second output digital signal.

In this example, the alteration may be an alteration of the functionality of a FIR filter where the second digital transform signal St' is an impulse response. For example, if the second digital transform signal St' is an impulse response of a low pass filter, an excessive reduction of the number of significant bits may lead to the transform signal not performing accurately the low pass filtering, the cutoff frequency of the filter be displaced or the stop-band attenuation is not strong enough, etc. . . . . . The alteration may also be specific alterations such as aliasing.

Any of the allocations previously discussed is applicable to obtain the second transform digital signal St'.

The device 400 may also comprise, in addition, a digital circuitry to perform an approximation of the output digital signal So, in order to further reduce the number of significant bits of the samples of the output digital signal.

Figure 5A:
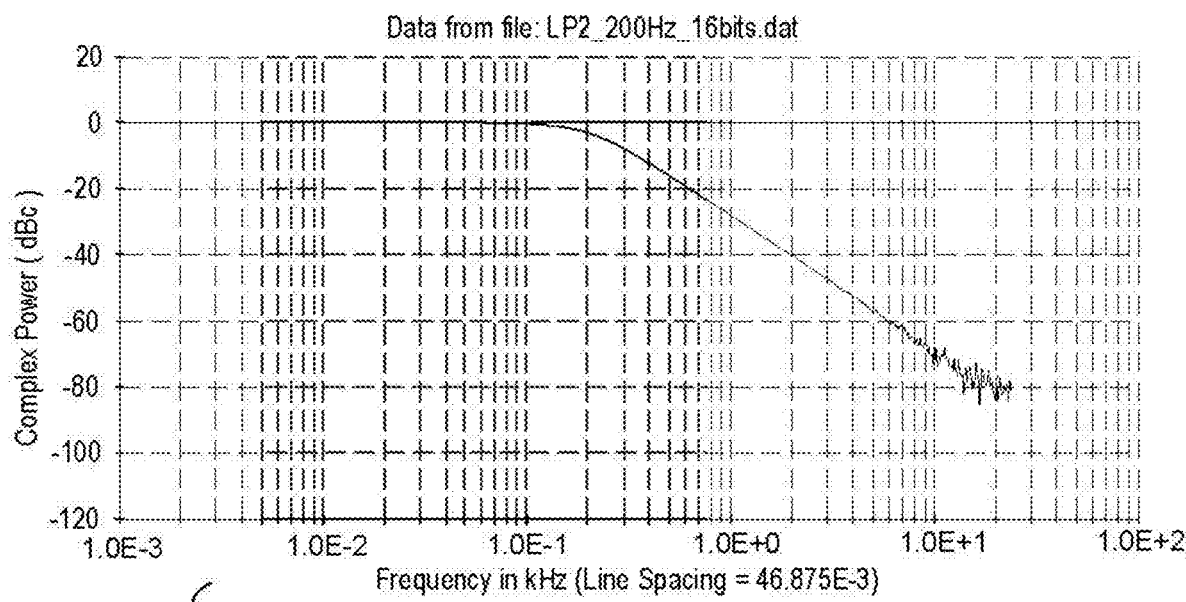
FIGS. 5a, 5b and 5c display, respectively, the frequency response of a prior art lowpass filter whose coefficients are quantized using 16 bits, the frequency response of a lowpass filter of the invention, and the impulse response of a lowpass filter of the invention.
Figure 5B:
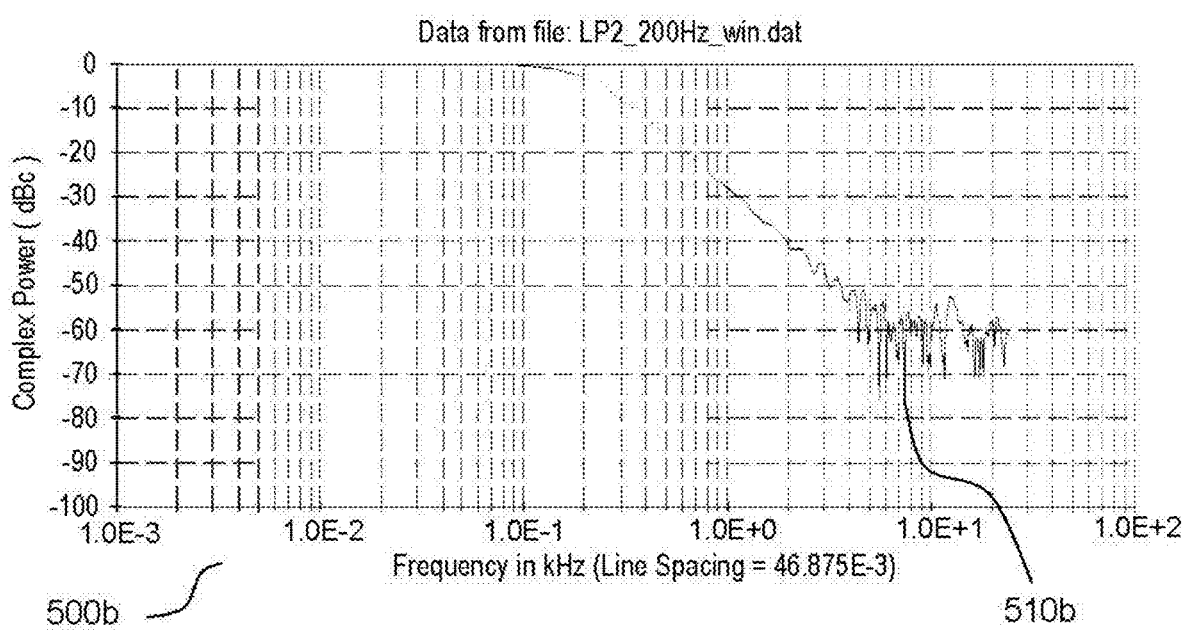
Figure 5C:
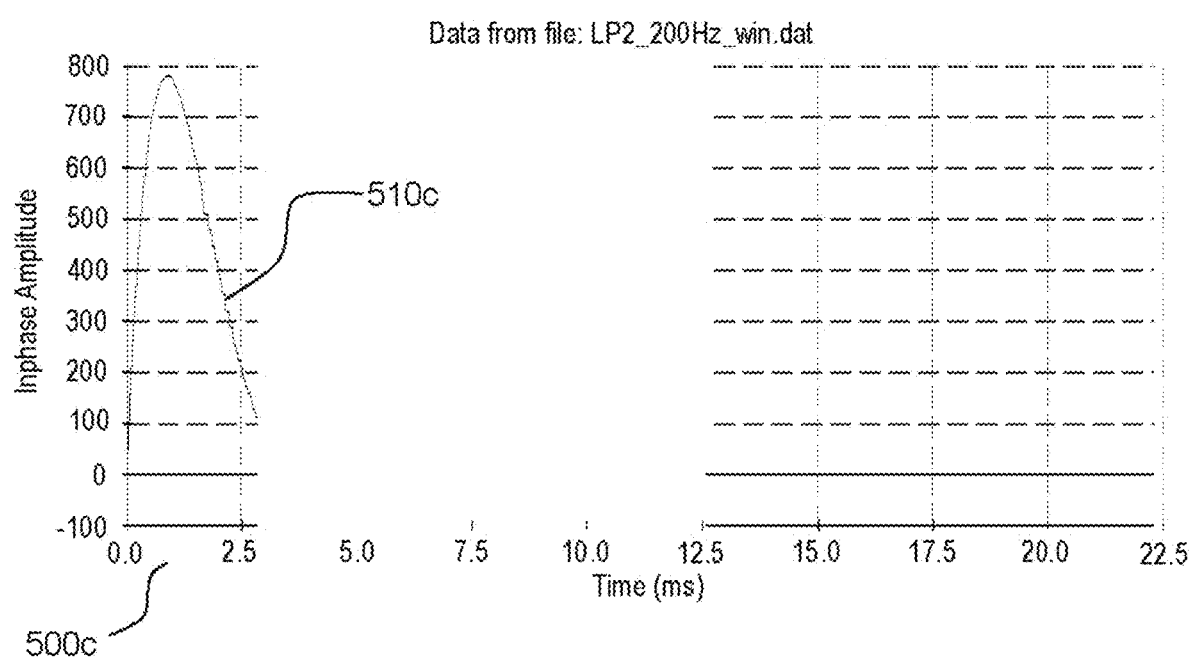

FIGS. 5a, 5b and 5c display, respectively, the frequency response of a prior art lowpass filter whose coefficients are quantized using 16 bits, the frequency response of a lowpass filter of the invention, and the impulse response of a lowpass filter of the invention.

The curve 500a represents the frequency response of a 200 Hz low pass filter of the prior art quantized using 16 bits, as a power depending on the frequency. The curve 500b represents the frequency response of a corresponding low pass filter of the invention. The curve 500c represents an impulse response of the same low pass filter of the invention, as an amplitude as function of time. More specifically, the low pass filter of the invention is obtained by performing an approximation of the impulse response of the filter displayed in FIG. 5a. At least a sample of the approximation has a second number of significant bits $k_2$ lower than a first number of significant bits $k_1$ of the corresponding sample of the impulse response of the filter 500a. In the example of FIGS. 5a to 5c, the number of significant bits $k_2$ is determined according to a truncation combined with a level allocation 4_L_1 on 8 bits.

It can be seen 510b that, at high frequencies, the frequency response is modified. However this impacts only frequencies that are affected by a very strong attenuation and the overall functionality of the filter is not affected. It can also be seen 510c in the impulse response that certain values have been modified to match only values defined by the number of significant bits allocated by the level allocation.

Figure 6A:
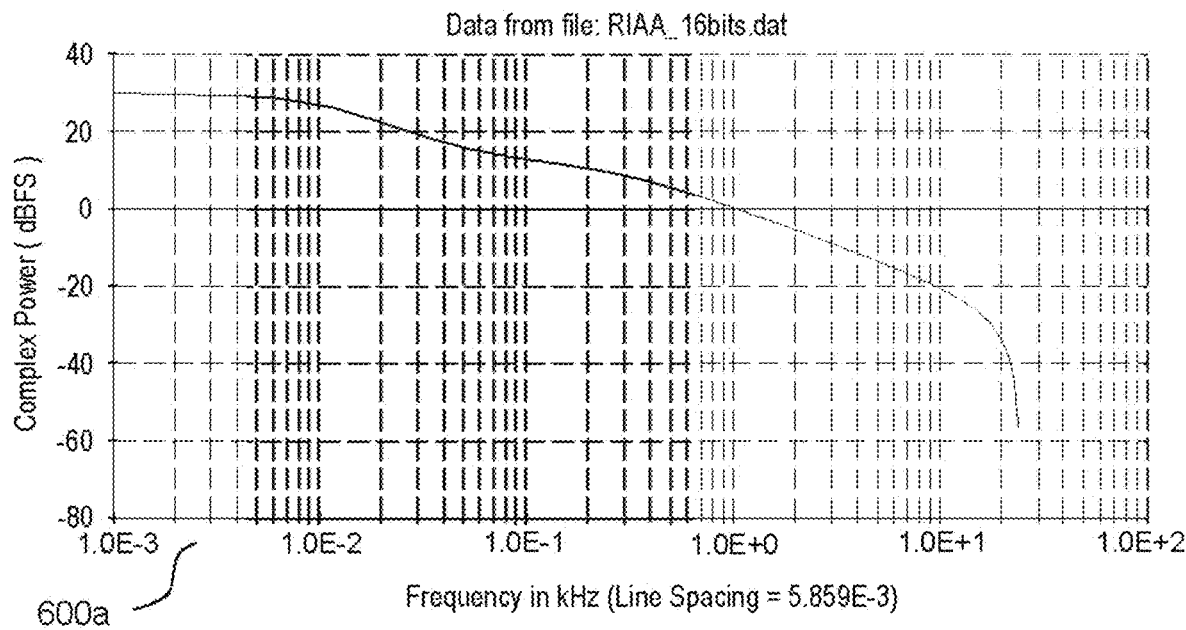
FIGS. 6a, 6b and 6c display respectively the frequency responses of a prior art RIAA filter whose coefficients are quantized using 16 bits, the frequency response of a RIAA filter of the invention, and the impulse response of a RIAA filter of the invention.
Figure 6B:
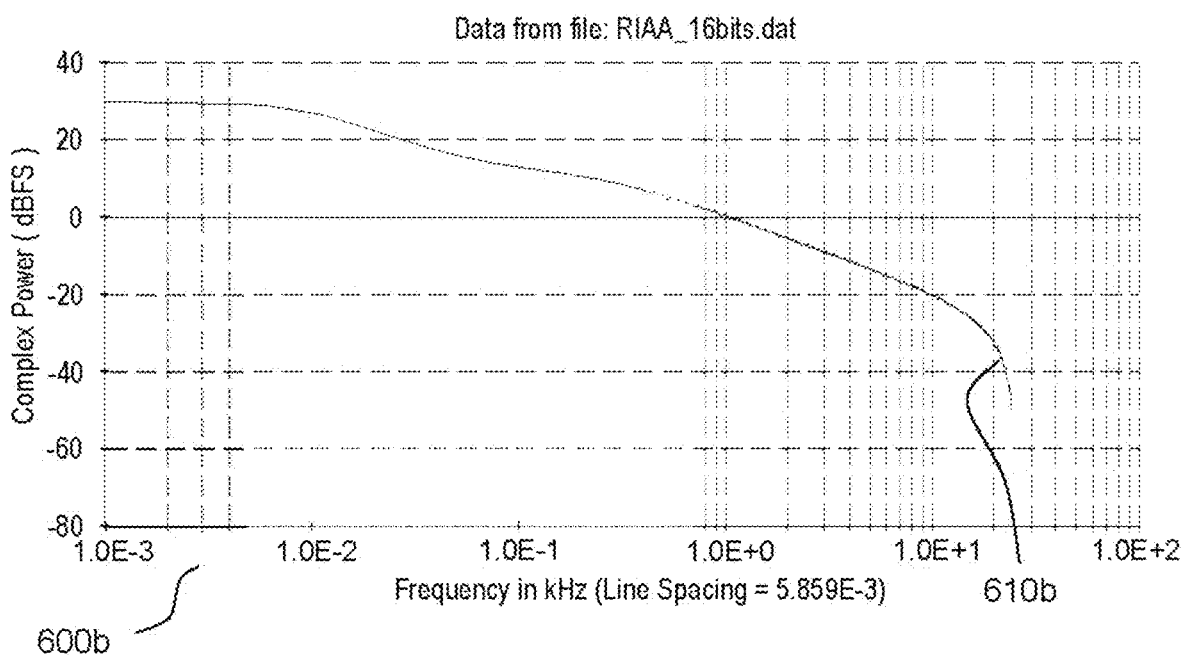
Figure 6C:
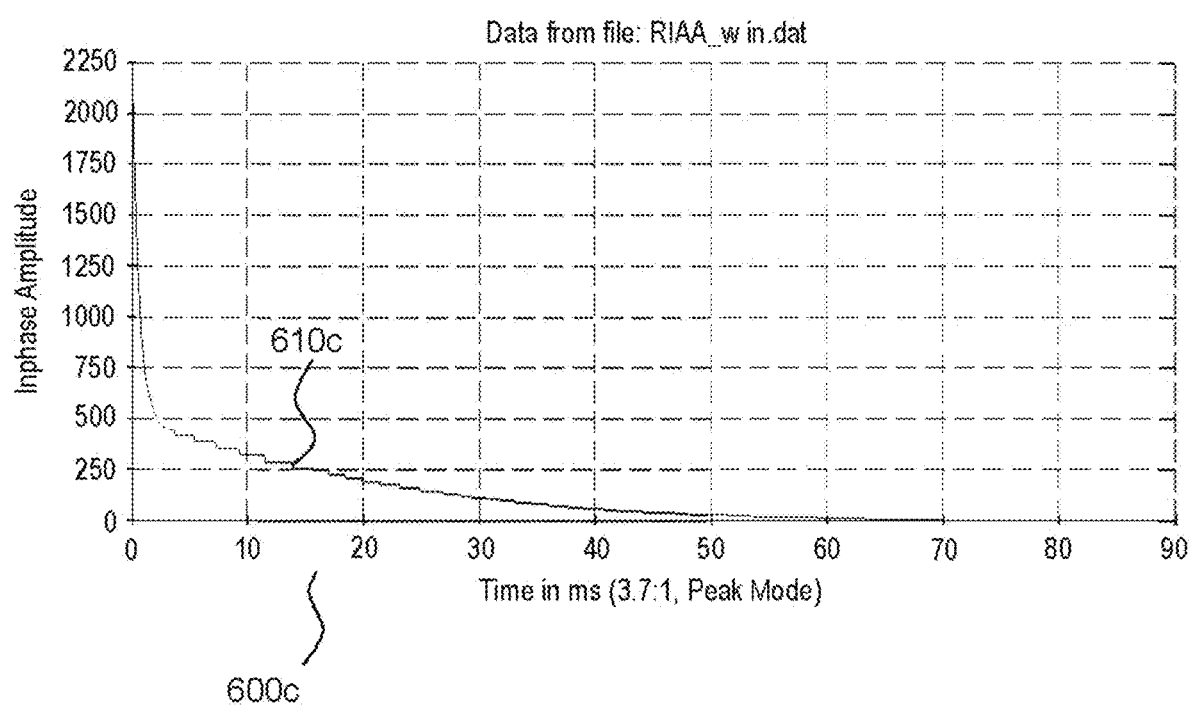

FIGS. 6a, 6b and 6c display respectively the frequency responses of a prior art RIAA filter whose coefficients are quantized using 16 bits, the frequency response of a RIAA filter of the disclosure, and the impulse response of a RIAA filter of the invention.

The curve 700 represents the frequency response of a RIAA filter of the prior art quantized using 16 bits, as magnitude vs frequency. The curve 600b represents the frequency response of a corresponding RIAA filter of the invention, that is to say a RIAA filter whose coefficients are an approximation of the coefficients of the filter 700 according to the invention. The curve 600c represents an impulse response of the same RIAA filter of the disclosure, as an amplitude as function of time.

In this example, a slope allocation has been used to perform the approximation: different numbers of significant bits have been used, in the filter of the disclosure, for different samples. More specifically, a higher number of bits of precision have been used for the samples that have a steep variation from one sample to another. It can thus be seen 610c that, when the variation between successive samples decreases, the number of bits of precision used to represent the samples is also reduced, in order to prevent losses of information.

Thus, more precision is provided in the first part of the impulse response. This ensures that the overall shape of the frequency response 600b is preserved, while using a number of additional bits of precision as low as possible for each sample.

These examples demonstrate that the invention does not significantly impact the performance of filters, while greatly reducing the loss of information from the input digital signal upon approximation of the output digital signal using a limited number of significant bits.

Figure 7:
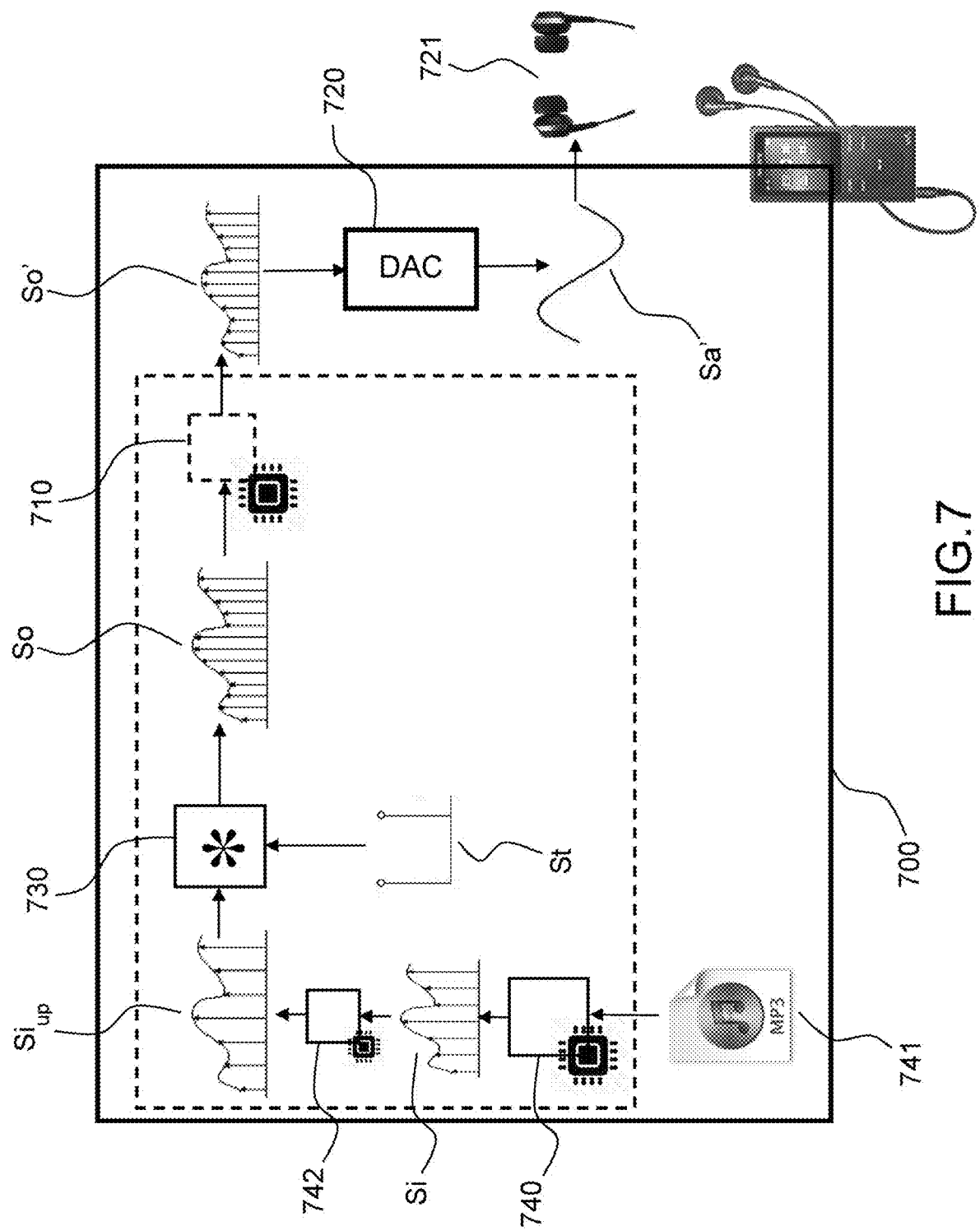
FIG. 7 displays an example of a device allowing to perform an upsampling of a digital signal in a number of embodiments of the invention.

FIG. 7 displays an example of a device allowing to perform an upsampling of a digital signal in a number of embodiments of the invention.

The device 700 is portable music player. The portable device comprises a memory to store compressed music files, for example a MP3 file 741. The device 700 comprises a decompression unit 740 to decompress the MP3 file 741 into an input audio digital signal Si.

In the example of FIG. 7, the device 700 is configured to upsample the input digital audio signal Si to an output sampling rate that is a multiple of its sampling rate. For example, the input audio digital signal Si can be a 16 bits/44.1 Hz audio signal (CD format), and the device 700 can be configured to upsample the input audio digital signal into a first output digital signal So at 24 bits/88.2 kHz, or at a sampling rate of 176, 4 kHz or 352, 8 kHz. The sampling rate is thus multiplied by a factor of 2, 4 or 8 respectively.

The device 720 comprises a DAC 720 to convert an output digital audio signal to an output analog audio signal Sa to be sent to earphones 721.

The device 700 comprises a digital circuitry 742 configured to create an upsampled input digital signal $Si_{up}$ at the output sampling rate. The upsampled input digital signal $Si_{up}$ comprises the samples of the input digital signal Si spaced apart by null samples, according to the upsampling ratio.

For example, if the input digital signal Si is upsampled from 44.1 kHz to 88.2 kHz (×2 upsampling), the upsampled input digital signal $Si_{up}$ will comprise the first sample of the input digital signal, a sample with a null value, the second sample of the input digital signal, a sample with a null value, the third sample of the input digital signal, etc. . . . . In this case, the samples of upsampled input digital signal $Si_{up}$ that have a value of the input digital signal Si are called "Phase 0", while the null samples are called "Phase 1".

Meanwhile, if the input digital signal Si is upsampled from 44.1 kHz to 176.4 kHz (×4 upsampling), the upsampled input digital signal $Si_{up}$ will comprise the first sample of the input digital signal, three samples with null values, the second sample of the input digital signal, three samples with null values, the third sample of the input digital signal, etc. . . . . In this case, the samples of upsampled input digital signal $Si_{up}$ that have a value of the input digital signal Si are still called "Phase 0", while the three intermediary null samples are called respectively "Phase 1", "Phase 2", "Phase 3".

The same principle is applicable to higher upsamplings. For example, if the input digital signal Si is upsampled from 44.1 kHz to 352.8 kHz (×8 upsampling), the "Phase 0" samples of the upsampled input digital $Si_{up}$ are spaced apart by 7 samples.

The device 700 further comprises a digital circuitry 730 to perform a convolution of the upsampled input digital $Si_{up}$ with a lowpass transform digital signal St to obtain a first output audio digital signal So, which is an upsampled version of the input audio digital signal Si. The cutoff frequency of the lowpass transform digital filter is usually about at half of the sampling frequency of the input audio digital signal, for example about 20 kHz if the input audio digital signal is sampled at 44.1 kHz.

In a number of embodiments of the invention, the lowpass filter does not modify the samples that were initially present in the input audio digital signal Si ("Phase 0" samples). The other samples ("Phase 1", "Phase 2", "Phase 3", etc. . . . samples) are upsampled samples. The low-pass filter can for instance be implemented based on an impulse response derived from a spline function. A Spline function based on 11 points ($11^{th}$ order spline) is for example well suited to perform upsampling.

According to various embodiments of the invention, the lowpass transform digital signal St may have different bit depths. Typical bit depth for such filter is 24 or 32 bits. Therefore, when the input audio digital signal is a 16 bits signal, the first output digital signal has a bit depth of 40 or 48 bits, and thus far exceeds the input bit depth of most DACs. The same situation occurs for virtually any audio bit depth. For example, the bit depth of the first output audio signal So will be even higher if the input audio digital signal has a bit depth of more than 16 bits.

In order to improve the perception by the user of the quality of the output signal, in a number of embodiments of the invention, the device 700 is configured to reduce the number of significant bits of the output digital signal sent to the DAC 720.

This can be performed in a number of different ways, that can be used separately or in combination.

In a number of embodiments of the invention, the number of significant bits of the samples of the transform digital signal can be reduced, for example by performing a truncation of the digital transform signal St, for example on 16 bits.

In a number of embodiments of the invention, the first output audio digital signal So is sent directly to the DAC 720 to be converted and listened to.

In a number of embodiments of the invention, the device 700 comprises a digital circuitry 710, for example similar to the digital circuitry 210c, to obtain a second output audio digital signal So' as an approximation of the first output digital signal So using a lower number of significant bits. The second output audio digital signal So' is sent to the DAC 720 instead of the first output digital signal So.

Any of the allocation methods discussed above are applicable by the digital circuitry 710. For example, the digital circuitry 710 can perform truncations of the samples of first output digital signal So, or use a level allocation.

According to various embodiments of the invention, the same operations can be applied to all samples of the output digital signal, or the phases of the output digital signal may be processed differently.

In a number of embodiments of the invention, the samples corresponding to the Phase 0 are not approximated, or are approximated using a higher number of significant bits than the samples corresponding to the other phases. Indeed, since the Phase 0 samples are values of samples of the input audio digital signal that are not modified, their values can be advantageously preserved, while the number of significant bits of the values of the other phases are reduced.

In an embodiment of the invention:
a first input audio digital signal Si having a bit depth of 16 bits, and a sampling frequency of 44.1 kHz is upsampled into a second output digital signal So' having a sampling frequency of 176.4 kHz, and whose sample have a number of significant bits of 24 bits at most;
the upsampled input digital signal $Si_{up}$ has a sampling frequency of 176.4 kHz, and a bit depth of 16 bits;
the transform digital signal St is a low pass filter with a cutoff frequency around 20 kHz having a bit depth of 24 bits that performs a spline interpolation based on 11 values that does not modify the samples of the Phase 0. The samples of the transform digital signal are truncated on 16 bits, even if the transform signal has a higher bit depth, for example 24 or 32 bits;
the digital circuitry 730 performs a convolution of the upsampled input digital signal $Si_{up}$, and that transform digital signal St, to obtain a first output digital signal So having a bit depth of 32 bits;
the digital circuitry 710 performs an approximation of each sample of the first output digital signal So to obtain the second output digital signal So' using a level allocation of the type 10_L_1 on 14 bits, and the bit depth of the second output digital signal So' is 24 bits, which is the input bit depth of the DAC 720. The number of significant bits of each sample of the second output digital signal So' is thus at most 24 bits, and samples of the first output digital signal whose number of significant bits is higher than 10 may be approximated in the second output digital signal. It shall also be noted that, since the values of the samples of the "Phase 0" of the first output digital signal So are values from the input digital signal Si, their number of significant bits is at most 16 bits, while the number of significant bits of other phases of the first output digital signal So may have a number of significant bits higher than 16. Using the level allocation as previously defined, only the samples of the "Phase 0" that have a number of significant bits equal to 15 or 16 the will be approximated in the second output digital signal So', down to 14 bits.

It has to be noted that this embodiment provides a very high sound quality. Indeed, the truncation of the transform signal on 16 bits allows a good enough representation of the upsampling filter, while the level allocation is well suited to approximate audio samples.

In an embodiment of the invention:
a first input audio digital signal Si having a bit depth of 16 bits, and a sampling frequency of 44.1 kHz is upsampled into a second output digital signal So' having a sampling frequency of 352.8 kHz, and whose sample have a number of significant bits of 32 bits at most;
the upsampled input digital signal $Si_{up}$ has a sampling frequency of 352.8 kHz, and a bit depth of 16 bits;
the transform digital signal St is a low pass filter with a frequency cut around 20 kHz having a bit depth of 24 bits that performs a spline interpolation based on 11 values that does not modify the samples of the Phase 0. The samples of the transform digital signal are truncated on 16 bits, even if the transform signal has a higher bit depth, for example 24 or 32 bits;

the digital circuitry 730 performs a convolution of the upsampled input digital signal $Si_{up}$, and that transform digital signal St, to obtain a first output digital signal So having a bit depth of 32 bits;

the digital circuitry 710 performs an approximation of each sample of the first output digital signal So to obtain the second output digital signal So', and the bit depth of the second output digital signal So' is 32 bits. Each sample is approximated using a level allocation, and the parameters of the level allocation are different for each phase:

Phase 0:4_L_1 on 12 bits
Phase 1: 6_L_1 on 12 bits
Phase 2: 12_L_1 on 12 bits
Phase 3: 18_L_1 on 12 bits
Phase 4: 20_L_1 on 12 bits
Phase 5: 18_L_1 on 12 bits
Phase 6: 12_L_1 on 12 bits
Phase 7:6_L_1 on 12 bits the number of significant bits of each sample of the second output digital signal So' is thus at most 32 bits (12+20 for Phase 4 sample), and samples of the first output digital signal whose number of significant bits is higher than 12 may be approximated in the second output digital signal. It shall also be noted that, since the values of the samples of the "Phase 0" of the first output digital signal So are values from the input digital signal Si, their number of significant bits is at most 16 bits, while the number of significant bits of other phases of the first output digital signal So may have a number of significant bits higher than 16. Using the level allocation as previously defined, only the samples of the "Phase 0" that have a number of significant bits between 12 and 16 will be approximated in the second output digital signal So', down to 12 bits.

The device 700 is provided by means of non-limitative example only of a device to perform an upsampling of a digital signal in a number of embodiments of the invention, but the invention is not restricted to this example. For example:

the device 700 may be a device other than a portable music player. For example, it may be a computer configured to play music, or a device configured to edit music, that can optionally send the music to a music player;

the device may be configured to upsample other kinds of digital audio files, for example speech files, or even other kind of digital signals, such as image digital signals;

the device may receive the audio files, for example using a streaming service such as Deezer™ or Spotify™, rather or in addition to playing MP3 files stored within the device;

the device may decompress, upsample and play audio files in another format than MP3, such as AAC or WMA. It may also play uncompressed, of lossless compressed audio files, such as WAV or FLAC files;

the input audio signal Si can have different bit depths/sampling rates. For example, input audio digital signal at studio format (16 bit/48 kHz) can be upsampled to a 24 bits/96 kHz format, or at a sampling range of 192 kHz or 384 kHz. The sampling rate is thus multiplied by a factor of 2, 4 or 8 respectively;

the DAC 720 may be located in a further device, or the output audio digital signal may be sent to another processing unit, such as an audio compression unit;

the analog signal may be sent to other kinds audio listening units, such as loudspeakers. If the device is configured to upsample digital signals other than audio signals (for example image signals), the output digital signal can be sent to suitable kind of devices (for example a screen) to be presented to a user;

the output frequency may not be a multiple of the frequency of the input digital signal (for example, if the frequency of the input digital signal is 44.1 kHz, and the output frequency 96 kHz). In such case, the digital circuitry 742 creates an upsampled input digital signal $Si_{up}$ at an intermediary frequency which is the least common multiple of the frequency of the input digital signal Si, and the output frequency, and the convolution with the transform digital signal performs a downsampling to the output frequency. The samples of the first output digital signal can thus not be separated into "Phase 0", "Phase 1" etc. . . . samples, and all samples may be approximated the same way.

The upsampling as used by the device 700 greatly increases the perception by users of the quality of the sound.

In addition, the inventors have noticed that the perception of the sound quality is even increased, when the input audio digital signal is obtained by decompressing a compressed audio file, and more specifically a file encoded in MP3 format. The perception of sound quality when listening a MP3 file using the device 700 is thus advantageously greatly optimized, compared to a prior art listening of a MP3 files.

Figure 8A:
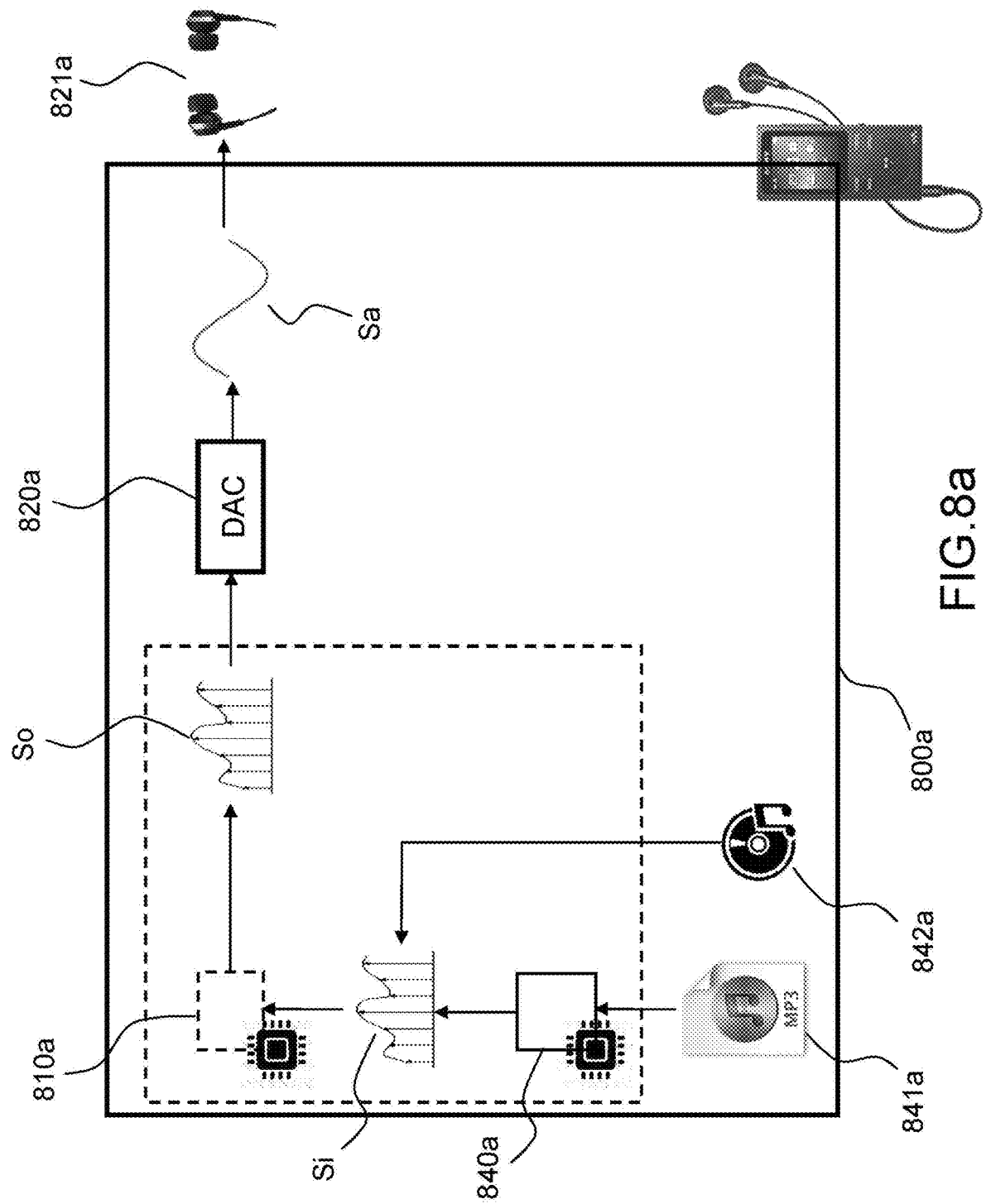
FIGS. 8a and 8b display examples of devices and systems for processing of audio signals according to a number of embodiments of the invention.
Figure 8B:
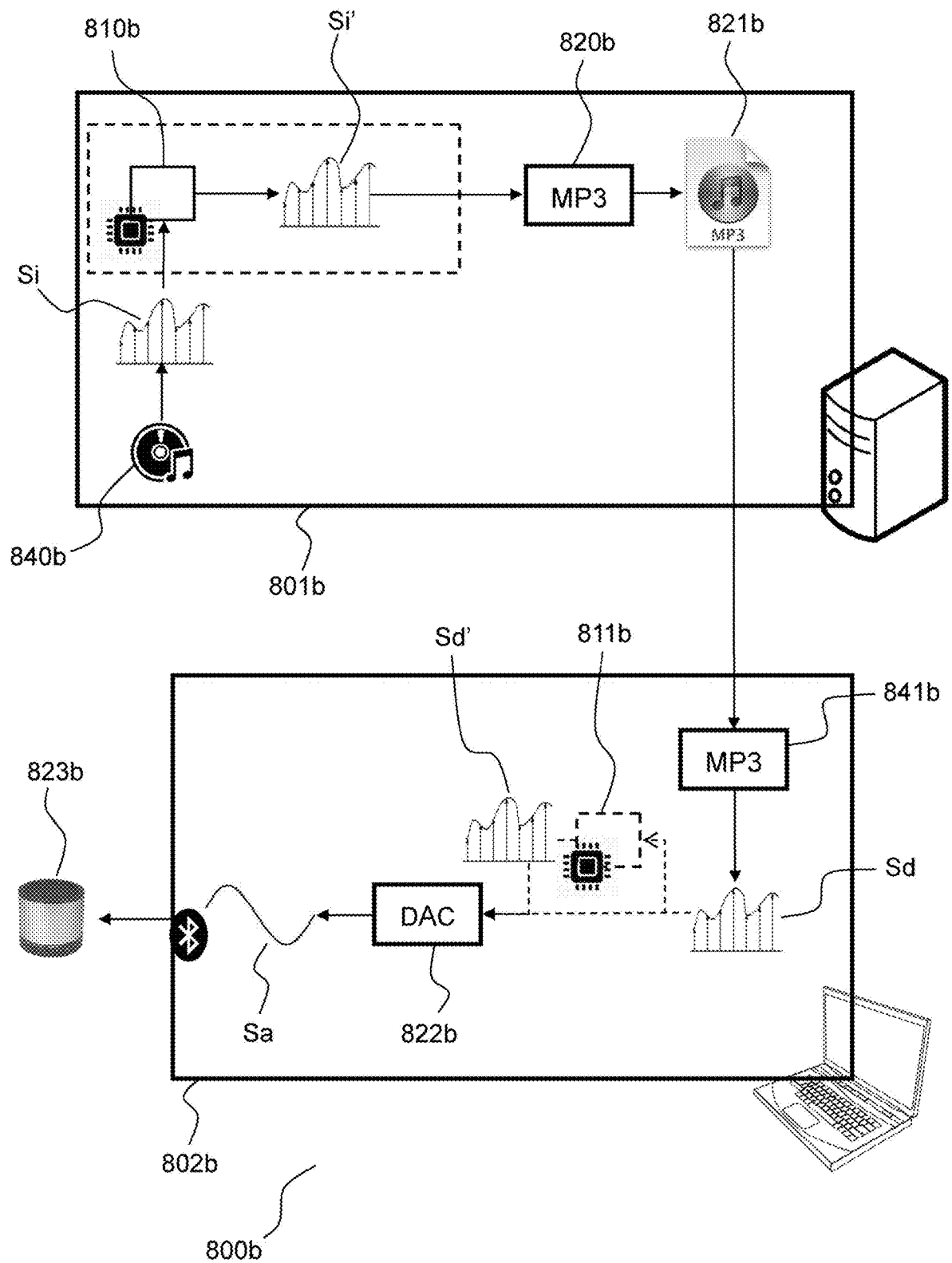

FIGS. 8*a* and 8*b* display examples of devices and systems for processing of audio signals according to a number of embodiments of the invention.

FIG. 8*a* displays an example of a device to listen to audio file according to a number of embodiments of the invention.

The device 800*a* is a portable audio player, and is configured to obtain an input audio digital signal Si, for example directly from a raw audio file 842*a* (for example a 16 bits or 24 bits WAV file, an audio CD or HD audio), or a compressed audio file 841*a* (for example a MP3 file), the audio file being decompressed by a decompression unit 840*a*.

The device 800*a* comprises a digital circuitry 810*a* to approximate the input digital audio signal into an output digital audio signal So, which is similar to the digital circuitry 210*a*.

The output digital signal So is supplied to a DAC 820*a* to be converted into an analog output signal Sa and listened to through earphones 821*a*.

Similarly to the device 700, the device 800*a* is provided by means of example only, and a number of other devices of the invention allow an approximation of a raw or compressed digital audio signal. For example, the sound may be listened to using loudspeakers, the device may be a laptop, or the input digital audio signal Si may be a streamed signal instead of a signal stored within a file.

Due to the approximation performed by the digital circuitry 810*a*, at least a second sample of the output digital audio signal So has a second number of significant bits $k_2$ lower than a first number of significant bits $k_1$ of a corresponding value of a first sample of the input digital audio signal Si.

In an aspect of the invention, the second number of significant bits $k_2$ is lower than or equal to the expected bit depth of the DAC 820*a*.

In an aspect of the invention, the second number of significant bits $k_2$ depends upon the value of the first sample.

As already explained above, the approximation of values of samples of the output digital signal using a lower number of bits improves the perception of the quality of sound by a user thanks to the disclosed solution.

The digital circuitry 810a can advantageously use a truncation with bias or a level allocation with bias to approximate the values of the samples.

When the input digital audio signal Si is a raw signal with a bit depth of 24 bits and a sampling frequency of 96 kHz, a level allocation 8_L_1 on 16 bits, the samples of the output digital signal will thus have a maximum bit depth of 16 bits, even if the output digital signal has a higher bit depth, for example 24 bits.

The device 800a also provides a significant improvement when listening to a compressed file. The device 800a also provide the advantage of being applicable to virtually any hardware, while the improvement of quality of the compressed audio signal of device 700, which relies on an upsampling of the output signal, may not be applicable if an upsampled signal cannot be processed afterwards (this is in particular the case if audio streams cannot be played at high bitrates, for examples in some smartphones, or using some Bluetooth™ loudspeakers).

In a number of embodiments of the invention, the digital circuitry 810a is integrated within an application of a smartphone, for example a music streaming application. It thus allows the music application to provide an improved sound quality to the user, while not requiring any modification of the hardware, and without requiring an increase of the bitrate of a compressed audio stream received by the smartphone.

The FIG. 8b displays an audio streaming system in a number of embodiments of the invention.

The audio streaming system 800b comprises a server 801b to compress an audio file, and a listening device 802b to listen to the compressed audio file.

The server 801b receives an uncompressed audio file 840b, for example a music track that comprises a first input digital audio signal Si. The server 801b comprises a digital circuitry 810b to approximate values of the samples of the first input audio digital signal Si in order to obtain a second input digital audio signal Si' and which is similar to the digital circuitry 210a.

The server 801b further comprises a compressor 820b, in order to compress the second output digital signal Si' into a compressed file 821b, for example a MP3 file.

The MP3 file is streamed to a user device 802b. In the example of FIG. 2b, the device is a laptop. However, the invention is not restricted to this example, and other user devices may be used, provided that they have the capability to receive compressed audio streams, decompress such streams, and play the decompressed audio signal.

The device 802b has a MP3 decoder 841b, to decompress the MP3 file into a first decompressed audio stream Sd. The first decompressed audio stream Sd may be either fed directly to a DAC 822b, or further processed by a digital circuitry 811b, similar to the digital circuitry 210a, to approximate the first decompressed audio stream Sd into a second decompressed audio stream Sd' which is fed to the DAC 822b. As generally acknowledged by the invention, the approximation performed by the digital circuitry 811b aims at reducing the number of significant bits of one or more samples of the decompressed audio stream, in order to improve the perception of audio quality by the user.

The DAC 822b converts the first decompressed audio stream Sd, or the second decompressed audio stream Sd' into a decompressed analog audio stream Sa, which is send via a Bluetooth connection to a Bluetooth™ loudspeaker 823b.

The reduction of the number of significant bits of the audio signal by the digital circuitries 810b and/or 811b improves the perception of audio quality by the user. Moreover, the reduction of the number of significant bits of the audio signal by the digital circuitry 810b allows compressing the audio stream with a higher bitrate with the same subjective quality. Therefore, this allows saving bandwidth. In other embodiments of the invention, the digital circuitries 810b or 811b can be used separately. The applicant has noted that the application of a level allocation on the digital circuitry 810b and/or 811b provides a very good listening quality.

The reduction of the number of significant bits by the digital circuitry 811b allows a further improvement of the perceived quality by the user. Moreover, it shall be noted that, even the reduction of the number of significant bits performed by each of the digital circuitries 810b and 811b may be limited to a minimum number of significant bits $k_{min}$ that does not alter the signal, for example by not reducing the number of significant bits of audio sample below 10 bits, the reduction of the number of significant bits can be performed independently by the two digital circuitries. Indeed, a compression algorithm such as the MP3 compresses an audio file in the form of frequency coefficients. Therefore, the samples the decompressed audio signal Sd are not directly derived from the samples of the second input digital signal Si'.

The system 800b can thus be used for a streaming system, but also a system to sell music online. The digital circuitry 811b can be embedded within a music playing application or software.

The system 800b is provided by means of non limitative example only, and the invention also extends to a number of other systems for streaming and listening audio.

For example:
- the first input digital signal may be an uncompressed audio digital signal, for example a signal obtained by decompressing a lossless compressed audio file, or an audio file with a low compression;
- the server 801b may be replaced by a plurality of servers. For example the digital circuitry 810b and the audio compressor 820b may be located on different servers. The compressed file 821b may also be stored on a further server;
- other compression formats may be used, such as the AAC format, the WMA format, or proprietary audio formats;
- the compressed audio stream may be streamed directly to the device 802b, without being stored on a server. This may for example be the case for on-the-fly compression for real time delivery and listening of audio, for example for live audio streams;
- the compressed audio signal may be packaged within a video file or a video stream rather than in a separate stream/file;
- the device 802b may be any device which is able to decompress, process and play an audio file, such as a smartphone, a tablet, a personal computer . . . ;
- the compressed audio file 821b can be pre-loaded and stored on the device 802b, to be played afterwards;
- the analog audio stream may be played by other speakers, such as earphones or internal loudspeakers.

Other applications to audio signals of the invention are possible, according to a number of embodiments of the invention.

For example, a digital circuitry of the invention may be used to reduce the number of significant bits of an audio signal at recording time. When an audio signal is recorded, for example in an audio studio, the sound is first captured as an analog signal, which is converted into a digital audio signal using an ADC (Analog to Digital Converter). A level allocation type x_L_1 with Bias is for example well suited for this application.

When recording an audio file in a studio, the bit depth and sampling rate are generally much higher than the CD format: the audio signal generally has a bit depth of 24 bits, and a sampling rate of 96 kHz or 192 kHz. A digital circuitry of the invention can be used to reduce the number of significant bits of the audio signal at the output of the ADC. For example a level allocation 8_L_1 on 16 bits can be used, the bit depth of the audio file being 24 bits. This allocation allows the audio signals to have a constant precision and a distortion which is constant in a dynamic range of 48 dB that allows to preserve the content and meaning of the audio signal.

The invention is also applicable to the mastering of an audio record. The mastering is the final stage of audio recording, wherein an audio track is processed to be adapted to a number of different listening platforms. The source of the mastering is the HD recorded audio track, generally at 24 bits, and 96 kHz or 192 kHz). For example, the audio track may be converted to different formats, such as HD formats, but also more widespread CD format (16 bits/44.1 kHz).

The conversion of the master audio track an audio track in the CD format comprises:
- a sub-sampling, from 96 or 192 kHz to 44.1 kHz;
- a reduction of the bit depth of the samples from 24 to 16 bits.

The invention can be applied to these two steps:
- the sample rate conversion can be performed using a low-pass (having a cutoff frequency around 20 kHz, which is about half of the sampling frequency of the CD format) filter represented by a transform digital signal, the number of significant bits of each coefficient of the transform digital signal being reduced according to the invention. The number of significant bits of the samples of the transform can be reduced down to a minimum number, wherein parasitic noise such as aliasing appear;
- when reducing the bit depth of the audio signal, the number of significant bits of the samples can be further reduced using a level allocation x_L_1 to improve the perceived sound quality of the record.

The reduction of the number of significant bits of an audio signal of the invention can also be used as a pre-processing for virtually any processing of a digital audio signal, such as digital filtering, upsampling, volume change, etc . . . , using any allocation of bits previously defined, or any allocation of its that may be envisioned by a skilled man according to the invention.

In any of the applications wherein the invention is applied on a digital signal, and more specifically on an audio digital signal (e.g. as in the examples above, for recording, mastering or processing an audio signal), a different level allocation can be used for the different samples. For example, the number of significant bits of successive samples may be defined according to different level allocations according to the index of the sample in a interval. For example, a period of 4 samples may be defined, with the following allocations being used:
- 8_L_1 on 16 bits for the first sample;
- 8_L_1 on 18 bits for the second sample;
- 8_L_1 on 20 bits for the third sample;
- 8_L_1 on 18 bits for the fourth sample.

The use of variable allocations avoids the creation of a constant, and noticeable sound color in the signal. Thus, the audio signal does not seem artificial. This embodiment is not restricted to the example above: for example, different level allocations may be used, other allocations may be used instead of a level allocation (or even a mix of different types of allocations depending on the sample). Moreover, different periods may be used (for example 2, 6 or 8 samples instead of 4. It is even possible to change the allocation type used for each sample based on irregular periods, or choose an allocation randomly for each sample, among a set of possible allocations.

The disclosure also relates to a method to calculate a value of a second sample of a second digital signal as an approximation of a value of a first sample of a first digital signal, to which any of the embodiments discussed above may be applied.

The disclosure also relates to the convolution of an input signal with a second digital signal, wherein a second sample of the second digital signal is an approximation of a value of a first sample of a first digital signal, to which any of the embodiments discussed above may be applied.

The disclosure also relates to a second digital signal, a second sample of the second digital signal being an approximation of a first sample of a first digital signal, to which any of the embodiments discussed above may be applied.

As already noted, the approximation has been described for a sample. However, more than one sample of a digital signal may be approximated. In most of the embodiments, all samples of the digital signal are approximated.

It has also be noted that, in some cases, a sample of the first digital signal to be approximate already has a very low first number of significant bits, lower than a second number of significant bits that is allocated by an allocation of the disclosure. In such case, the approximation may not have any effect, and the values of the first and second sample may be identical.

The examples described above are given as non limitative illustrations of embodiments of the enclosed disclosure. They do not in any way limit the scope of the invention which is defined by the following claims. Furthermore, any non-exclusive embodiments or examples discussed above may be combined.

The invention claimed is:

1. A digital circuitry configured to calculate, from at least a value of a first sample of a first digital signal, a value of a second sample of a second digital signal, based on the value of the first sample, said value of the second sample having a second number of significant bits lower than a first number of significant bits of the value of the first sample, said second number of significant bits depending at least on the value of the first sample.

2. The digital circuitry of claim 1, wherein the second number of significant bits is defined according to the value the first sample, so that the second number of significant bits varies in a direction opposite to a direction of variation of an absolute value of the first sample.

3. The digital circuitry of claim 2, wherein the second number of significant bits is equal to a minimum of a first predefined number minus a rounding of a binary logarithm of the absolute value of the first sample, and a second predefined number.

4. The digital circuitry of claim 2, wherein the second number of significant bits is obtained using:
- a third predefined number lower than the bit depth of the first digital signal;
- a fourth predefined number higher than 1 and lower than the bit depth of the first digital signal minus the third predefined number;

a fifth predefined number higher than or equal to 1, and lower than or equal to the bit depth of the first digital signal minus the third predefined number minus the fourth predefined number (D) plus 1;

by:
identifying the highest integer number between 0 and the fourth predefined number, for which the first integer number is lower than:
two raised to the power of the bit depth of the first digital signal minus one;
multiplied by two raised to the power of 1 minus the fifth predefined number minus said highest number;
setting the second number of significant bits as the third predefined number plus said highest integer number.

5. The digital circuitry of claim 1, wherein the second number of significant bits is defined according to a predicted difference between the value of the first sample and an approximation of the first sample using a third number of significant bits, so that the second number of significant bits varies in the same direction than the direction of variation of an absolute value of said predicted difference.

6. The digital circuitry of claim 5, wherein the second number of significant bits is defined as a growing function of said predicted difference divided by the value of the first sample.

7. The digital circuitry of claim 1, wherein the second number of significant bits depends upon values of coefficients obtained by a frequency transform of a time window of samples of the first digital signal comprising the first sample.

8. The digital circuitry of claim 1, wherein the second number of significant bits is defined according to a value representative of a derivative of the first digital signal at the first sample.

9. The digital circuitry of claim 8, wherein the value representative of the derivative of the first digital signal at the first sample is an absolute difference between the value of the first sample and the value of the sample immediately preceding the first sample in the first digital signal.

10. The digital circuitry of claim 1, wherein the value of the second sample is selected as a suitable value, belonging to an ordered set of suitable values, which is the closest to the value of the first sample in the ordered set of suitable values, and wherein the number of significant bits of each suitable value in the ordered set of suitable values is lower than the number of significant bits of any value in an open interval between said suitable value in the ordered set and an neighbor suitable value in said set.

11. The digital circuitry of claim 1, wherein:
the value of the second sample is calculated based on an intermediary value, said intermediary value having a second number of significant bits lower than an intermediary number of significant bits of the intermediary value, and depending at least of said intermediary value;
the intermediary value is calculated based on the value of the first sample, the intermediary number of significant bits being lower than the number of significant bits of the first sample.

12. The digital circuitry of claim 1, wherein the second number of significant bits is selected among two or more candidate numbers of significant bits, each of said two or more candidate numbers of significant bits being lower than a first number of significant bits of the value of the first sample, and depending at least on the value of the first sample.

13. The digital circuitry of claim 1, wherein the second number of significant bits is lower than or equal to a number of significant bits allowing the second digital signal, or a signal derived therefrom to match an expected bit depth of a processing unit that receives as input said second digital signal, or a signal derived therefrom.

14. The digital circuitry of claim 1, wherein the second number of significant bits is higher than or equal to a minimum number of significant bits of the value of the second sample that does not introduce a noticeable alteration in the second digital signal, or a signal derived therefrom.

15. The digital circuitry of claim 14, wherein the noticeable alteration is a noticeable quantization noise.

16. A digital circuitry configured to perform a convolution of an input digital signal, or a derivative thereof, and a second digital signal to obtain an output digital signal, a value of a second sample of the second digital signal being calculated from at least a value of a first sample of a first digital signal by a digital circuitry according to claim 1.

17. A non-transitory computer storage medium having stored thereon a second digital signal, wherein a value of a second sample of the second digital signal is calculated based on a value of a first sample of a first digital signal, said value of the second sample having a second number of significant bits lower than a first number of significant bits of the value of the first sample, said second number of significant bits depending at least on the value of the first sample.

18. A method to calculate, from at least a value of a first sample of a first digital signal, a value of a second sample of a second digital signal based on the value of the first sample, said value of the second sample having a second number of significant bits lower than a first number of significant bits of the value of the first sample, said second number of significant bits depending at least on the value of the first sample.

19. A method of convolution of an input digital signal and a second digital signal to obtain an output digital signal, a value of a second sample of the second digital signal being calculated, from at least a value of a first sample of a first digital signal by a method according to claim 18.

20. A computer program product comprising computer code instructions stored on a non-transitory computer storage medium wherein the computer code instructions when executed by one or more processors configured the one or more processors to execute the method of claim 18.

* * * * *